United States Patent
Kondiles

(10) Patent No.: US 12,346,328 B2
(45) Date of Patent: *Jul. 1, 2025

(54) CREATING COMPRESSED DATA SLABS THAT EACH INCLUDE COMPRESSED DATA AND COMPRESSION INFORMATION FOR STORAGE IN A DATABASE SYSTEM

(71) Applicant: Ocient Holdings LLC, Chicago, IL (US)

(72) Inventor: George Kondiles, Chicago, IL (US)

(73) Assignee: Ocient Holdings LLC, Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/536,594

(22) Filed: Dec. 12, 2023

(65) Prior Publication Data

US 2024/0126762 A1   Apr. 18, 2024

Related U.S. Application Data

(63) Continuation of application No. 17/571,675, filed on Jan. 10, 2022, now Pat. No. 11,880,368, which is a
(Continued)

(51) Int. Cl.
*H03M 7/00*       (2006.01)
*G06F 16/174*    (2019.01)
(Continued)

(52) U.S. Cl.
CPC .... *G06F 16/24556* (2019.01); *G06F 16/1744* (2019.01); *H03M 7/46* (2013.01)

(58) Field of Classification Search
CPC .... H03M 7/30; H03M 7/3086; H03M 7/3088; H03M 7/40; H03M 13/05;
(Continued)

(56) References Cited

U.S. PATENT DOCUMENTS

| 5,442,350 | A | 8/1995 | Iyer |
| 5,548,770 | A | 8/1996 | Bridges |

(Continued)

OTHER PUBLICATIONS

A new high performance fabric for HPC, Michael Feldman, May 2016, Intersect360 Research.
(Continued)

*Primary Examiner* — Linh V Nguyen
(74) *Attorney, Agent, or Firm* — GARLICK & MARKISON; Timothy W. Markison

(57) ABSTRACT

A computing entity is operable to a data set for storage that includes a plurality of uncompressed data slabs. A storage data set that includes a plurality of compressed data slabs is created based on the data set, and the storage data set is stored via a plurality of computing devices. Each compressed data slab of the plurality of compressed data slabs is generated from at least one corresponding uncompressed data slab of the plurality of uncompressed data slabs, and each compressed data slab is generated to include compressed data and compression information. The compressed data is generated based on determining non-null ones of the plurality of values of the at least one corresponding uncompressed data slab. The compression information is generated based on positions of the non-null ones of the plurality of values in accordance with a serialized value ordering.

20 Claims, 38 Drawing Sheets

Related U.S. Application Data continuation-in-part of application No. 16/220,454, filed on Dec. 14, 2018, now Pat. No. 11,256,696.

(60) Provisional application No. 62/745,787, filed on Oct. 15, 2018.

(51) Int. Cl.
   *G06F 16/2455* (2019.01)
   *H03M 7/46* (2006.01)

(58) Field of Classification Search
   CPC ......... H03M 13/2906; H03M 13/6312; H03M 7/3059; H03M 7/3071; H03M 7/3079; H03M 7/4006; H03M 7/48; H03M 7/6088; G06F 3/0656; G06F 2212/401; G06F 16/24532; G06F 12/0802; G06F 3/067; G06F 3/0688; G06F 16/901; G06F 9/3851; G06F 9/3822
   USPC .................. 341/50, 59, 81, 87, 106, 107
   See application file for complete search history.

(56) References Cited

U.S. PATENT DOCUMENTS

| | | | |
|---|---|---|---|
| 5,729,228 A * | 3/1998 | Franaszek | G06T 9/005 341/51 |
| 5,826,054 A | 10/1998 | Jacobs | |
| 6,230,200 B1 | 5/2001 | Forecast | |
| 6,633,772 B2 | 10/2003 | Ford | |
| 7,358,867 B2 * | 4/2008 | Fallon | H03M 7/4006 34/67 |
| 7,499,907 B2 | 3/2009 | Brown | |
| 7,908,242 B1 | 3/2011 | Achanta | |
| 8,044,829 B2 * | 10/2011 | Chen | H03M 7/3086 341/59 |
| 8,179,291 B2 * | 5/2012 | Shalev | H03M 7/30 341/51 |
| 8,378,859 B2 | 2/2013 | Frederiksen | |
| 10,819,369 B2 * | 10/2020 | Arelakis | G06F 3/064 |
| 11,256,696 B2 * | 2/2022 | Arnold | H03M 7/30 |
| 11,880,368 B2 * | 1/2024 | Kondiles | G06F 16/24556 |
| 2001/0051949 A1 | 12/2001 | Carey | |
| 2002/0032676 A1 | 3/2002 | Reiner | |
| 2002/0057213 A1 * | 5/2002 | Heath | H03M 7/3088 341/51 |
| 2004/0162853 A1 | 8/2004 | Brodersen | |
| 2008/0133456 A1 | 6/2008 | Richards | |
| 2009/0006399 A1 | 1/2009 | Raman | |
| 2009/0063893 A1 | 3/2009 | Bagepalli | |
| 2009/0183167 A1 | 7/2009 | Kupferschmidt | |
| 2010/0082577 A1 | 4/2010 | Mirchandani | |
| 2010/0241646 A1 | 9/2010 | Friedman | |
| 2010/0274983 A1 | 10/2010 | Murphy | |
| 2010/0312756 A1 | 12/2010 | Zhang | |
| 2010/0328115 A1 | 12/2010 | Binnig | |
| 2011/0219169 A1 | 9/2011 | Zhang | |
| 2012/0109888 A1 | 5/2012 | Zhang | |
| 2012/0151118 A1 | 6/2012 | Flynn | |
| 2012/0185866 A1 | 7/2012 | Couvee | |
| 2012/0254252 A1 | 10/2012 | Jin | |
| 2012/0311246 A1 | 12/2012 | McWilliams | |
| 2013/0332484 A1 | 12/2013 | Gajic | |
| 2014/0047095 A1 | 2/2014 | Breternitz | |
| 2014/0104085 A1 * | 4/2014 | Cohen | H03M 7/3086 341/87 |
| 2014/0136510 A1 | 5/2014 | Parkkinen | |
| 2014/0188841 A1 | 7/2014 | Sun | |
| 2015/0149852 A1 * | 5/2015 | Seo | G06F 11/1044 714/755 |
| 2015/0205607 A1 | 7/2015 | Lindholm | |
| 2015/0244804 A1 | 8/2015 | Warfield | |
| 2015/0248366 A1 * | 9/2015 | Bergsten | G06F 13/4221 710/308 |
| 2015/0293966 A1 | 10/2015 | Cai | |
| 2015/0310045 A1 | 10/2015 | Konik | |
| 2016/0034547 A1 | 2/2016 | Lerios | |
| 2016/0378545 A1 | 12/2016 | Ho | |
| 2018/0143770 A1 * | 5/2018 | Arelakis | H03M 7/30 |
| 2019/0034091 A1 | 1/2019 | Arelakis | |

OTHER PUBLICATIONS

Alechina, N. (2006-2007). B-Trees. School of Computer Science, University of Nottingham, http://www.cs.nott.ac.uk/~psznza/G5BADS06/lecture13-print.pdf. 41 pages.

Amazon DynamoDB: ten things you really should know, Nov. 13, 2015, Chandan Patra, http://cloudacademy. .com/blog/amazon-dynamodb-ten-thing.

An Inside Look at Google BigQuery, by Kazunori Sato, Solutions Architect, Cloud Solutions team, Google Inc., 2012.

Big Table, a NoSQL massively parallel table, Paul Krzyzanowski, Nov. 2011, https://www.cs.rutgers.edu/pxk/417/notes/contentlbigtable.html.

Distributed Systems, Fall2012, Mohsen Taheriyan, http://www-scf.usc.edu/-csci57212011Spring/presentations/Taheriyan.pptx.

International Searching Authority; International Search Report and Written Opinion; International Application No. PCT/US2017/054773; Feb. 13, 2018; 17 pgs.

International Searching Authority; International Search Report and Written Opinion; International Application No. PCT/US2017/054784; Dec. 28, 2017; 10 pgs.

International Searching Authority; International Search Report and Written Opinion; International Application No. PCT/US2017/066145; Mar. 5, 2018; 13 pgs.

International Searching Authority; International Search Report and Written Opinion; International Application No. PCT/US2017/066169; Mar. 6, 2018; 15 pgs.

International Searching Authority; International Search Report and Written Opinion; International Application No. PCT/US2018/025729; Jun. 27, 2018; 9 pgs.

International Searching Authority; International Search Report and Written Opinion; International Application No. PCT/US2018/034859; Oct. 30, 2018; 8 pgs.

MapReduce: Simplified Data Processing on Large Clusters, OSDI 2004, Jeffrey Dean and Sanjay Ghemawat, Google, Inc., 13 pgs.

Rodero-Merino, L.; Storage of Structured Data: Big Table and HBase, New Trends In Distributed Systems, MSc Software and Systems, Distributed Systems Laboratory; Oct. 17, 2012; 24 pages.

Step 2: Examine the data model and implementation details, 2016, Amazon Web Services, Inc., http://docs.aws.amazon.com/amazondynamodb/latestldeveloperguide!Ti . . . .

* cited by examiner database system 10 computing device 18 computing device 18 computing device 18 node 37 node 37 node 37 node 37

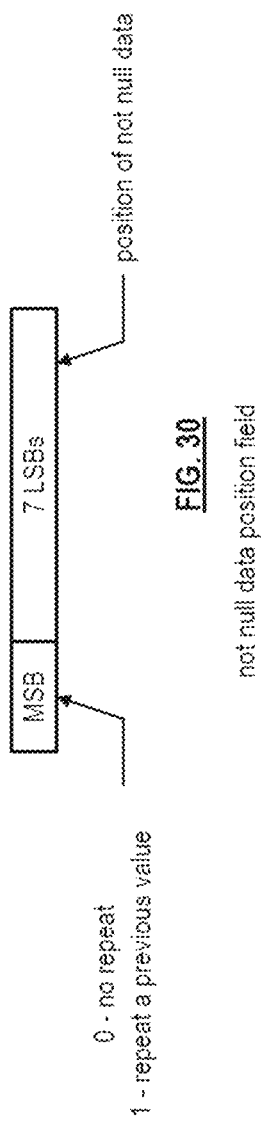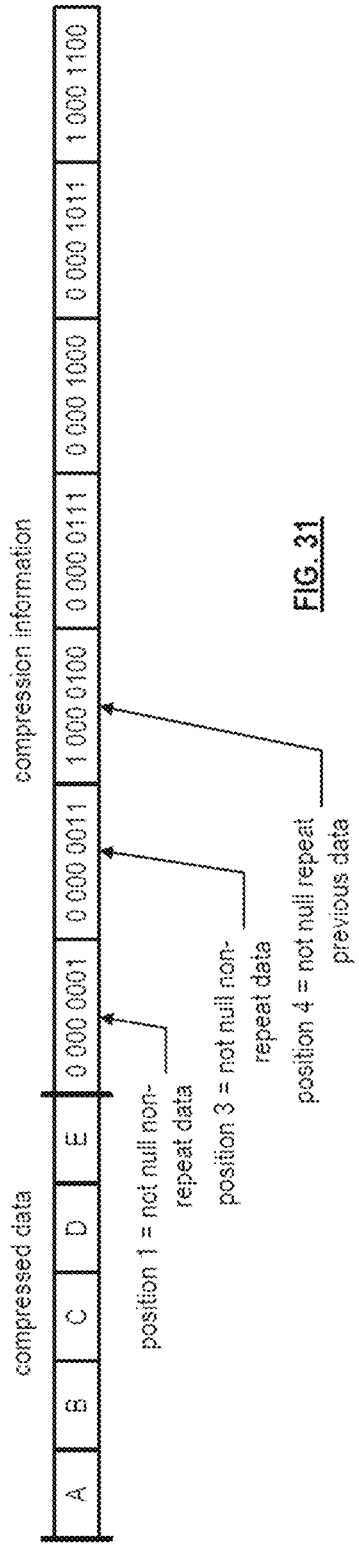

run length encoding (RLE) compression

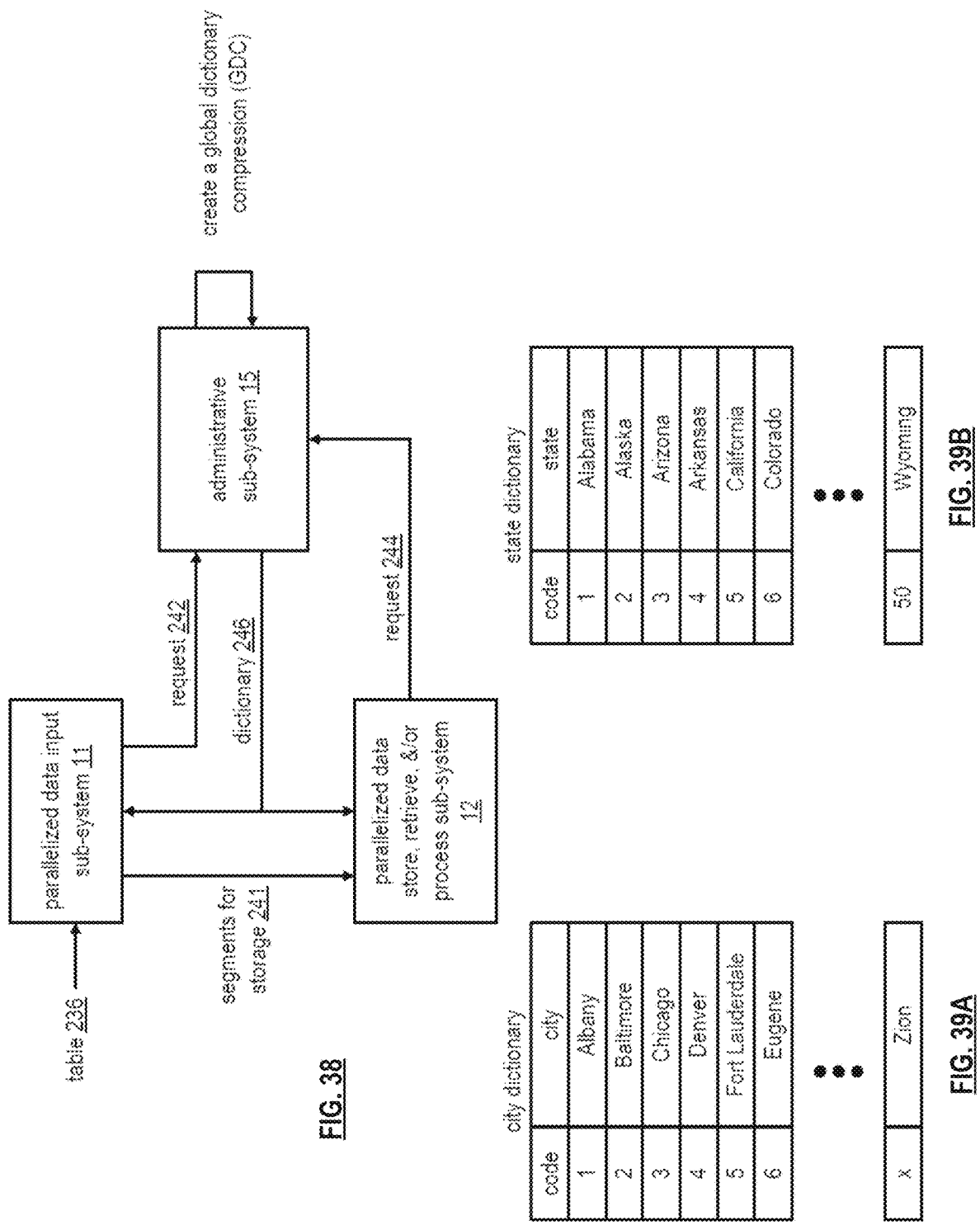

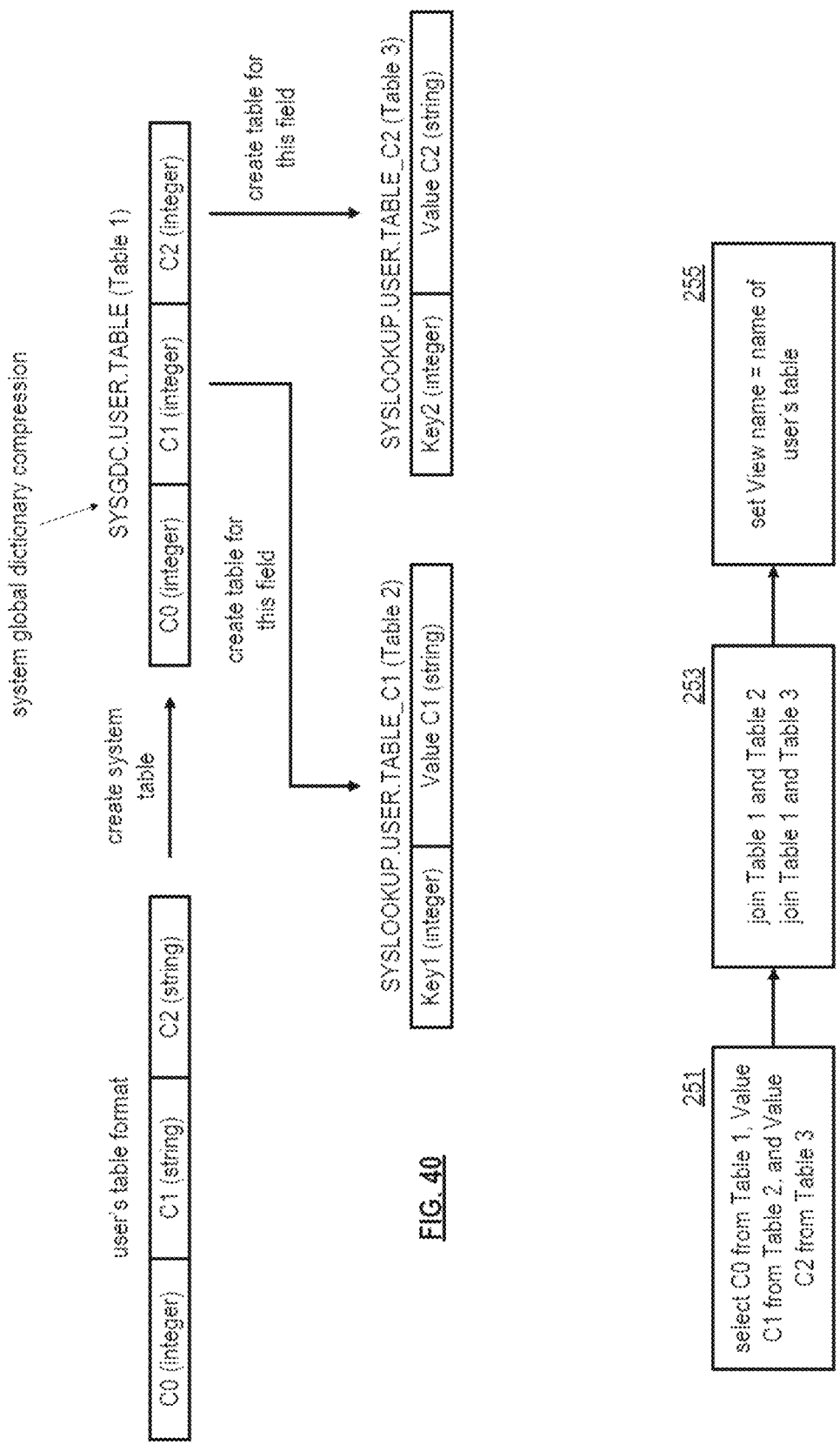

CREATING COMPRESSED DATA SLABS THAT EACH INCLUDE COMPRESSED DATA AND COMPRESSION INFORMATION FOR STORAGE IN A DATABASE SYSTEM

CROSS-REFERENCE TO RELATED APPLICATIONS

The present U.S. Utility patent application claims priority pursuant to 35 U.S.C. § 120 as a continuation of U.S. Utility application Ser. No. 17/571,675, entitled "COMPRESSING DATA SETS FOR STORAGE IN A DATABASE SYSTEM", filed Jan. 10, 2022, which is a continuation-in-part of U.S. Utility application Ser. No. 16/220,454, entitled "DATA SET COMPRESSION WITHIN A DATABASE SYSTEM", filed Dec. 14, 2018, issued as U.S. Pat. No. 11,256,696 on Feb. 22, 2022, which claims priority pursuant to 35 U.S.C. § 119(e) to U.S. Provisional Application No. 62/745,787, entitled "DATABASE SYSTEM AND OPERATION", filed Oct. 15, 2018, all of which are hereby incorporated herein by reference in their entirety and made part of the present U.S. Utility patent application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to computer networking and more particularly to database system and operation.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function.

Of the many applications a computer can perform, a database system is one of the largest and most complex applications. In general, a database system stores a large amount of data in a particular way for subsequent processing. In some situations, the hardware of the computer is a limiting factor regarding the speed at which a database system can process a particular function. In some other instances, the way in which the data is stored is a limiting factor regarding the speed of execution. In yet some other instances, restricted co-process options are a limiting factor regarding the speed of execution.

BRIEF DESCRIPTION OF THE SEVERAL VIEWS OF THE DRAWING(S)

FIG. 28 is a schematic block diagram of an example of compressing data using null elimination in accordance with the present invention;

FIG. 29 is a schematic block diagram of another example of compressing data using null elimination in accordance with the present invention;

FIG. 30 is a schematic block diagram of an example of a compression information field for data compression using null elimination in accordance with the present invention;

FIG. 31 is a schematic block diagram of an example of compressing data using a combination of null elimination and run length encoding in accordance with the present invention;

FIG. 38 is a schematic block diagram of an example a portion of the database system for implementing global dictionary compression (GDC) in accordance with the present invention;

FIG. 39A is a schematic block diagram of an example of a global dictionary compression (GDC) for cities in accordance with the present invention;

FIG. 39B is a schematic block diagram of an example of a global dictionary compression (GDC) for states in accordance with the present invention;

FIG. 40 is a schematic block diagram of an example of creating tables to form a view of a user's table in accordance with the present invention;

FIG. 41 is a schematic block diagram of an example of forming a view of a user's table from the tables created in FIG. 40 in accordance with the present invention;

DETAILED DESCRIPTION OF THE INVENTION

Figure 1:
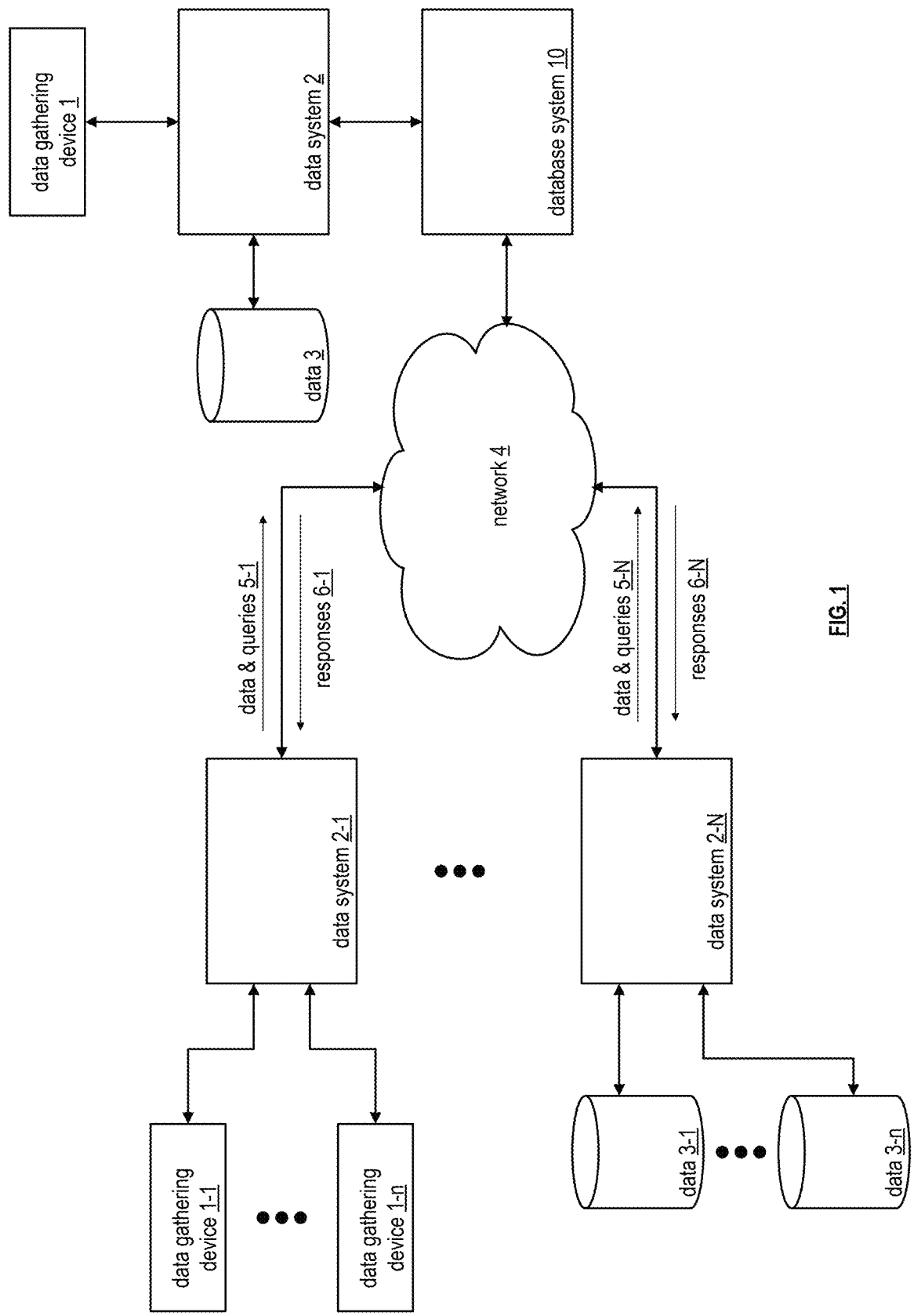
FIG. 1 is a schematic block diagram of an embodiment of a large scale data processing network that includes a database system in accordance with the present invention.

FIG. 1 is a schematic block diagram of an embodiment of a large-scale data processing network that includes data gathering device 1, data gathering devices 1-1 through 1-n, data system 2, data systems 2-1 through 2-N, data 3, data 3-1 through 3-n, a network 4, and a database system 10. The data systems 2-1 through 2-N provide, via the network 4, data and queries 5-1 through 5-N data to the database system 10. Alternatively, or in addition to, the data system 2 provides further data and queries directly to the database system 10. In response to the data and queries, the database system 10 issues, via the network 4, responses 6-1 through 6-N to the data systems 2-1 through 2-N. Alternatively, or in addition to, the database system 10 provides further responses directly to the data system 2. The data gathering devices 1, 1-1 through 1-n may be implemented utilizing sensors, monitors, handheld computing devices, etc. and/or a plurality of storage devices including hard drives, cloud storage, etc. The data gathering devices 1-1 through 1-n may provide real-time data to the data system 2-1 and/or any other data system and the data 3-1 through 3-n may provide stored data to the data system 2-N and/or any other data system.

Figure 1A:
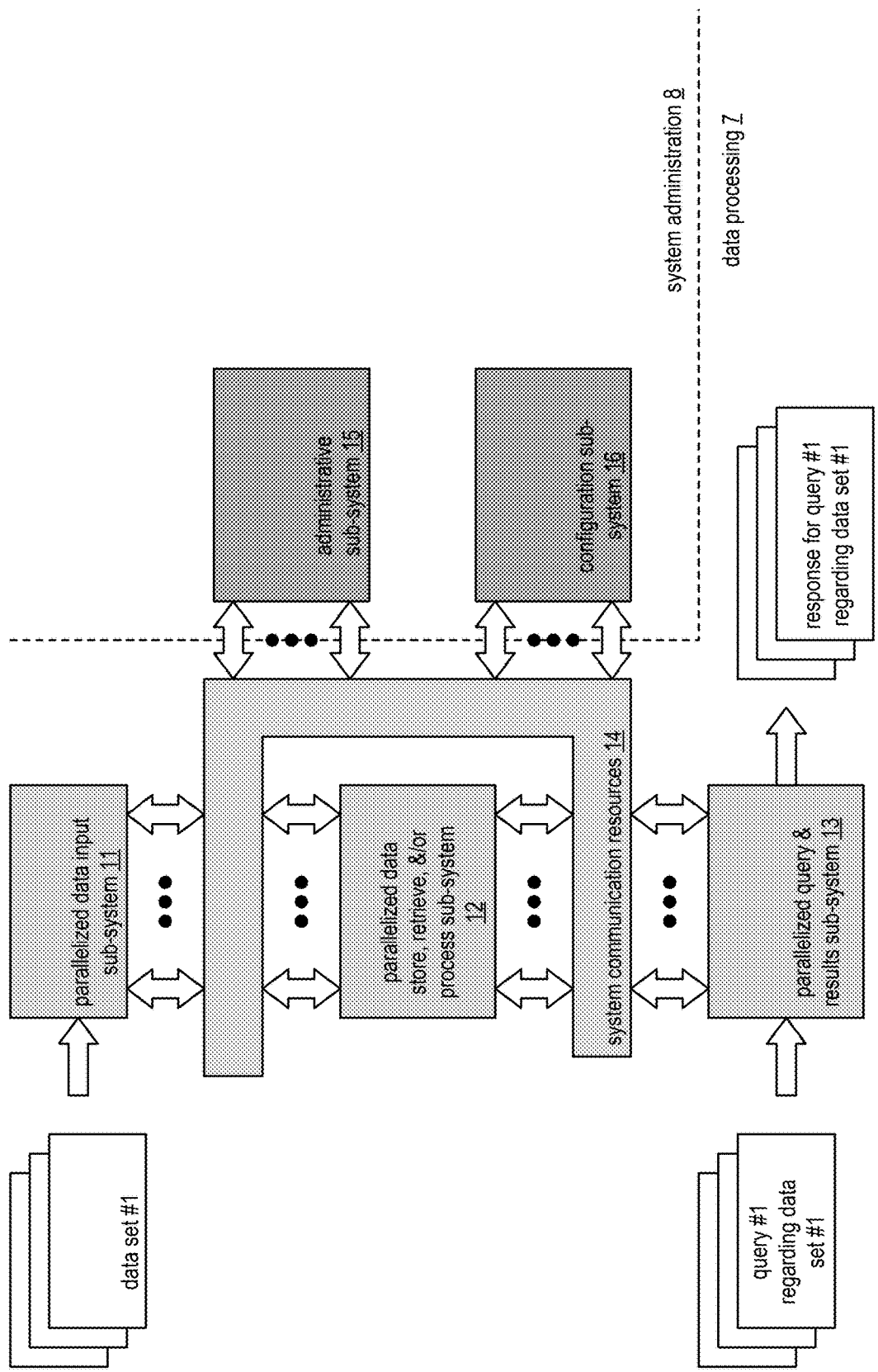
FIG. 1A is a schematic block diagram of an embodiment of a database system in accordance with the present invention.

FIG. 1A is a schematic block diagram of an embodiment of a database system 10 that includes data processing 7 and system administration 8. The data processing 7 includes a parallelized data input sub-system 11, a parallelized data store, retrieve, and/or process sub-system 12, a parallelized query and response sub-system 13, and system communication resources 14. The system administration 8 includes an administrative sub-system 15 and a configuration sub-system 16. The system communication resources 14 include one or more of wide area network (WAN) connections, local area network (LAN) connections, wireless connections, wireline connections, etc. to couple the sub-systems 11, 12, 13, 15, and 16 together. Each of the sub-systems 11, 12, 13, 15, and 16 include a plurality of computing devices; an example of which is discussed with reference to one or more of FIGS. 7-9.

In an example of operation, the parallelized data input sub-system 11 receives tables of data from a data source. For example, a data set no. 1 is received when the data source includes one or more computers. As another example, the data source is a plurality of machines. As yet another example, the data source is a plurality of data mining algorithms operating on one or more computers. The data source organizes its data into a table that includes rows and columns. The columns represent fields of data for the rows. Each row corresponds to a record of data. For example, a table include payroll information for a company's employees. Each row is an employee's payroll record. The columns include data fields for employee name, address, department, annual salary, tax deduction information, direct deposit information, etc.

The parallelized data input sub-system 11 processes a table to determine how to store it. For example, the parallelized data input sub-system 11 divides the data into a plurality of data partitions. For each data partition, the parallelized data input sub-system 11 determines a number of data segments based on a desired encoding scheme. As a specific example, when a 4 of 5 encoding scheme is used (meaning any 4 of 5 encoded data elements can be used to recover the data), the parallelized data input sub-system 11 divides a data partition into 5 segments. The parallelized data input sub-system 11 then divides a data segment into data slabs. Using one or more of the columns as a key, or keys, the parallelized data input sub-system 11 sorts the data slabs. The sorted data slabs are sent, via the system communication resources 14, to the parallelized data store, retrieve, and/or process sub-system 12 for storage.

The parallelized query and response sub-system 13 receives queries regarding tables and processes the queries prior to sending them to the parallelized data store, retrieve, and/or process sub-system 12 for processing. For example, the parallelized query and response sub-system 13 receives a specific query no. 1 regarding the data set no. 1 (e.g., a specific table). The query is in a standard query format such as Open Database Connectivity (ODBC), Java Database Connectivity (JDBC), and/or SPARK. The query is assigned to a node within the sub-system 13 for subsequent processing. The assigned node identifies the relevant table, determines where and how it is stored, and determines available nodes within the parallelized data store, retrieve, and/or process sub-system 12 for processing the query.

In addition, the assigned node parses the query to create an abstract syntax tree. As a specific example, the assigned node converts an SQL (Standard Query Language) statement into a database instruction set. The assigned node then validates the abstract syntax tree. If not valid, the assigned node generates a SQL exception, determines an appropriate correction, and repeats. When the abstract syntax tree is validated, the assigned node then creates an annotated abstract syntax tree. The annotated abstract syntax tree includes the verified abstract syntax tree plus annotations regarding column names, data type(s), data aggregation or not, correlation or not, sub-query or not, and so on.

The assigned node then creates an initial query plan from the annotated abstract syntax tree. The assigned node optimizes the initial query plan using a cost analysis function (e.g., processing time, processing resources, etc.). Once the query plan is optimized, it is sent, via the system communication resources 14, to the parallelized data store, retrieve, and/or process sub-system 12 for processing.

Within the parallelized data store, retrieve, and/or process sub-system 12, a computing device is designated as a primary device for the query plan and receives it. The primary device processes the query plan to identify nodes within the parallelized data store, retrieve, and/or process sub-system 12 for processing the query plan. The primary device then sends appropriate portions of the query plan to the identified nodes for execution. The primary device receives responses from the identified nodes and processes them in accordance with the query plan. The primary device provides the resulting response to the assigned node of the parallelized query and response sub-system 13. The assigned node determines whether further processing is needed on the resulting response (e.g., joining, filtering, etc.). If not, the assigned node outputs the resulting response as the response to the query (e.g., a response for query no. 1 regarding data set no. 1). If, however, further processing is determined, the assigned node further processes the resulting response to produce the response to the query.

Figure 2:
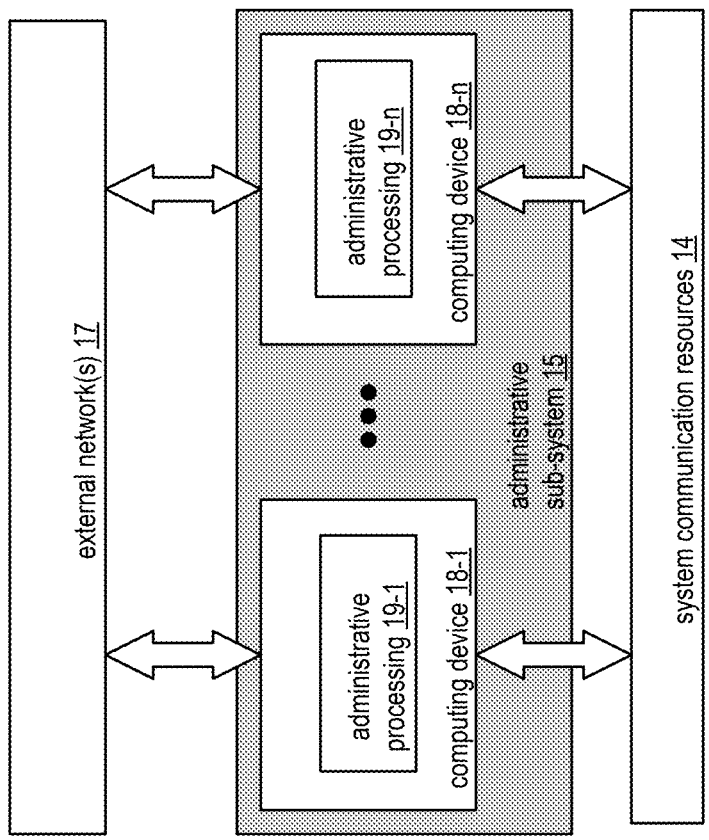
FIG. 2 is a schematic block diagram of an embodiment of an administrative sub-system in accordance with the present invention.

FIG. 2 is a schematic block diagram of an embodiment of the administrative sub-system 15 of FIG. 1A that includes one or more computing devices 18-1 through 18-$n$. Each of the computing devices executes an administrative processing function utilizing a corresponding administrative processing of administrative processing 19-1 through 19-$n$ (which includes a plurality of administrative operations) that coordinates system level operations of the database system. Each computing device is coupled to an external network 17, or networks, and to the system communication resources 14 of FIG. 1A.

As will be described in greater detail with reference to one or more subsequent figures, a computing device includes a plurality of nodes and each node includes a plurality of processing core resources. Each processing core resource is capable of executing at least a portion of an administrative operation independently. This supports lock free and parallel execution of one or more administrative operations.

Figure 3:
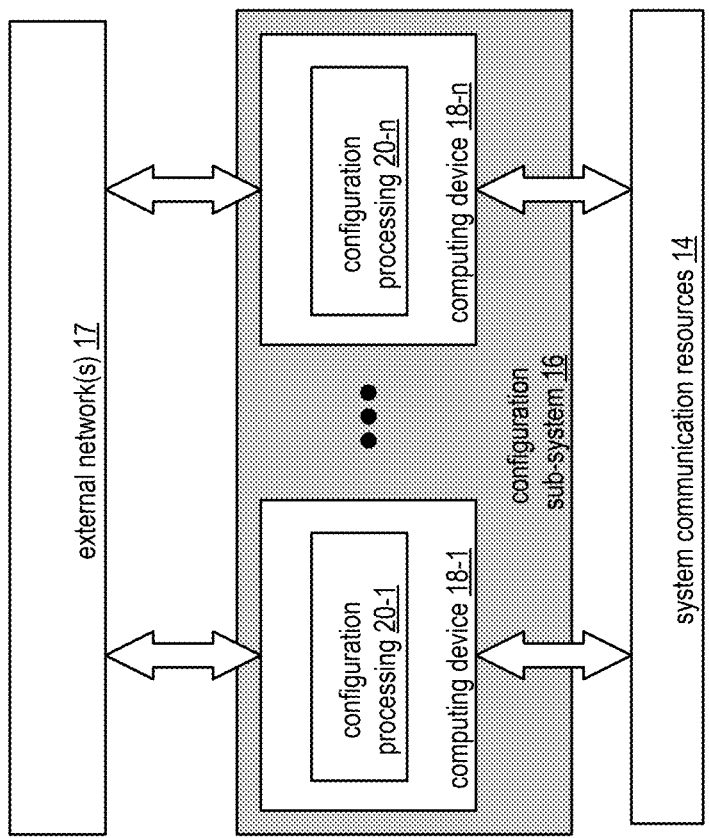
FIG. 3 is a schematic block diagram of an embodiment of a configuration sub-system in accordance with the present invention.

FIG. 3 is a schematic block diagram of an embodiment of the configuration sub-system 16 of FIG. 1A that includes one or more computing devices 18-1 through 18-$n$. Each of the computing devices executes a configuration processing function utilizing a corresponding configuration processing of configuration processing 20-1 through 20-$n$ (which includes a plurality of configuration operations) that coordinates system level configurations of the database system. Each computing device is coupled to the external network 17 of FIG. 2, or networks, and to the system communication resources 14 of FIG. 1A.

As will be described in greater detail with reference to one or more subsequent figures, a computing device includes a plurality of nodes and each node includes a plurality of processing core resources. Each processing core resource is capable of executing at least a portion of a configuration operation independently. This supports lock free and parallel execution of one or more configuration operations.

Figure 4:
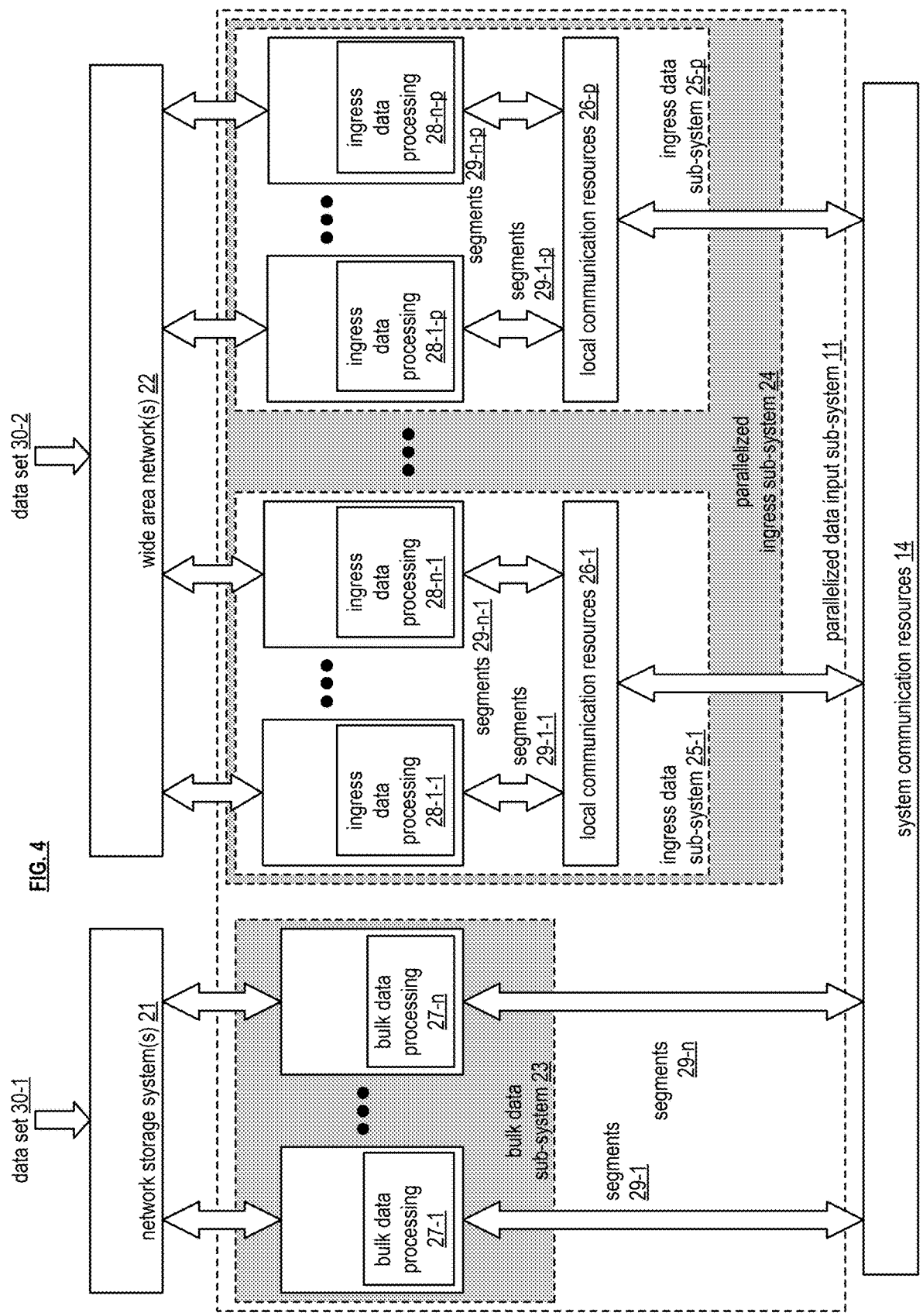
FIG. 4 is a schematic block diagram of an embodiment of a parallelized data input sub-system in accordance with the present invention.

FIG. 4 is a schematic block diagram of an embodiment of the parallelized data input sub-system 11 of FIG. 1A that includes a bulk data sub-system 23 and a parallelized ingress sub-system 24. The bulk data sub-system 23 includes a plurality of computing devices 18-1 through 18-$n$. The computing devices of the bulk data sub-system 23 execute a bulk data processing function to retrieve a table from a network storage system 21 (e.g., a server, a cloud storage service, etc.).

The parallelized ingress sub-system 24 includes a plurality of ingress data sub-systems 25-1 through 25-$p$ that each include a local communication resource of local communication resources 26-1 through 26-$p$ and a plurality of computing devices 18-1 through 18-$n$. Each of the computing devices of the parallelized ingress sub-system 24 execute an ingress data processing function utilizing an ingress data processing of ingress data processing 28-1 through 28-$n$ of each ingress data sub-system 25-1 through 25-$p$ that enables the computing device to stream data of a table (e.g., a data set 30-2 as segments 29-1-1 through 29-1-$n$ and through 29-1-$p$ through 29-$n$-$p$) into the database system 10 of FIG. 1A via a wide area network 22 (e.g., cellular network, Internet, telephone network, etc.). The streaming may further be via corresponding local communication resources 26-1 through 26-$p$ and via the system communication resources 14 of FIG. 1A. With the plurality of ingress data sub-systems 25-1 through 25-$p$, data from a plurality of tables can be streamed into the database system 10 at one time (e.g., simultaneously utilizing two or more of the ingress data sub-systems 25-1 through 25-$p$ in a parallel fashion).

Each of the bulk data processing function and the ingress data processing function generally function as described with reference to FIG. 1 for processing a table for storage. The bulk data processing function is geared towards retrieving data of a table in a bulk fashion (e.g., a data set 30-1 as the table is stored and retrieved, via the system communication resources 14 of FIG. 1A, from storage as segments 29-1 through 29-$n$). The ingress data processing function, however, is geared towards receiving streaming data from one or more data sources. For example, the ingress data processing function is geared towards receiving data from a plurality of machines in a factory in a periodic or continual manner as the machines create the data.

As will be described in greater detail with reference to one or more subsequent figures, a computing device includes a plurality of nodes and each node includes a plurality of processing core resources. Each processing core resource is capable of executing at least a portion of the bulk data processing function or the ingress data processing function. In an embodiment, a plurality of processing core resources of one or more nodes executes the bulk data processing function or the ingress data processing function to produce the storage format for the data of a table.

Figure 5:
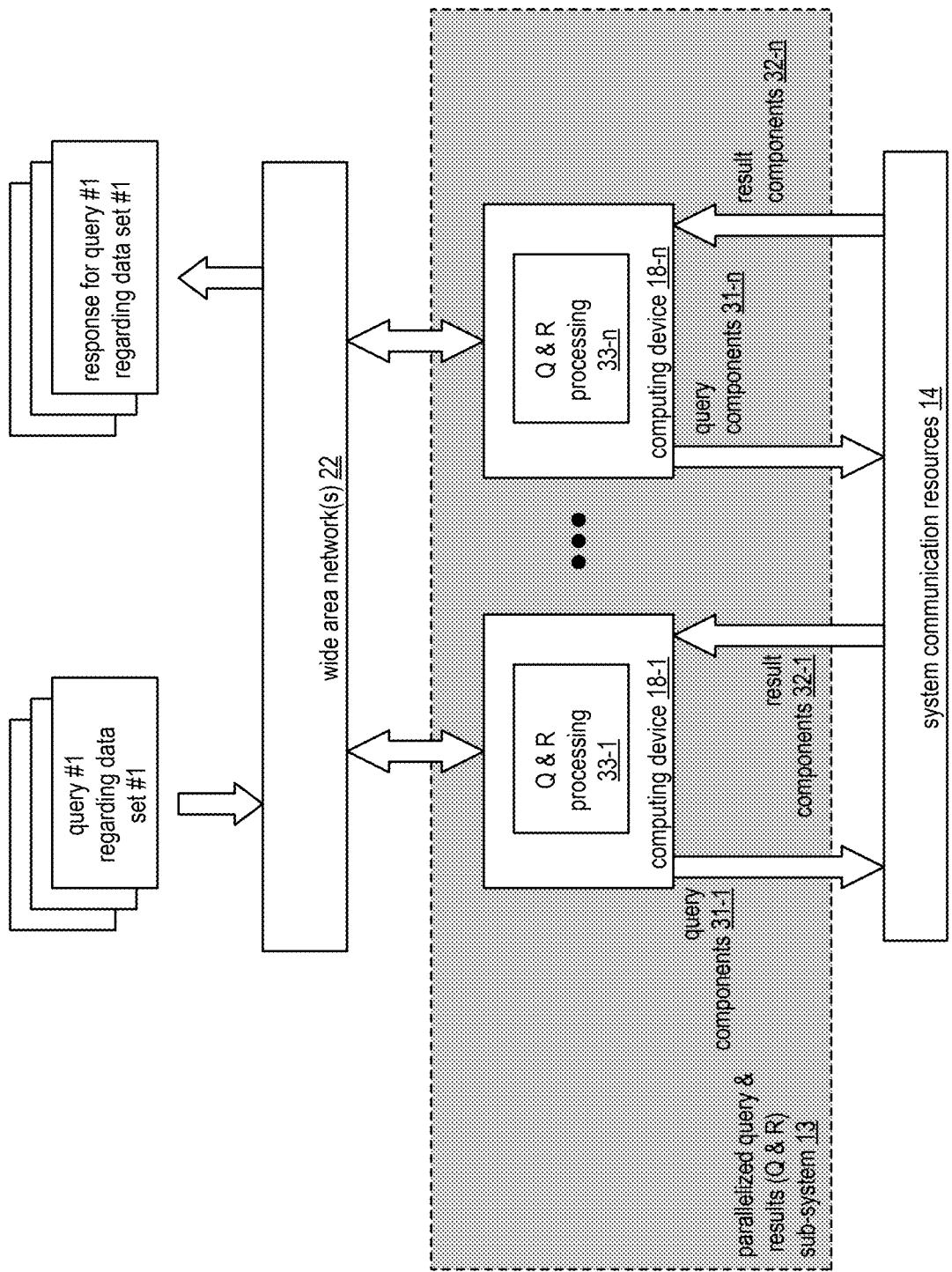
FIG. 5 is a schematic block diagram of an embodiment of a parallelized query and response (Q&R) sub-system in accordance with the present invention.

FIG. 5 is a schematic block diagram of an embodiment of a parallelized query and results sub-system 13 that includes a plurality of computing devices 18-1 through 18-n. Each of the computing devices executes a query (Q) & response (R) function utilizing a corresponding Q & R processing of Q & R processing 33-1 through 33-n. The computing devices are coupled to the wide area network 22 of FIG. 4 to receive queries (e.g., query no. 1 regarding data set no. 1) regarding tables and to provide responses to the queries (e.g., response for query no. 1 regarding the data set no. 1). For example, the plurality of computing devices 18-1 through 18-n receives a query, via the wide area network 22, issues, via the system communication resources 14 of FIG. 1A, query components 31-1 through 31-n to the parallelized data store, retrieve, &/or process sub-system 12 of FIG. 1A, receives, via the system communication resources 14, results components 32-1 through 32-n, and issues, via the wide area network 22, a response to the query.

The Q & R function enables the computing devices to processing queries and create responses as discussed with reference to FIG. 1. As will be described in greater detail with reference to one or more subsequent figures, a computing device includes a plurality of nodes and each node includes a plurality of processing core resources. Each processing core resource is capable of executing at least a portion of the Q & R function. In an embodiment, a plurality of processing core resources of one or more nodes executes the Q & R function to produce a response to a query.

Figure 6:
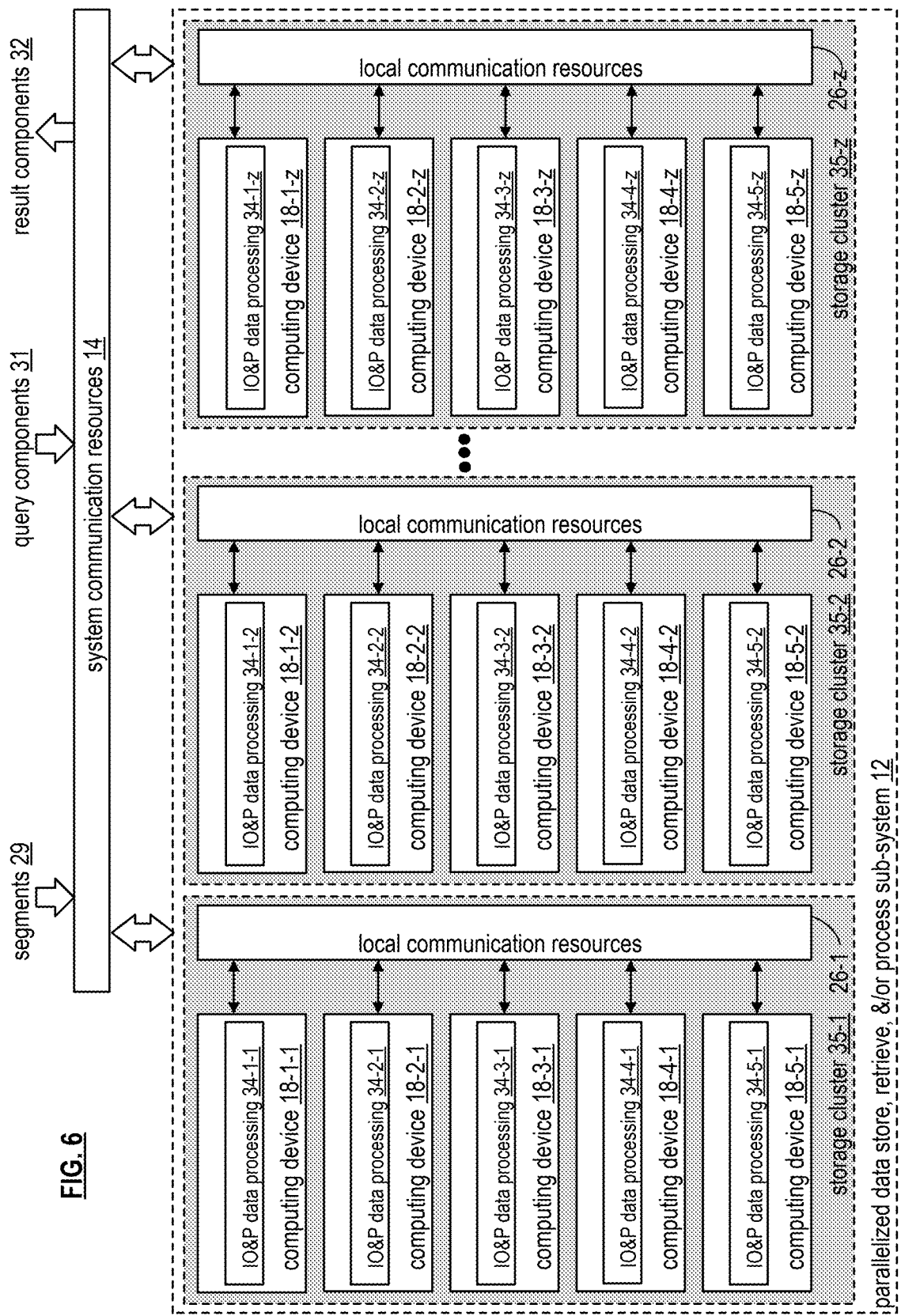
FIG. 6 is a schematic block diagram of an embodiment of a parallelized data store, retrieve, and/or process (IO& P) sub-system in accordance with the present invention.

FIG. 6 is a schematic block diagram of an embodiment of a parallelized data store, retrieve, and/or process sub-system 12 that includes a plurality of storage clusters 35-1 through 35-z. Each storage cluster includes a corresponding local communication resource of a plurality of local communication resources 26-1 through 26-z and includes a plurality of computing devices 18-1 through 18-5 and each computing device executes an input, output, and processing (IO &P) function utilizing a corresponding IO &P function of IO &P functions 34-1 through 34-5 to produce at least a portion of a resulting response. Each local communication resource may be implemented with a local communication resource of the local communication resources 26-1 through 26p of FIG. 4. The number of computing devices in a cluster corresponds to the number of segments in which a data partitioned is divided. For example, if a data partition is divided into five segments, a storage cluster includes five computing devices. Each computing device then stores one of the segments. As an example of operation, segments 29 are received, via the system communication resources 14 of FIG. 1A and via the local communication resources 26-1, for storage by computing device 18-4-1. Subsequent to storage, query components 31 (e.g., a query) are received, via the system communication resources 14 and the local communication resources 26-1, by the computing device 18-4-1 for processing by the IO & P data processing 34-4-1 to produce result components 32 (e.g., query response). The computing device 18-4-1 facilitates sending, via the local communication resources 26-1 and the system communication resources 14, the result components 32 to a result receiving entity.

As will be described in greater detail with reference to one or more subsequent figures, a computing device includes a plurality of nodes and each node includes a plurality of processing core resources. Each processing core resource is capable of executing at least a portion of the IO & P function. In an embodiment, a plurality of processing core resources of one or more nodes executes the IO & P function to produce at least a portion of the resulting response as discussed in FIG. 1.

Figure 7:
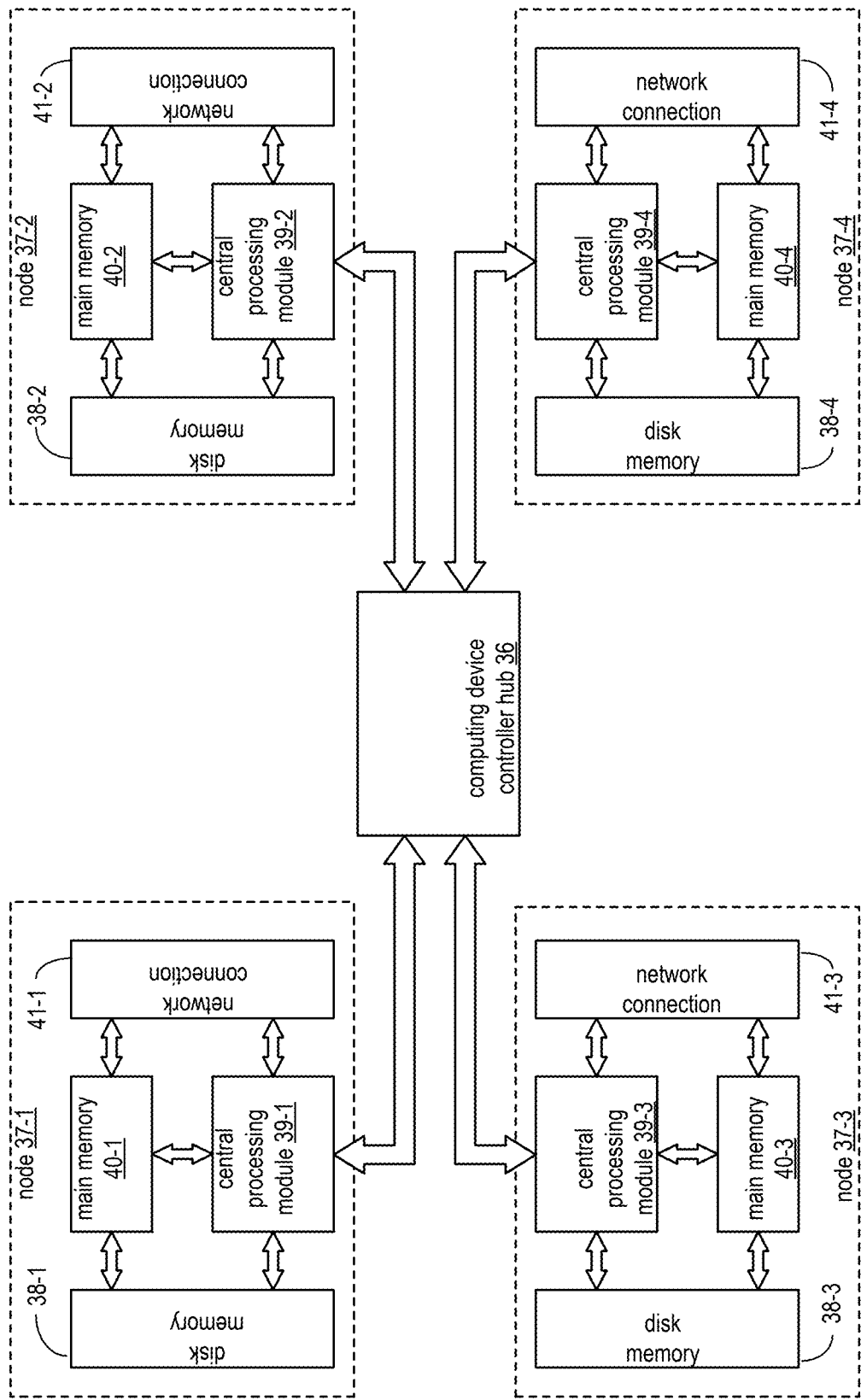
FIG. 7 is a schematic block diagram of an embodiment of a computing device in accordance with the present invention.

FIG. 7 is a schematic block diagram of an embodiment of a computing device 18 that includes a plurality of nodes 37-1 through 37-4 coupled to a computing device controller hub 36. The computing device controller hub 36 includes one or more of a chipset, a quick path interconnect (QPI), and an ultra path interconnection (UPI). Each node 37-1 through 37-4 includes a central processing module of central processing modules 40-1 through 40-4, a main memory of main memories 39-1 through 39-4, a disk memory of disk memories 38-1 through 38-4, and a network connection of network connections 41-1 through 41-4. In an alternate configuration, the nodes share a network connection, which is coupled to the computing device controller hub 36 or to one of the nodes as illustrated in subsequent figures.

In an embodiment, each node is capable of operating independently of the other nodes. This allows for large scale parallel operation of a query request, which significantly reduces processing time for such queries. In another embodiment, one or more node function as co-processors to share processing requirements of a particular function, or functions.

Figure 8:
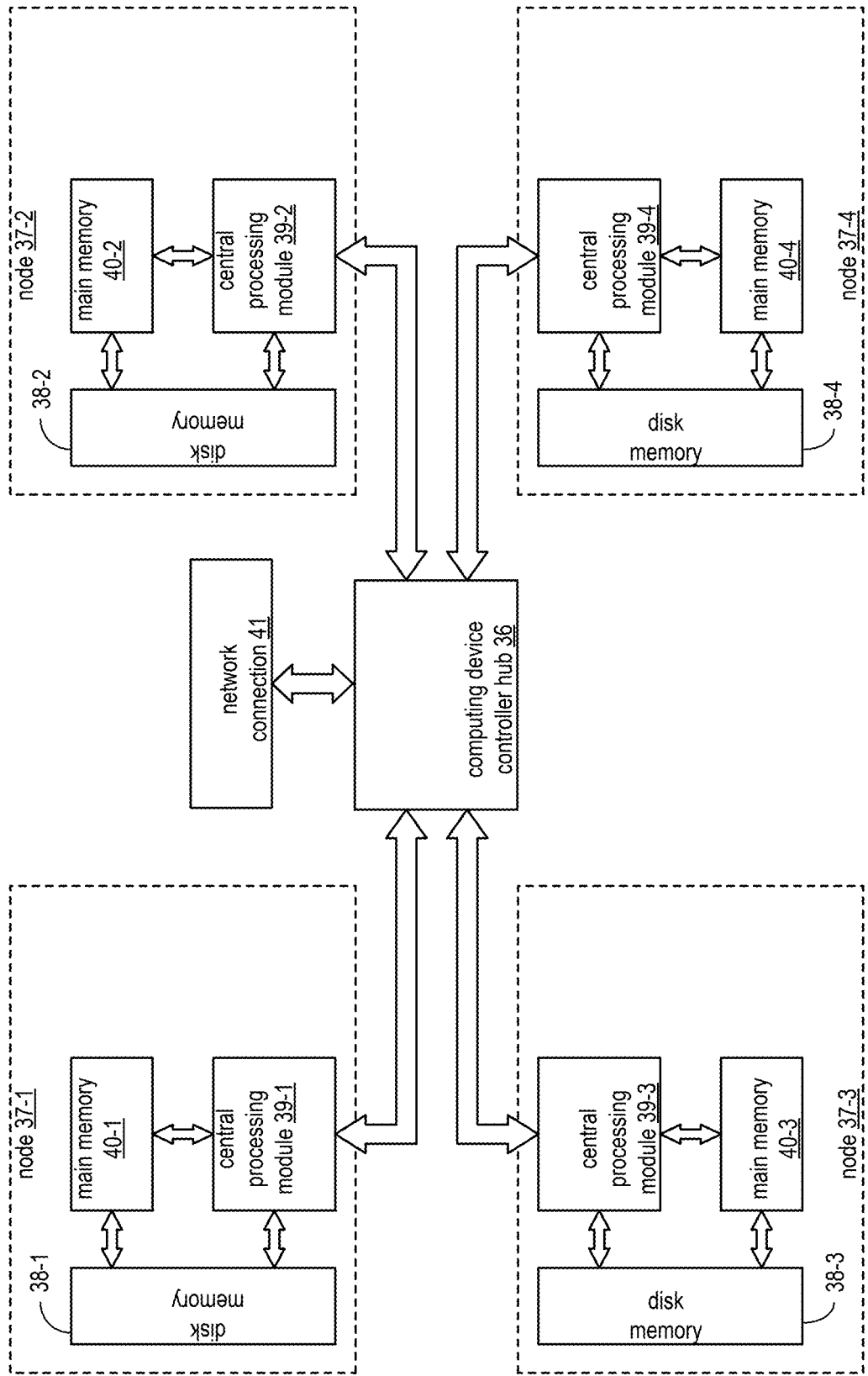
FIG. 8 is a schematic block diagram of another embodiment of a computing device in accordance with the present invention.

FIG. 8 is a schematic block diagram of another embodiment of a computing device is similar to the computing device of FIG. 7 with an exception that it includes a single network connection 41, which is coupled to the computing device controller hub 36. As such, each node coordinates with the computing device controller hub to transmit or receive data via the network connection.

Figure 9:
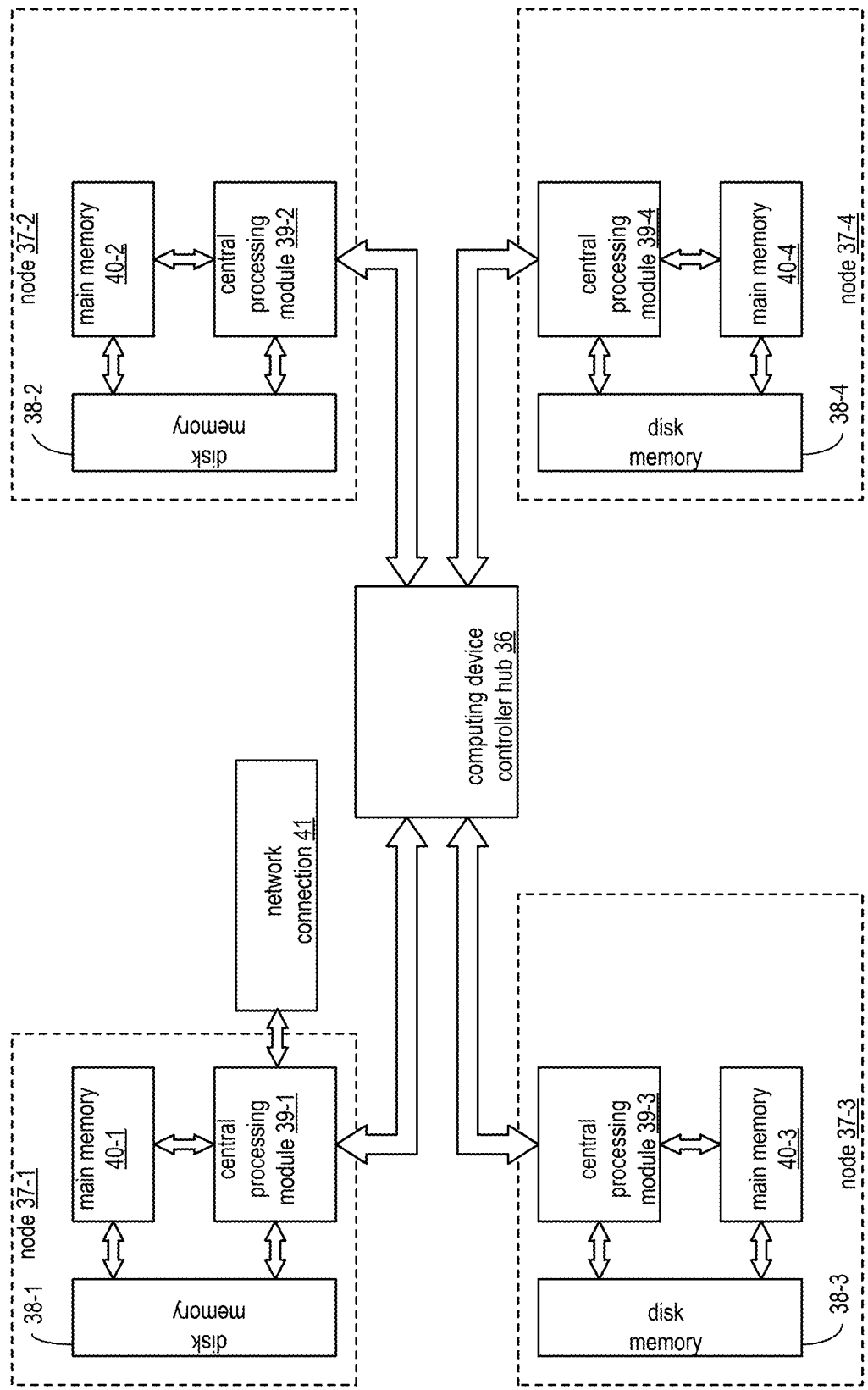
FIG. 9 is a schematic block diagram of another embodiment of a computing device in accordance with the present invention.

FIG. 9 is a schematic block diagram of another embodiment of a computing device is similar to the computing device of FIG. 7 with an exception that it includes a single network connection 41, which is coupled to a central processing module of a node (e.g., to central processing module 40-1 of node 37-1). As such, each node coordinates with the central processing module via the computing device controller hub 36 to transmit or receive data via the network connection.

Figure 10:
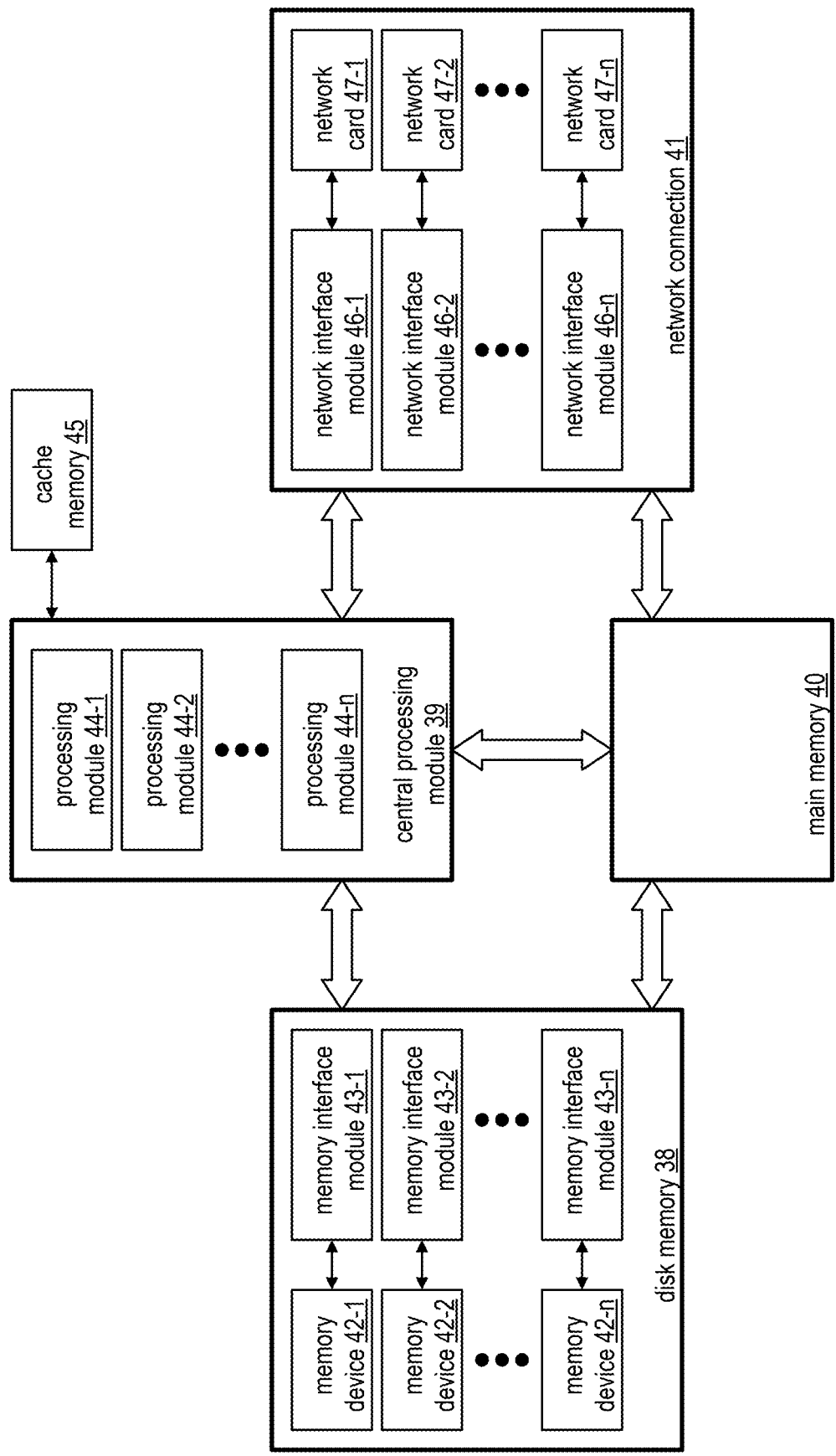
FIG. 10 is a schematic block diagram of an embodiment of a node of a computing device in accordance with the present invention.

FIG. 10 is a schematic block diagram of an embodiment of a node 37 of computing device 18. The node 37 includes the central processing module 39, the main memory 40, the disk memory 38, and the network connection 41. The main memory 40 includes read only memory (RAM) and/or other form of volatile memory for storage of data and/or operational instructions of applications and/or of the operating system. The central processing module 39 includes a plurality of processing modules 44-1 through 44-n and an associated one or more cache memory 45. A processing module is as defined at the end of the detailed description.

The disk memory 38 includes a plurality of memory interface modules 43-1 through 43-n and a plurality of memory devices 42-1 through 42-n. The memory devices 42-1 through 42-n include, but are not limited to, solid state memory, disk drive memory, cloud storage memory, and other non-volatile memory. For each type of memory device, a different memory interface module 43-1 through 43-n is used. For example, solid state memory uses a standard, or serial, ATA (SATA), variation, or extension thereof, as its memory interface. As another example, disk drive memory devices use a small computer system interface (SCSI), variation, or extension thereof, as its memory interface.

In an embodiment, the disk memory 38 includes a plurality of solid state memory devices and corresponding memory interface modules. In another embodiment, the disk memory 38 includes a plurality of solid state memory devices, a plurality of disk memories, and corresponding memory interface modules.

The network connection 41 includes a plurality of network interface modules 46-1 through 46-n and a plurality of network cards 47-1 through 47-n. A network card includes a wireless LAN (WLAN) device (e.g., an IEEE 802.11n or another protocol), a LAN device (e.g., Ethernet), a cellular device (e.g., CDMA), etc. The corresponding network interface modules 46-1 through 46-n include a software driver for the corresponding network card and a physical connection that couples the network card to the central processing module 39 or other component(s) of the node.

The connections between the central processing module 39, the main memory 40, the disk memory 38, and the network connection 41 may be implemented in a variety of ways. For example, the connections are made through a node controller (e.g., a local version of the computing device controller hub 36). As another example, the connections are made through the computing device controller hub 36.

Figure 11:
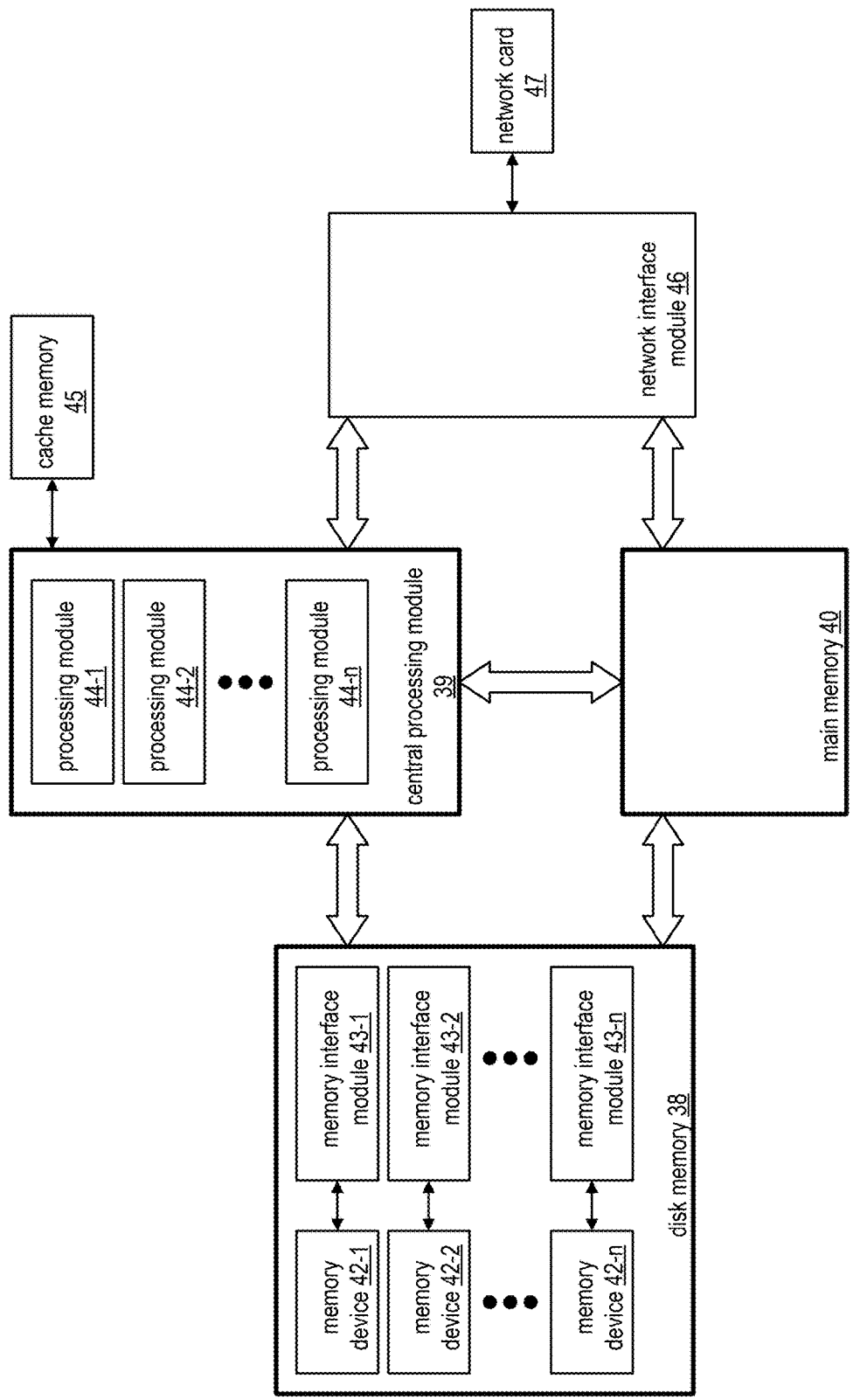
FIG. 11 is a schematic block diagram of an embodiment of a node of a computing device in accordance with the present invention.

FIG. 11 is a schematic block diagram of an embodiment of a node 37 of a computing device 18 that is similar to the node of FIG. 10, with a difference in the network connection. In this embodiment, the node 37 includes a single network interface module 46 and corresponding network card 47 configuration.

Figure 12:
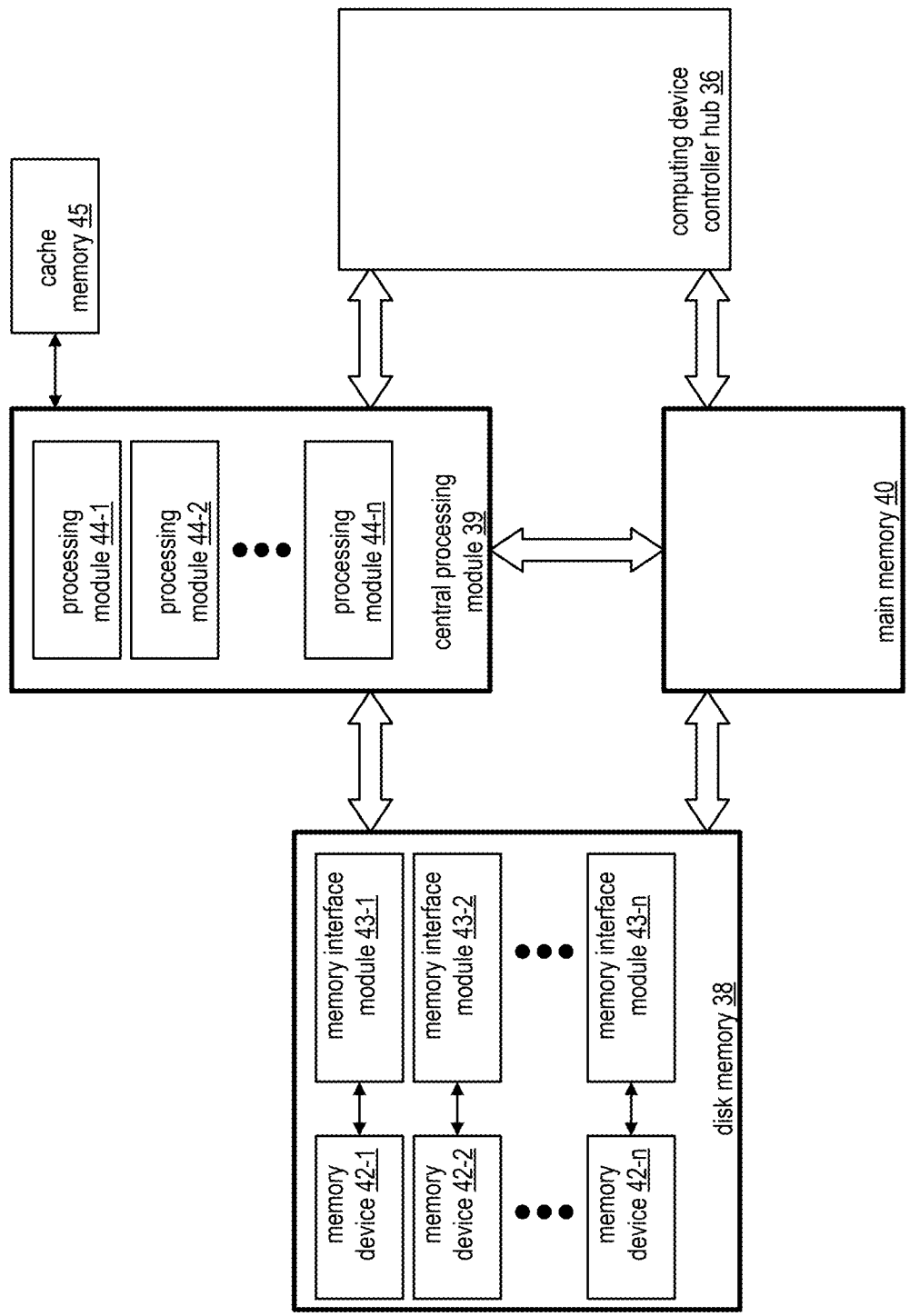
FIG. 12 is a schematic block diagram of an embodiment of a node of a computing device in accordance with the present invention.

FIG. 12 is a schematic block diagram of an embodiment of a node 37 of a computing device 18 that is similar to the node of FIG. 10, with a difference in the network connection. In this embodiment, the node 37 connects to a network connection via the computing device controller hub 36.

Figure 13:
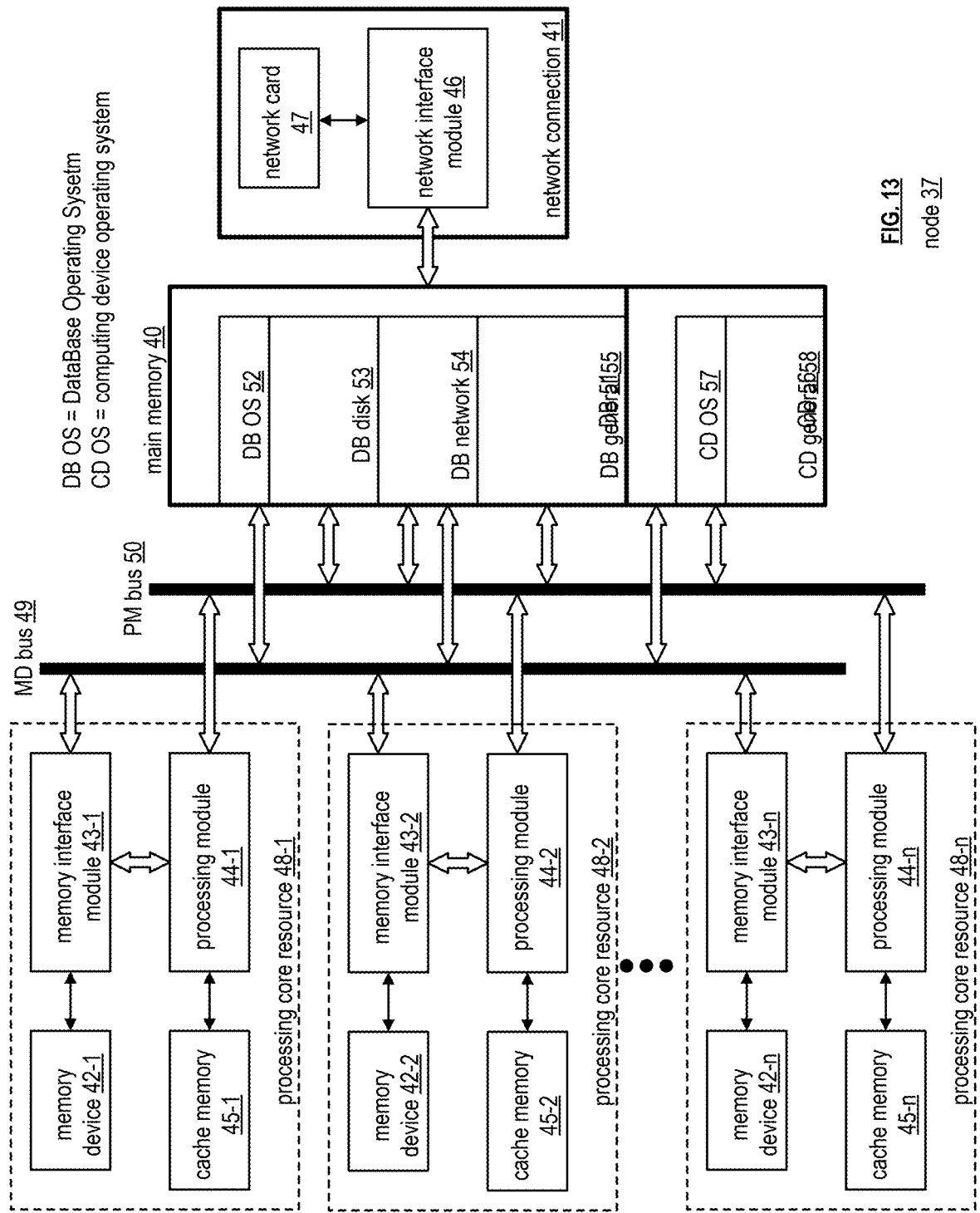
FIG. 13 is a schematic block diagram of an embodiment of a node of a computing device in accordance with the present invention.

FIG. 13 is a schematic block diagram of another embodiment of a node 37 of computing device 18 that includes processing core resources 48-1 through 48-n, a memory device (MD) bus 49, a processing module (PM) bus 50, a main memory 40 and a network connection 41. The network connection 41 includes the network card 47 and the network interface module 46 of FIG. 10. Each processing core resource includes a corresponding processing module of processing modules 44-1 through 44-n, a corresponding memory interface module of memory interface modules 43-1 through 43-n, a corresponding memory device of memory devices 42-1 through 42-n, and a corresponding cache memory of cache memories 45-1 through 45-n. In this configuration, each processing core resource can operate independently of the other processing core resources. This further supports increased parallel operation of database functions to further reduce execution time.

The main memory 40 is divided into a computing device (CD) 56 section and a database (DB) 51 section. The database section includes a database operating system (OS) area 52, a disk area 53, a network area 54, and a general area 55. The computing device section includes a computing device operating system (OS) area 57 and a general area 58.

Note that each section could include more or less allocated areas for various tasks being executed by the database system.

In general, the database OS 52 allocates main memory for database operations. Once allocated, the computing device OS 57 cannot access that portion of the main memory 40. This supports lock free and independent parallel execution of one or more operations.

Figure 14:
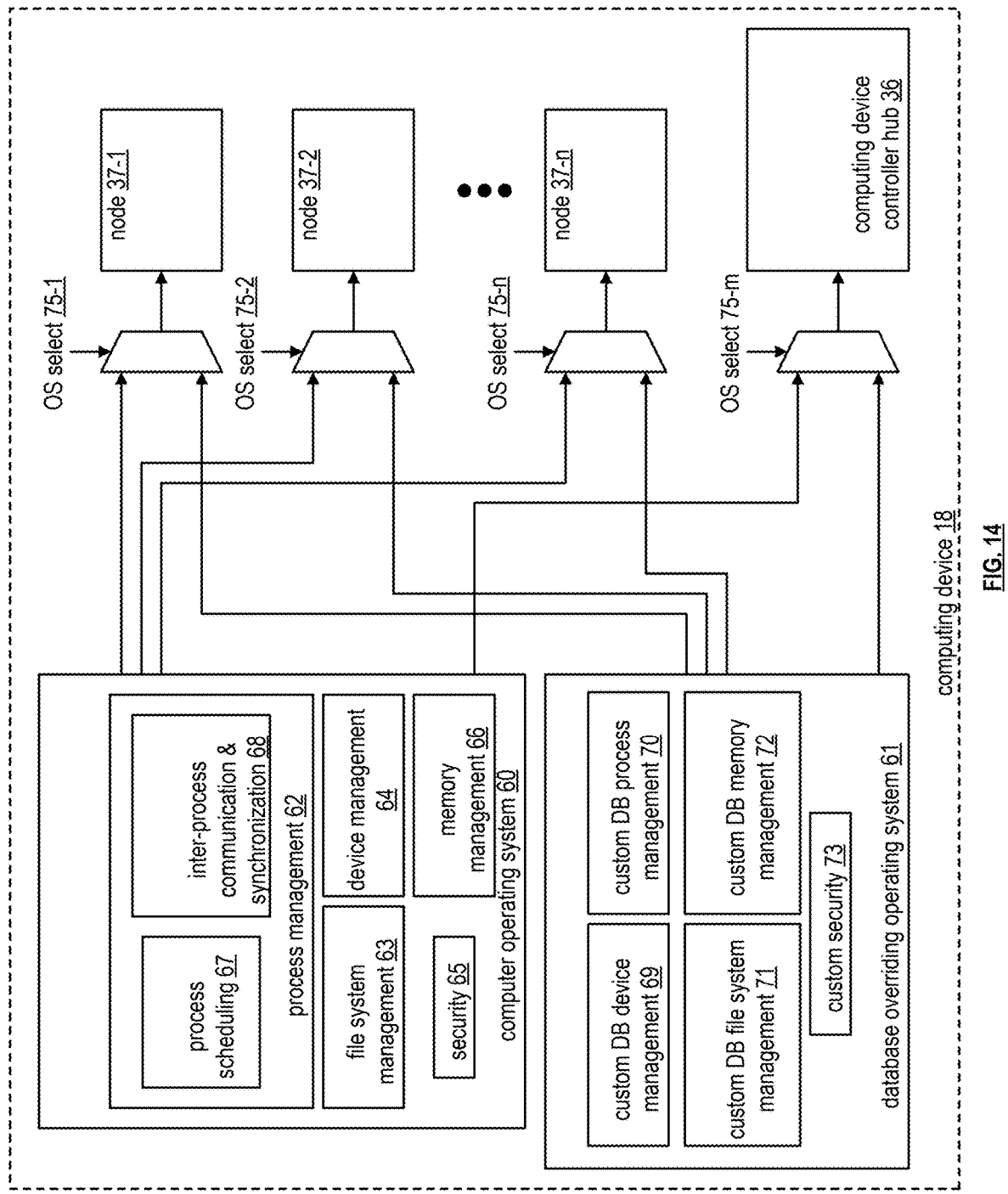
FIG. 14 is a schematic block diagram of an embodiment of operating systems of a computing device in accordance with the present invention.

FIG. 14 is a schematic block diagram of an embodiment of operating systems of a computing device 18. The computing device 18 includes a computer operating system 60 and a database overriding operating system (DB OS) 61. The computer OS 60 includes process management 62, file system management 63, device management 64, memory management 66, and security 65. The processing management 62 generally includes process scheduling 67 and inter-process communication and synchronization 68. In general, the computer OS 60 is a conventional operating system used by a variety of types of computing devices. For example, the computer operating system is a personal computer operating system, a server operating system, a tablet operating system, a cell phone operating system, etc.

The database overriding operating system (DB OS) 61 includes custom DB device management 69, custom DB process management 70 (e.g., process scheduling and/or inter-process communication & synchronization), custom DB file system management 71, custom DB memory management 72, and/or custom security 73. In general, the database overriding OS 61 provides hardware components of a node for more direct access to memory, more direct access to a network connection, improved independency, improved data storage, improved data retrieval, and/or improved data processing than the computing device OS.

In an example of operation, the database overriding OS 61 controls which operating system, or portions thereof, operate with each node and/or computing device controller hub of a computing device (e.g., via OS select 75-1 through 75-n when communicating with nodes 37-1 through 37-n and via OS select 75-m when communicating with the computing device controller hub 36). For example, device management of a node is supported by the computer operating system, while process management, memory management, and file system management are supported by the database overriding operating system. To override the computer OS, the database overriding OS provides instructions to the computer OS regarding which management tasks will be controlled by the database overriding OS. The database overriding OS also provides notification to the computer OS as to which sections of the main memory it is reserving exclusively for one or more database functions, operations, and/or tasks. One or more examples of the database overriding operating system are provided in subsequent figures.

Figure 15:
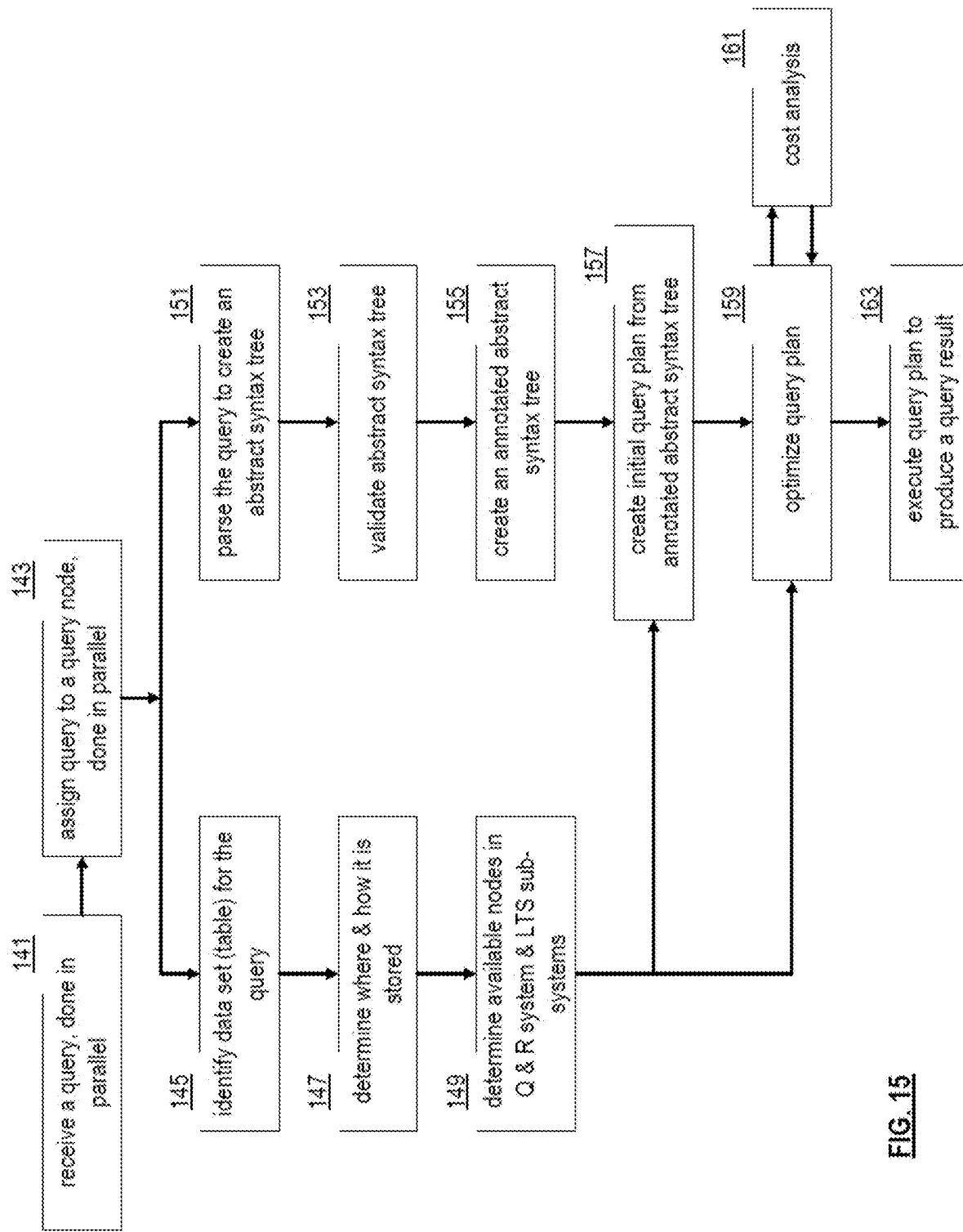
FIG. 15 is a logic diagram of an example of creating a query plan for execution within the database system in accordance with the present invention.

FIG. 15 is a logic diagram of an example of creating a query plan for execution within the database system that begins at steps 141 and 143 where one or more processing core resources of a node, one or more nodes of a computing device, and/or one or more computing devices of the parallelized query & response sub-system (hereinafter referred to as a computing node for the discussion of this figure) is assigned to receive a query. The received query is formatted in one of a variety of conventional query formats. For example, the query is formatted in accordance with Open Database Connectivity (ODBC), Java Database Connectivity (JDCB), or Spark.

The parallelized query & response sub-system is capable of receiving and processing a plurality of queries in parallel. For ease of discussion, the present method is discussed with reference to one query.

The method branches to steps 145 and 151. At step 145, the computing device identifies a table (or tables) for the received query. The method continues at step 147 where the computing device determines where and how the table(s) is/are stored. For example, the computing device determines how the table was partitioned; how each partition was divided into one or more segment groups; how many segments in a segment group; how many storage clusters are storing segment groups; how many computing devices are in a storage cluster; how many nodes per computing device; and/or how many processing core resources per node.

The method continues at step 149 where the computing device determines available nodes (and/or processing core resources) within the parallelized Q&R sub-system for processing operations of the query. In addition, the computing device determines nodes (and/or processing core resources) available for processing operations of the query. Typically, the nodes and/or processing core resources storing a relevant portion of the table will be need for processing one or more operations of the query.

At step 151, the computing device parses the received query to create an abstract syntax tree. For example, the computing device converts SQL statements of the query into nodes of a syntactic structure of source code and creates a tree structure of the nodes. A node corresponds to a construct occurring in the source code.

The method continues at step 153 where the computing device validates the abstract syntax tree. For example, the computing device verifies one or more of the SQL statements are valid, the conversion to operations of the DB instruction set are valid, the table(s) exists, the selected operations of the DB instruction set and/or the SQL statements yield viable data (e.g., will produce a result, will not cause a deadlock, etc.), etc. If not, the computing device sends an SQL exception to the source of the query.

For validated abstract syntax tree, the method continues at step 155 where the computing device generates an annotated abstract syntax tree. For example, the computing device adds column names, data types, aggregation information, correlation information, subquery information, etc. to the verified abstract system tree.

The method continues at step 157 where the computing device creates an initial query plan from the annotated abstract syntax tree. For example, the computing device selects operations from an operating instruction set of the database system to implement the abstract syntax tree. The operating instruction set of the database system (i.e., DB instruction set) includes the following operations:

Aggregation—aggregates two or more rows based on one or more values of a row and then combine (e.g., sum, average, appended, sort, etc.) into a row;

AggVectorOperationInstance—use when number of rows is known and is less than or equal to a specific value (e.g., 256), use a vector operation instead of a hash function to aggregate rows, which allows aggregation without the need for caching;

Broadcast—computing device or node sending data to other computing devices or nodes performing similar tasks, functions, and/or operations (typically for lateral data flow in the system);

Eos—"end of stream" is a placeholder to indicate no data, may also be used to indicate a function cannot be performed;

Except—set subtraction;

Extend—add a column to received data;

Gather—combine data together;

GdeLookup—"Global Dictionary Compression" lookup function for data compression;

HashJoin—join data using a hash function;

IncrementBigInt—increment one or more data values in accordance with a test protocol IncremetingInt—increment one or more data values Index—uses indexed metadata to reduce amount of data to read and/or to push operations downstream to delay reading;

IndexAgg—aggregation of indexing;

IndexDistinct—indexing of distinct row, rows, column, and/or columns;

SegmentAgg (operator instance)—segmenting of an aggregation operation to produce sub-aggregation operations;

SegmentDistinct (operator instance)—segmenting of a distinct operation to produce sub-distinct operations;

IndexCountStar—

Intersect—is a mathematical function to find data from two or more sets of data that intersect;

JobsVirtual—

Limit—limit the number of rows to be read, to be operated on, etc.;

MakeVector—convert columns into a matrix for linear algebra functions;

UnMakeVector—convert a resulting matrix back into columns;

MatrixExtend—add columns or another matrix to an existing matrix;

Offset—is an offset for data retrieval;

OrderedAgg—ordering of aggregation to allow for lower level aggregation, which allows higher level to be more efficient;

OrderedDistinct—ordering of distinct values at lower levels, which allows higher levels to be more efficient;

OrderedGather—ordering of gathering at lower levels, which allows higher levels to be more efficient;

ProductJoin—nested loop join function (e.g., join data from one or more rows and/or from one or more columns);

ProjectOut—remove a column for data of interest (e.g., want to do this as far downstream as possible);

Rename—change name of a column, (can be used to avoid column name collisions);

Reorder—reorder data of one or more rows and/or one or more columns based on an ordering preference;

Root—conduit for data flow;

Select—select columns from one or more tables;

Shuffle—sub-divide data into a plurality of data sub-divisions (typically for lateral data flow in the system);

Switch—change where to send data when a condition is met;

TableScan—retrieve all of the data of a table;

TableSlabScan (operator instance)—retrieve particular data slabs of a table;

Tee—creates a brand in operational flow when operating on redundant data;

Union—establish a set of operations;

Window—is a specific type of aggregation that captures a moving window of aggregated data (e.g., a running sum, a running average, etc.); and MultiplexerOperatorInstance for Set/ProductJoin/HashJoin/Sort/Aggregation—allows for lock free multiplexing for various types of operations.

The method continues at step 159 where the computing device optimizes the query plan using a cost analysis of step 161. The initial query plan is created to be executed by a computing device within the parallelized query & response sub-system. Optimizing the plan spreads the execution of the query across multiple layers (e.g., three or more) and to include the other sub-systems of the database system. The computing device utilizes one or more optimization transforms to optimize the initial query plan. The optimization transforms include:

AddDistinctBeforeMinMax: Adds a union distinct before an aggregation operator that only performs min/max RemoveDistinctBeforeMinMax: The opposite of addDistinctBeforeMinMax AddDistinctBetoreSemiAnti: Adds a union distinct as the right child of a join that is a semi or anti join RemoveDistinctBeforeSemiAnti: The opposite of addDistinctBeforeSemiAnti AggDistinctPushDown: Pushes down an aggregation that is only performing distinct operators (count/sum distinct) below its child AggDistinctPushUp: The opposite of AggDistinctPushDown AggregatePushDown: The same as AggDistinctPushDown but for aggregations performing non-distinct operations AggregatePushUp: The opposite of AggregatePushDown ConvertProductToHashJoin: Converts a product join with lhasCol=rhsCol filters into an equivalent hash join CreateTee: Given a certain node in the tree, searches the rest of the tree for equivalent subtrees, if one or more is found, the equivalent subtrees are deleted and a tee operator is created as the parent of the given node, which then forwards the results to the parents of those equivalent subtrees Delete Tee: The opposite of create Tee RedistributeAggDistinct: Moves a distinct aggregation to a lower level (below a gather), and adds a shuffle if needed DedistributeAggDistinct: The opposite of redistributeAggDistinct RedistributeAggregation: The same as redistributeAggDistinct but for non-distinct aggregations DedistributeAggregation: The opposite of redistributeAggregation DeletePointlessSort: Deletes a pointless sort from the tree DeletePointlessSwitch: Deletes a pointless switch from the tree (only happens if all of the extends the switch created were pushed out of the switch-union block)

DuplicateAggBelowShuffles: Given an aggregation (including aggdistinct) with a shuffle as its child, create a copy of the aggregation below the shuffle and update the original to have the correct operations RemoveAggBelowShuffles: The opposite of duplicateAggBelowShuffles DuplicateLimit: Given a limit above a gather type operator, create a copy of it below the gather type operator ExceptPushDown: Pushes an except operator down below all of its child, can only happen if they are all equivalent ExceptPushUp: The opposite of exceptPushDown ExceptUnionContract: Given an except with more than 2 children, take children [1, N−1] and make them the children of a union all, which becomes child 1 of the except ExceptUnionExpand: The opposite of exceptUnionContract ExtendPushDown ExtendPush Up IntersectPushDown: The same as exceptPushDown but for an intersect operator IntersectPushUp: The opposite of intersectPushDown JoinPushDown: Pushes a join down below its child(ren). Similar to except/intersectPushDown except with a few other cases. If one child is a join it instead swaps the joins, it also has to check that pushing below its children doesn't break the join (for example by creating name collisions or removing columns that needed to exist)

JoinPushUp: The opposite of joinPushDown, but with some more potential for optimizations. Specifically, if the parent is a select on equiJoin columns, the select can be pushed down to all children, or is the parent is a project and the join is a gdcJoin, then this deletes the join and its right subtree entirely LimitPushDown LimitPushUp MakeVectorDown MakeVectorPushUp MatrixExtendPushDown MatrixExtendPushDown MergeEquiJoins: Given two adjacent inner hash joins with no other filters, combine them into a single hash join with more children SplitEquiJoins: The opposite of mergeEquiJoins MergeExcept: Given two adjacent except operators, take the input to the lower one and make all of its children become children of the higher one MergeIntersect: The same as mergeExcept but for intersect MergeTee: Given two adjacent tee operators, take delete the higher one and make its parent additional parents on the lower one MergeUnion: The same as mergeExcept but for union MergeWindows: Combine two adjacent window operators into a single one OffsetPushDown OffsetPushUp ProjectOutPushDown ProjectOutPushUp PushAggBelowJoin: Duplicates an aggregation below a hash join, and updates the higher one accordingly PushAggAboveJoin: The opposite of pushAggBelowJoin PushAggBelowGdcJoin: Given an aggregation above a gdcJoin, this moves it below the gdcJoin if possible. Currently requires that the aggregation does not reference the gdc column at all, or only groups by it. More cases are possible PushJoinBelowSet: Given a join where one if its children is a set operator, and moves the join below the set such that there are not multiple joins as the children of the set operator PushSetBelowJoin: The opposite of pushJoinBelowSet PushLimitintoIndex: Pushes a limit operator into an index operator, this way the index knows to only output up to LIMIT rows PushLimitIntoSort: Pushes a limit into a sort operator, which causes us to run a faster limitSort algorithm in the virtual machine (e.g., node or processing core resource)

PushLimitOutOfSort: The opposite of pushLimitIntoSort

PushProjectIntoIndex: Pushes a project into an operator, which causes a not read of a column. Used when start reading all columns in plan generation PushSelectBelowGdcJoin: Given a select above a gdcJoin, where the select is filtering the compressed column, this converts the filter to a filter on the stored integer mapping of that column, and moves the select below the join. For example, where col1="hello" might be converted to where col1 Key=42

PushSelectintoHashJoin: Given a select above a hash join, where the select filters on lhsCol=rhsCol, this creates additional equi join columns on the hash join PushSelectOutOfHashJoin: The opposite of pushSelectintoHashJoin PushSelectintoProduct: The same as pushSelectintoHashJoin but for product joins PushSelectOut01Product: The opposite of pushSelectIntoProduct RenamePushDown RenamePushUp ReorderPushDown ReorderPushUp SelectOutJoinNulls: Given a join that is joining on col1, if col1 is nullable this creates a select below the join that has the filter where col1 !=NULL UnselectOutJoinNulls: The opposite of selectOutJoinNulls SelectPushDown SelectPushUp SortPushDown SortPushUp SwapJoinChildren: Swaps the order of a joins children SwitchPushDown: Given a switch operator, push it down over its child. In some cases, this causes copies of the child to become the switch's parents', and in others this causes that child to jump the entire switch union block and become the parent of the union associated with the switch SwitchPushUp: The opposite of switchPushDown, but nothing jumps because the parents of the switch are inside the switch union block already. Also requires that all parents are equivalent TeePushDown: Pushes a tee down below its child, causing that child to be copied for each parent of the tee TeePushUp: The opposite of teePushDown, requires that all parents are equivalent UnionDistinctCopyDown: Given a union distinct with gathers as its children, creates another 1 child union distinct as the children of those gathers UnionDistinctCopyUp: The opposite of unionDistinctCopyDown UnionPushDown: The same as exceptPushDown except for union, also handles the different rules that apply to union all and union distinct UnionPush1Jp: The opposite of unionPushDown, also handles the case where this is the opposite of switchPushDown because the union has an associated switch, so some operators will jump the entire switch union block UnmakeVectorPushDown UnmakeVectorPushUp WindowPushDown WindowPushUp post-optimization options Combining adjacent selects into super Selects Combining adjacent limits Combining adjacent offsets Converting distinct aggregations into a non-distinct aggregation with a union distinct as its child Duplicating union distincts around shuffles, this only happens if there is a union distinct on 1 side of a shuffle, but not both Replacing index type operators with an eos operator we if can determine that the filters (if any) on the index are always false (possible by comparing possible values of data types)

Evaluating alternate indexes besides the primary index

Building orderedAggregations and orderedDistincts

Getting rid of pointless renames

Pushing sorts down to level 3 if possible

Creating indexCountStar operators if possible

Fixing out of order indexAggs, this makes the grouping key order match the primary index order when possible Tee'ing leaf operators, this combines as many equivalent leaf operators as possible to reduce IO Deleting pointless reorders Note that the Down and push Up transforms are used frequently, and mean to take the given operator and swap its position in the tree with its child (or parent) for most operators. Further note that not all of these transforms are legal in all possible cases, and they only get applied if they are legal.

The method continues at step 163 where the query plan is executed to produce a query result. The execution of the query plan is discussed in greater detail in subsequent figures.

Figure 16:
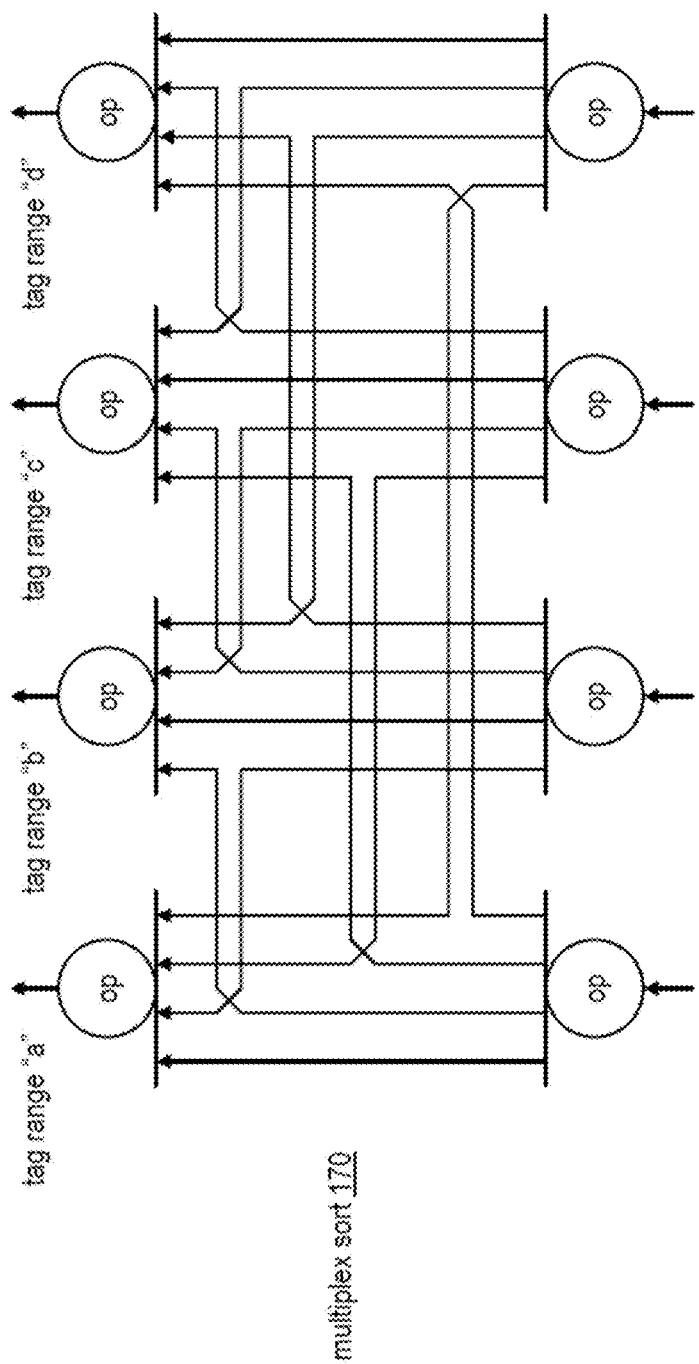
FIG. 16 is a schematic block diagram of an example of a multiplexed multi-thread sort operation in accordance with the present invention.

FIG. 16 is a schematic block diagram of an example of a multiplexed multi-thread sort operation 170. In general, a multiplexed multi-thread sort operation allows operations in threads downstream to send operation results (e.g., data, intermediate data, an operand, a result of a mathematic function, a result of a logic function, etc.) to a specific upstream operation in one of the threads.

For example, four threads of operations include a multiplex sort. The downstream operations in the threads (e.g., the operations on the bottom of the figure) execution an operation to produce a result or data value. For each result or data value that falls in range "a" is sent upstream to the operation in the far-left thread. For each result or data value that falls in range "b" is sent upstream to the operation in the second from the left thread. For each result or data value that falls in range "c" is sent upstream to the operation in the second from the right thread. For each result or data value that falls in range "d" is sent upstream to the operation in the far-right thread.

The operations use a bucket sort operation when the results or data values are of a defined set of values (e.g., integers, dates, time, etc.) to identify the appropriate upstream operation. When the results or data values are not of defined set of values (e.g., names, floating point data, etc.), the operations use a normal sort function to identify the appropriate upstream operation.

As a specific example, assume that range "a" is from negative infinity to −1 million; range "b" is from −999,999 to −1; range "c" is from 0 to 999,999; and range "d" is from +1 million to infinity. As such, the downstream operations would use one or more normal sort functions for ranges "a" and "d" and uses one or more bucket sort functions for ranges "b" and "c".

Figure 17:
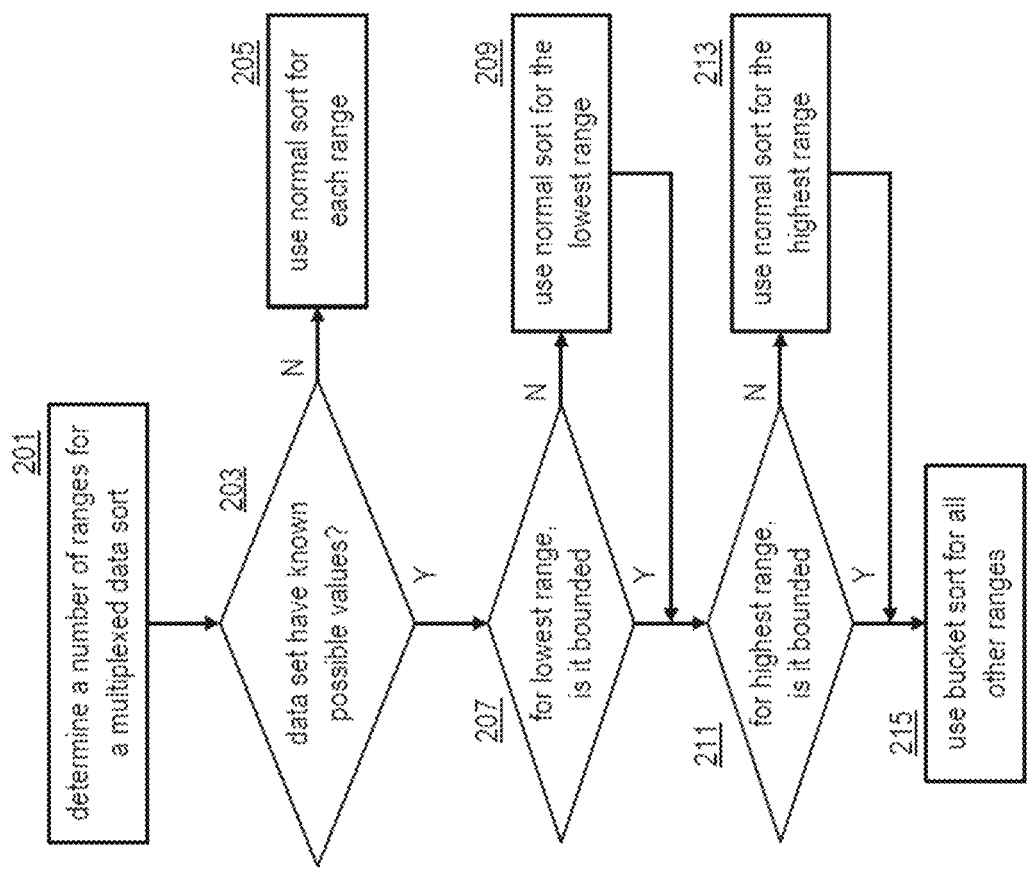
FIG. 17 is a logic diagram of an example of a method for executing a multiplexed multi-thread sort operation in accordance with the present invention.

FIG. 17 is a logic diagram of an example of a method for executing a multiplexed multi-thread sort operation that begins at step 201 where a processing core resource (executing one or more threads) determines a number of ranges for a multiplexed multi-thread sort operation. The number is two or more. The method continues at step 203 where the processing core resource determines whether the data set of results or data values are of a known set of possible values (e.g., integers, dates, time, etc.). If not, the method continues at step 205 where the processing core resource uses one or more normal sort functions to sort the data into the various ranges of the multiplexed multi-thread sort operation.

If, at step 203, the data set has at least some known possible values, the method continues at step 207 where the processing core resource determines whether the lowest range is bounded. For example, when there is a specific lowest value (e.g., −1 million), then the lowest range is bounded. As another example, when there is not a specific lowest value (e.g.,—infinity), the lowest range is not bounded. When the lowest range is not bounded, the method continues at step 209 where the processing core resource uses a normal sort function for the lowest range. Whether the lowest range is bounded or not, the method continues at step 211 where the processing core resource determines whether the highest range is bounded. If not, the method continues at step 213 where the processing core resources uses a normal sort function for the highest range. Whether or not the highest range is bounded, the method continues at step 215 where the processing core resource uses a bucket sort function for all other ranges that have not yet been flagged for a normal sort function.

Figure 18:
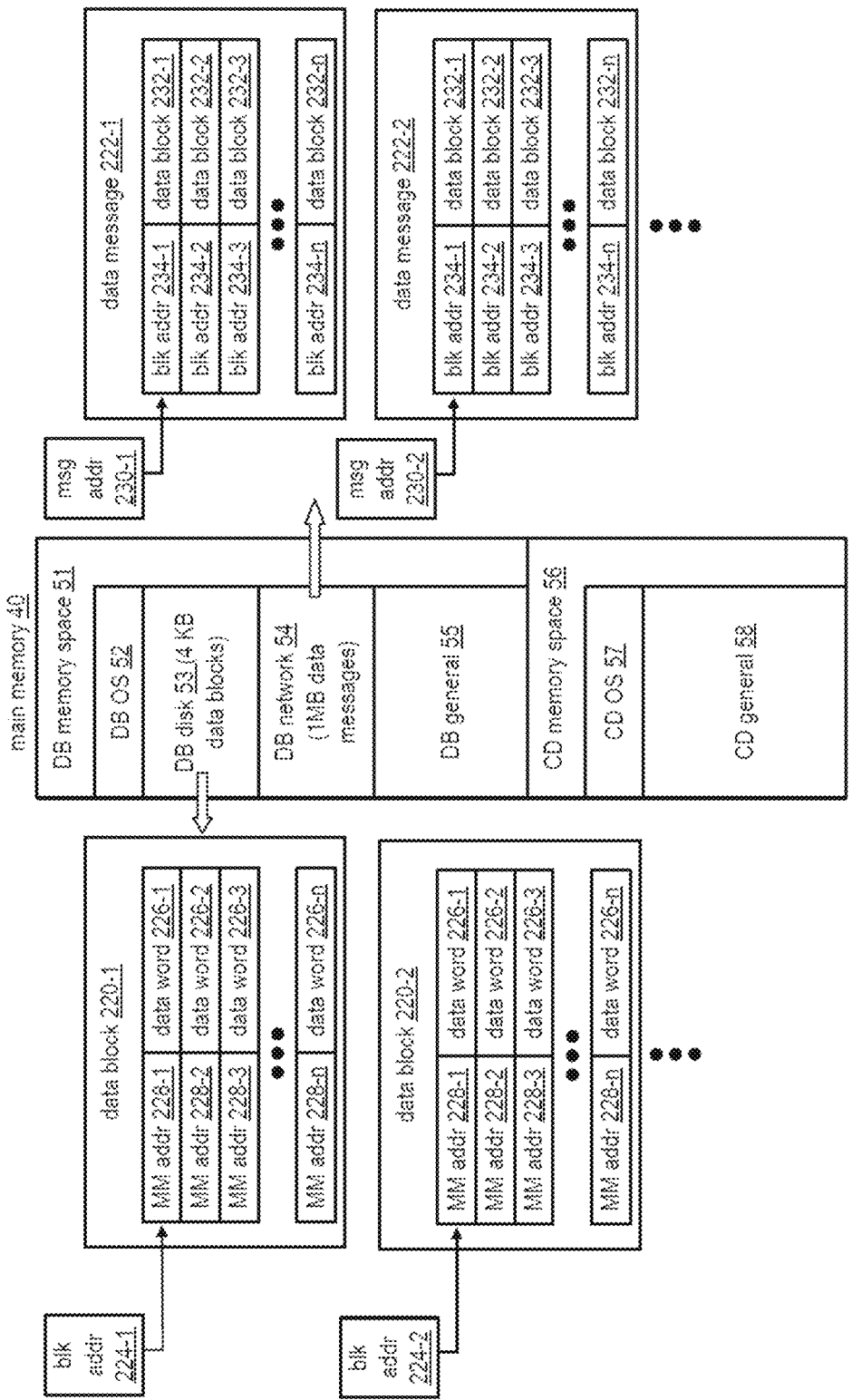
FIG. 18 is a schematic block diagram of an example of data blocks and data messages for direct memory access of a processing core resource and/or of a network connection in accordance with the present invention.

FIG. 18 is a schematic block diagram of an example of a plurality of data blocks 220-1, 220-2 etc. and a plurality of data messages 222-1, 222-2 etc. of the main memory 40 of FIG. 13 to enable direct memory access of a processing core resource and/or of a network connection. Data blocks include corresponding block addresses 224-1, 224-2 etc. that are logical block addresses for system's operations and corresponds to physical addresses for data accesses. Each data block includes a plurality of data words 226-1 through 226-n, which range in size from 1 Byte to 32 Bytes or more. Each data word has an associated main memory (MM) address of MM addresses 228-1 through 228-n that, from a logical address perspective, are sequential offsets from the block address. For example, if each data word is the 32 Bytes and the data block is 4 K Bytes (actually 4,096 Bytes), there are 128 data words in a data block. The block address corresponds to the address of the first data word in the block. The other addresses in the block are the next sequential data word addresses corresponding to the next data words.

Accordingly, when a data block is written into the disk memory section 53 of the database (DB) memory space 51, it is done so as a data block with each data word having a sequential address. This facilitates direct memory access of the main memory 40 by the memory devices via the respective memory interfaces.

Data messages includes a corresponding message address of message addresses 230-1, 230-2 etc. and a plurality of data blocks 232-1 through 232-n. Each data block has an associated block address of block addresses 234-1 through 234-n. The block addresses are logical addressees and are sequential within a data message. The message address corresponds to the first data block address and the other data block addresses are a logical offset from the first. For example, a data message is 1 M Byte in size and includes 256 4 Kbyte data blocks. This message data structure within the DB network section 54 of the main memory 40 facilitates the network connection to have direct memory access.

Figure 19:
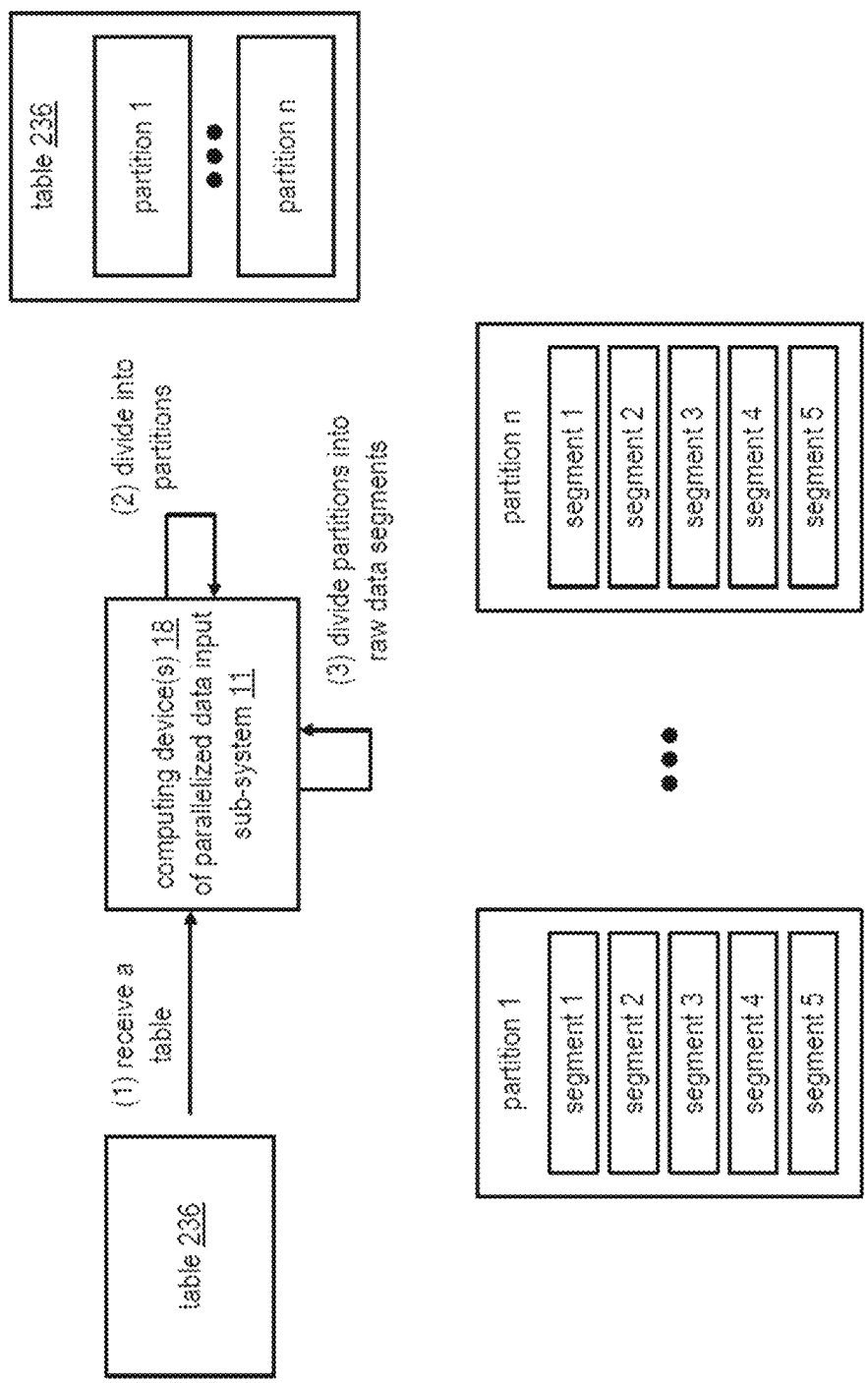
FIGS. 19-25 are schematic block diagrams of an example of processing a received data and distributed the processed table for storage in the database system in accordance with the present invention.

FIGS. 19-25 are schematic block diagrams of an example of processing a received table 236 of data for storage in the database system 10. FIG. 19 illustrates one or more computing devices 18 of the parallelized data input sub-system 11 receiving the table 236. The computing device(s) divides the table 236 into partitions (e.g., partitions 1-2). The computing device(s) divides each partition into one or more segment groups, with each segment group including a plurality of segments (e.g., 1-5).

Figure 20:
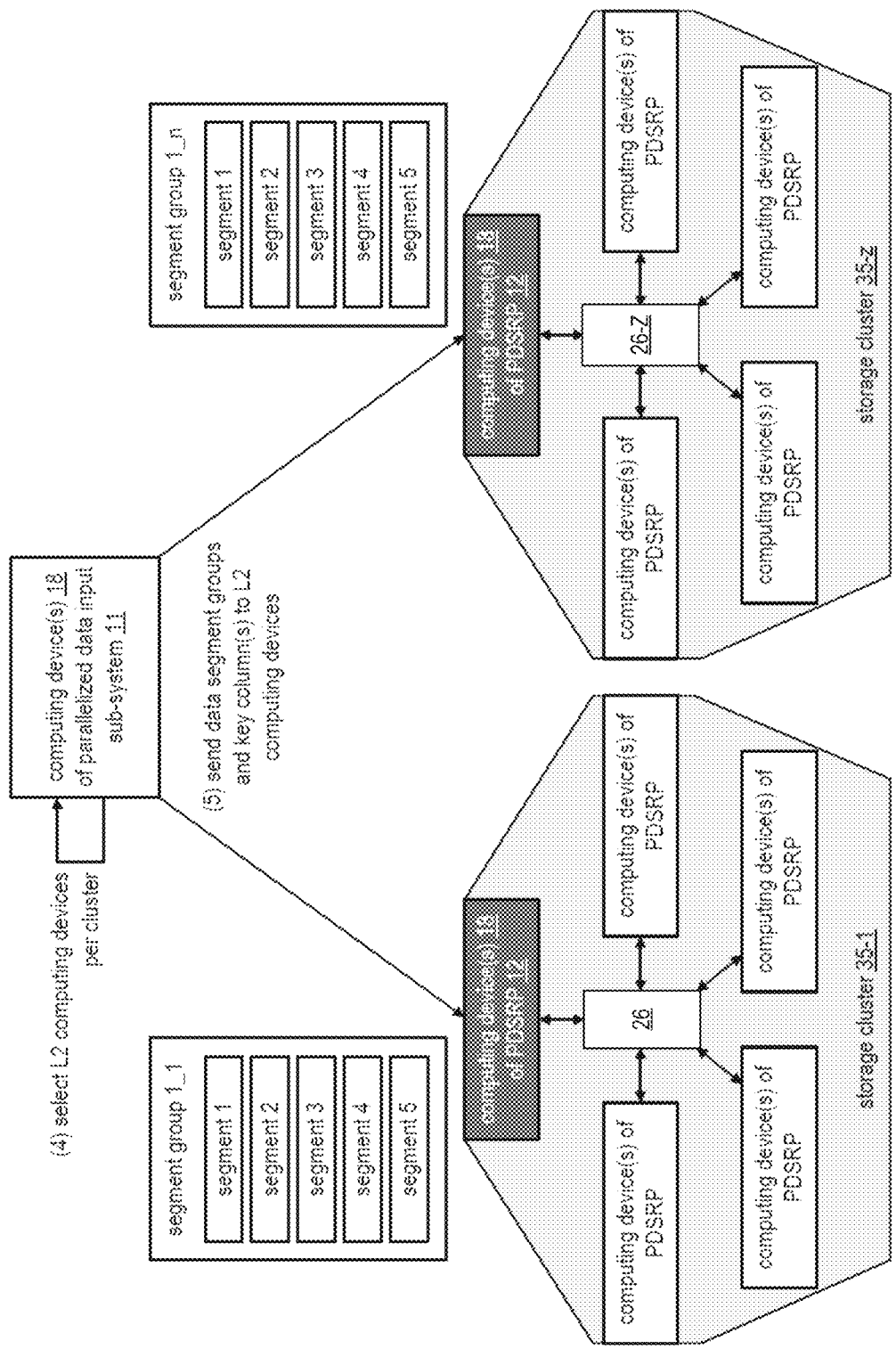

FIG. 20 illustrates the computing device(s) 18 of the parallelized data input sub-system system 11 selecting a level 2 (L2) computing device 18 from each storage cluster of storage clusters 35-1 through 35-z to which a segment group is being sent. For example, the darker gray shaded box of storage cluster 35-1 is the L2 computing device 18 for this cluster and the darker gray shaded box of storage cluster 35-z is the L2 computing device 18 for storage cluster 35-z.

The selection of the L2 computing devices 18 can be done in a variety of ways. For example, the L2 computing device is selected based on a pseudo random selection process. As another example, the L2 computing device is selected in a round-robin manner. Having selected the L2 computing devices for each storage cluster, the computing device 18 of the parallelized data input sub-system 11 sends a corresponding segment group of segment groups 1_1 through 1_n to each L2 computing device.

Figure 21:
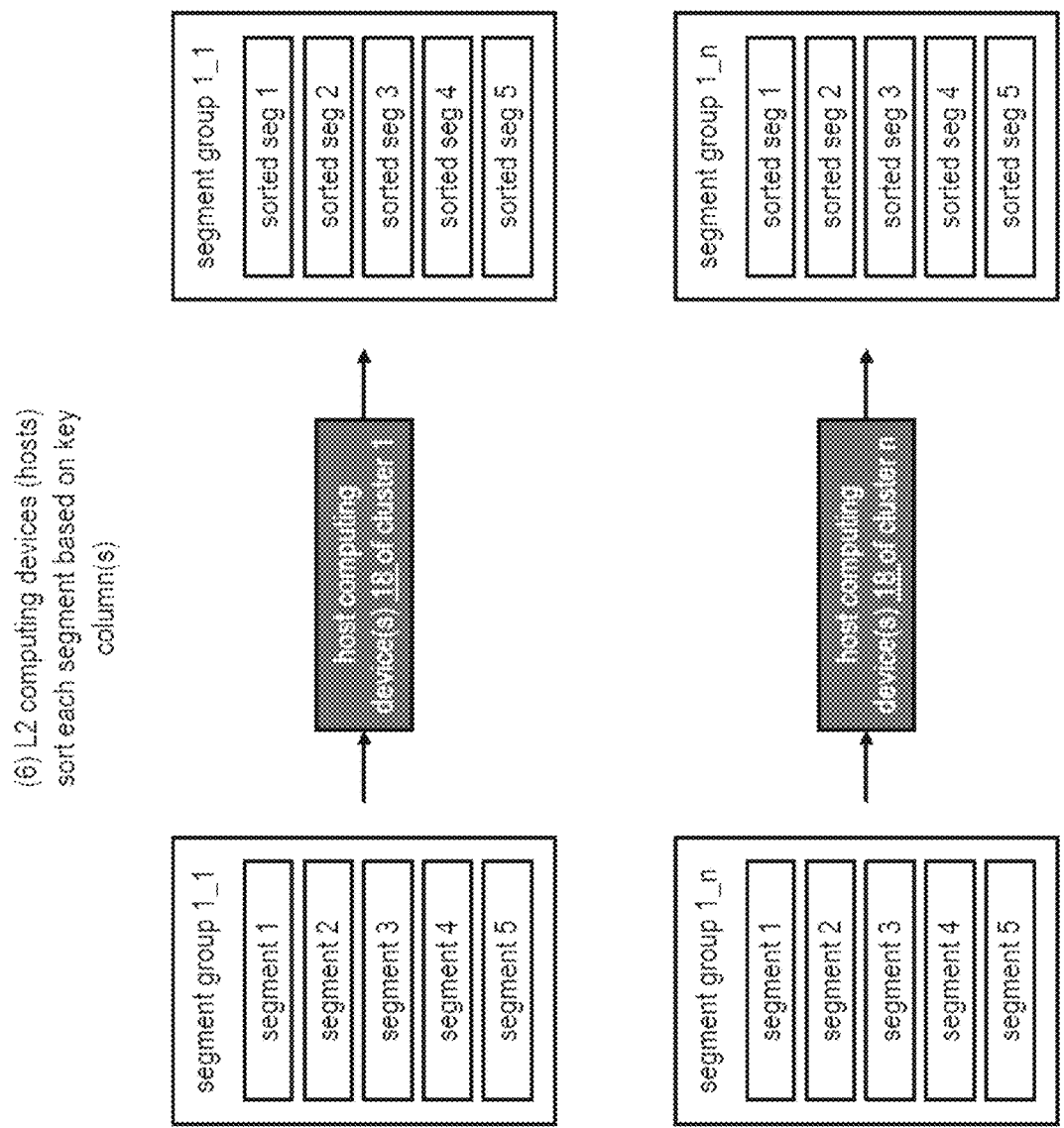

FIG. 21 illustrates each of the L2 computing devices 18 sorting each segment of its segment group to produce a segment group of sorted segments. The sorting is based on one or more key columns.

Figure 22:
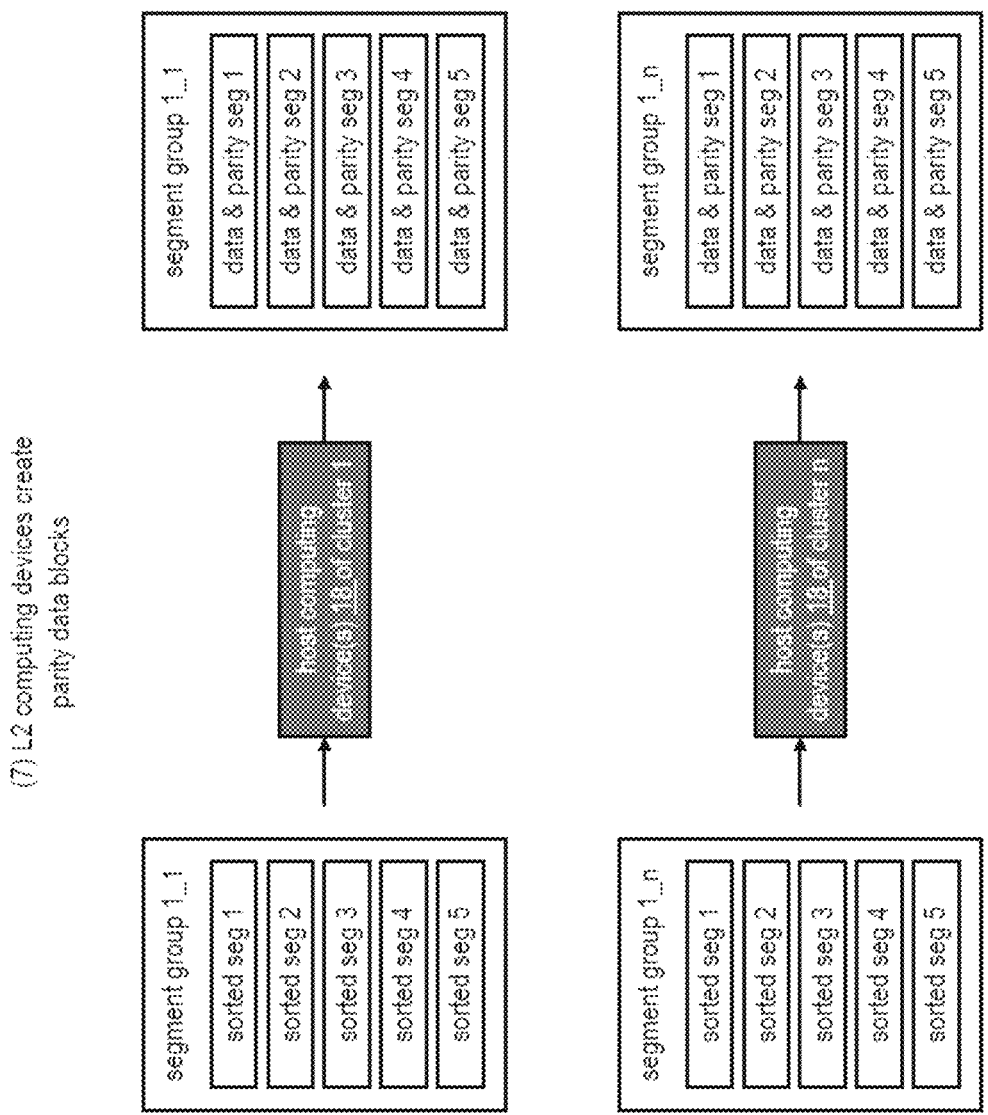

FIG. 22 illustrates the L2 computing devices 18 creating data and parity segments from the sorted segments. In particular, the L2 computing devices execute a redundancy function to produce parity data from the raw data of the sorted segments.

Figure 23:
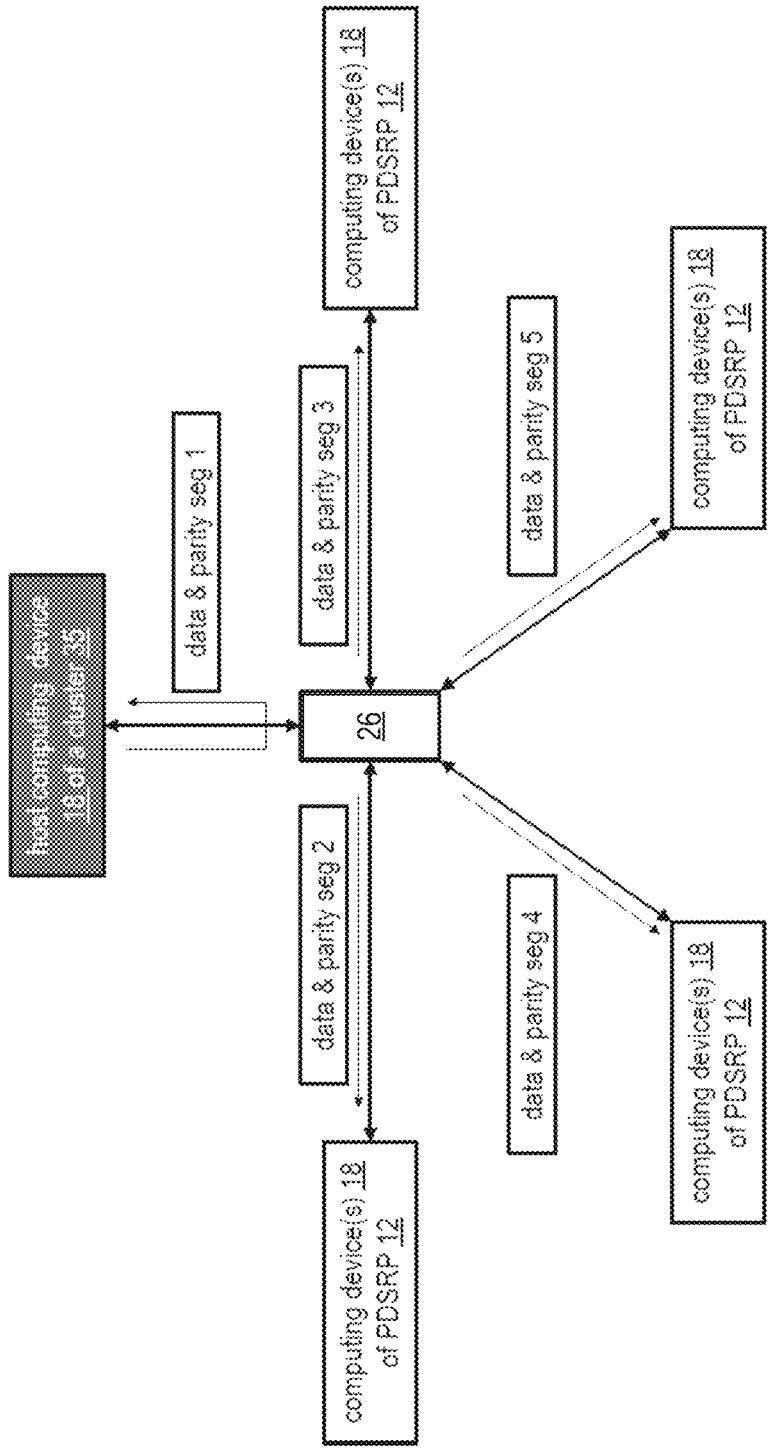

FIG. 23 illustrates a L2 computing device 18 within a storage cluster 35 distributing, via local communication resources 26, the data & parity segments to the other computing devices 18 within the storage cluster 35, including itself. Note that the data & parity segments also include a manifest section for metadata, one or more index sections for the key column(s), and may further include a statistics section.

Figure 24:
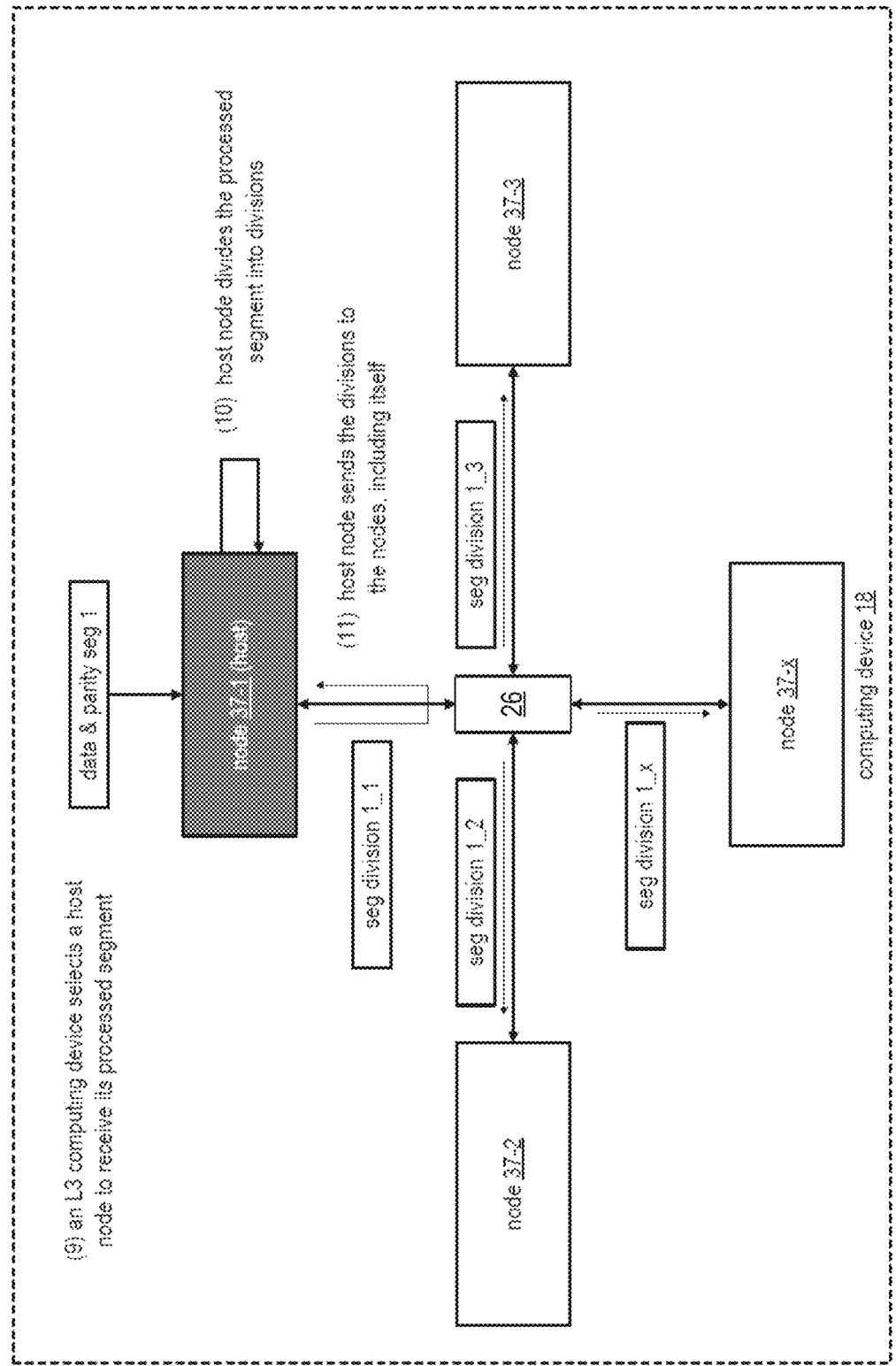

FIG. 24 illustrates a computing device 18 within a cluster (at a third level L3) selecting a host node 37-1 to initially process the received data & parity section. The host node (gray shaded box) divides the received segment into a plurality of segment divisions; one segment division per node within the computing device. The host node sends, via local communication resources 26, the segment divisions to the respective nodes 37-2, 37-3, 37-x etc. of the L3 computing device 18.

Figure 25:
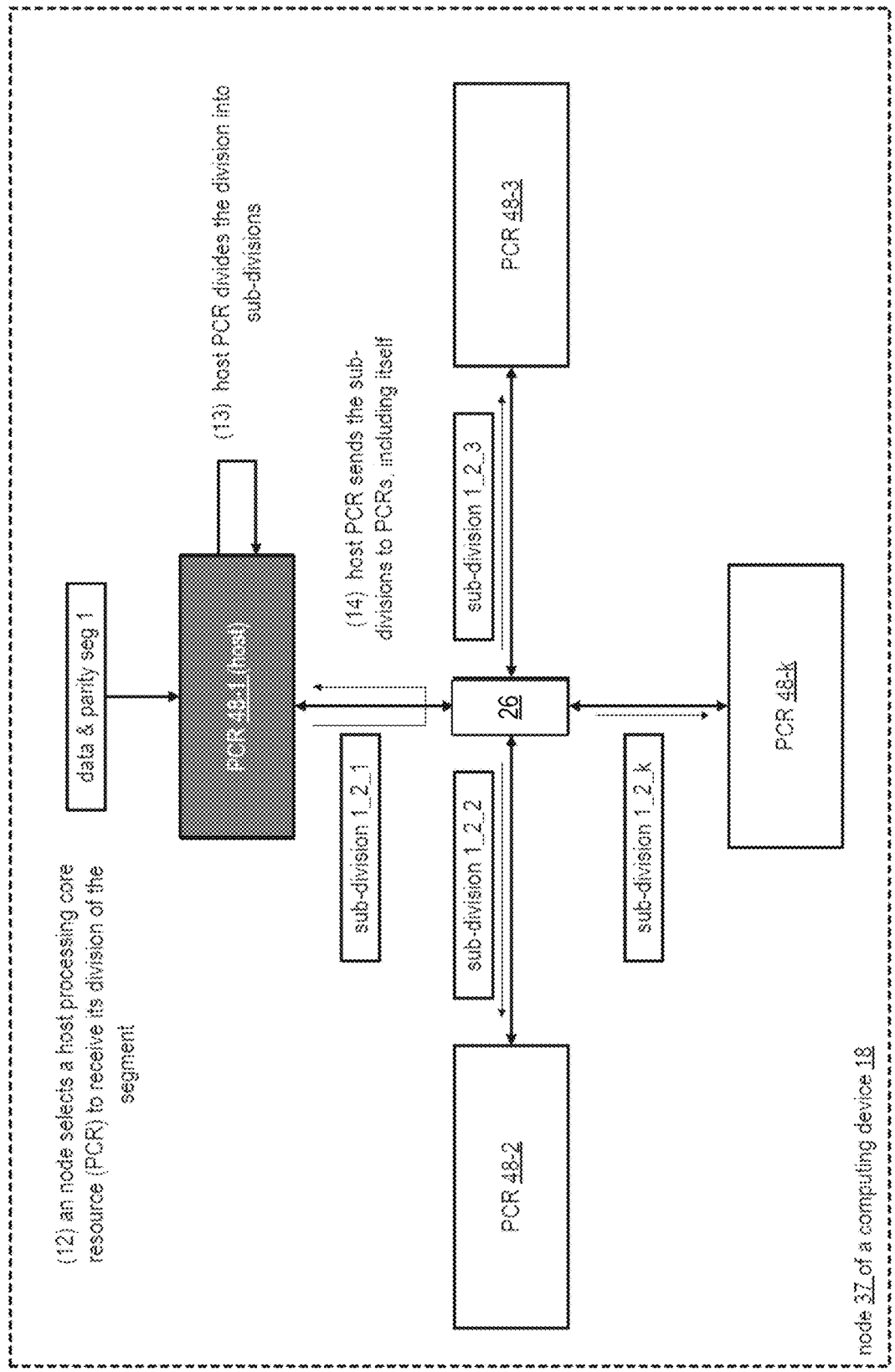

FIG. 25 illustrates a node 37 of an L3 computing device 18 selecting a host processing core resource (PCR) 48-1 to process the received segment division. The host PCR 48-1 further divides the segment division into a plurality of segment sub-divisions; one for each PCR of PCRs 48-2, 48-3, 48-k, etc. in the node 37. The host PCR 48-1 then sends, via local communication resources 26, the segment sub-divisions to the PCRs, including itself.

Figure 26:
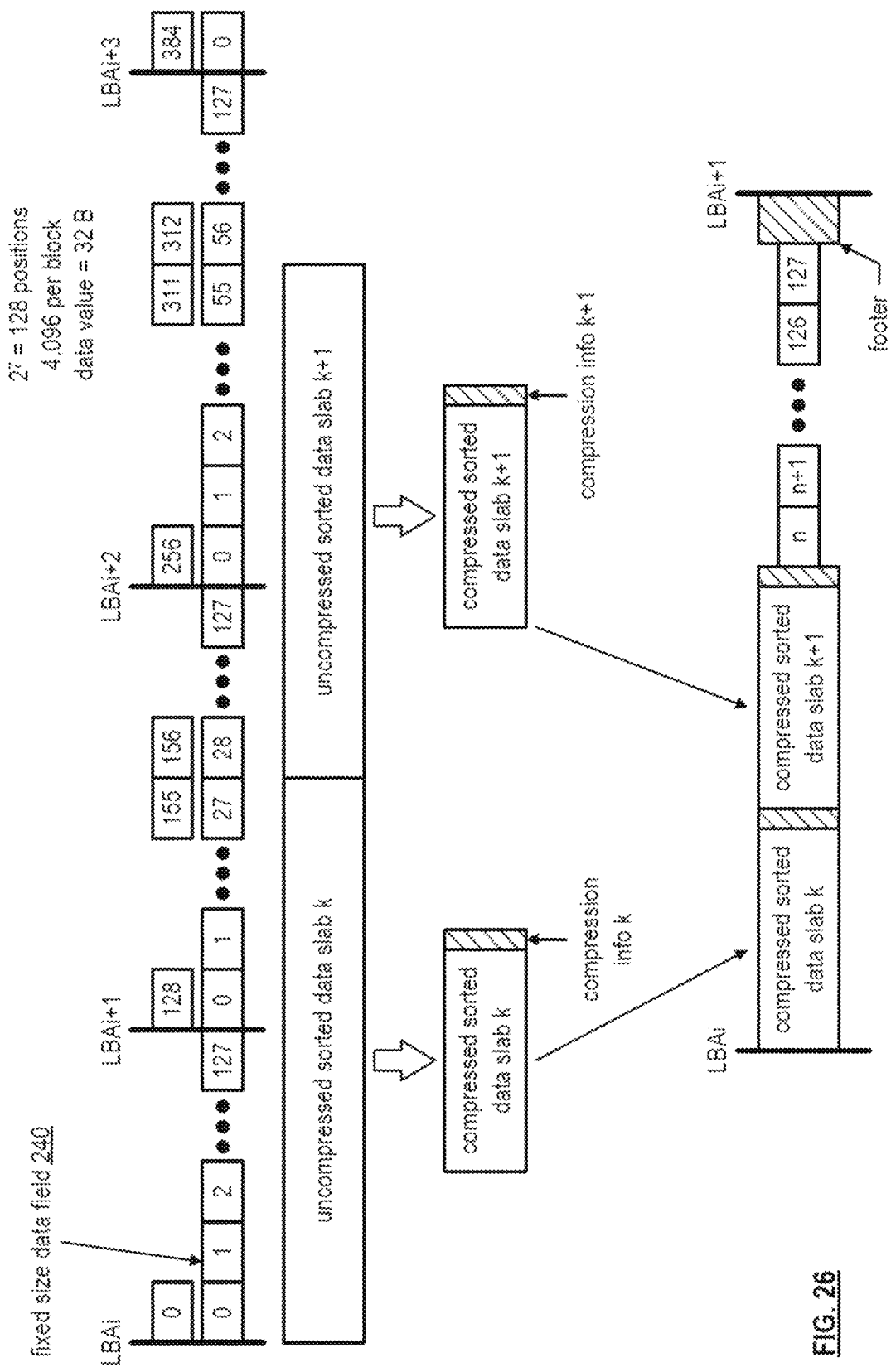
FIG. 26 is a schematic block diagram of an example of compressing data in accordance with the present invention.

FIG. 26 is a schematic block diagram of an example of compressing data.

Conventional data compression can disturb the structure of raw data, which negatively affects database processing for the data by, for example eliminating the address for the data. FIG. 26 illustrates a form of compression to allow for more efficient processing in a massively parallel database system. Uncompressed data slab k (and data slab k+1) is a column of a table that has been sorted based on a key. In an example each data slab includes 156 32-byte data values, however data slabs can be of any reasonable size and include any reasonable number of data values. In an example, logical data block addresses (LBAs) are assigned. Each uncompressed sorted data slab could be each of a portion of a logical block address (LBA), aligned with a LBA, or in an example a given uncompressed sorted data slab could span a plurality of LBAs. In an example an uncompressed sorted data slab could span thousands of LBAs.

Each LBA includes a number of fixed size data fields 240 positioned within the LBA. In an example LBAi through LBA+x includes $2^7$(128) positions and each block of data includes 4,096 positions. In practice, the number of positions, data value, and data fields can be any reasonable value. In the example of FIG. 26 uncompressed data slabs k and k+1 are compressed and compression information can be included at the front or rear of to create compressed sorted data slabs k and k+1 along with compressed sorted data slabs n and n+1 etc. to produce 128 positions of compressed data for LBAi. A footer at the end of LBAi can include at least one of a) raw uncompressed data; 2) null elimination and run length encoding (RLE) information; 3) RLE alone; 4) identity of data included within the block; 5) a count of compressed blocks stored in block; 6) the size of a compressed data slab; 7) size of compression information; and 8) a number of entries in compression information. The footer can be of varying size and can include information indicating why it is a footer. Additionally, the footer may consume one or more of the data value fields (e.g., field 127, 126, etc.) instead of being appended to the 128 position LBA.

Figure 27:
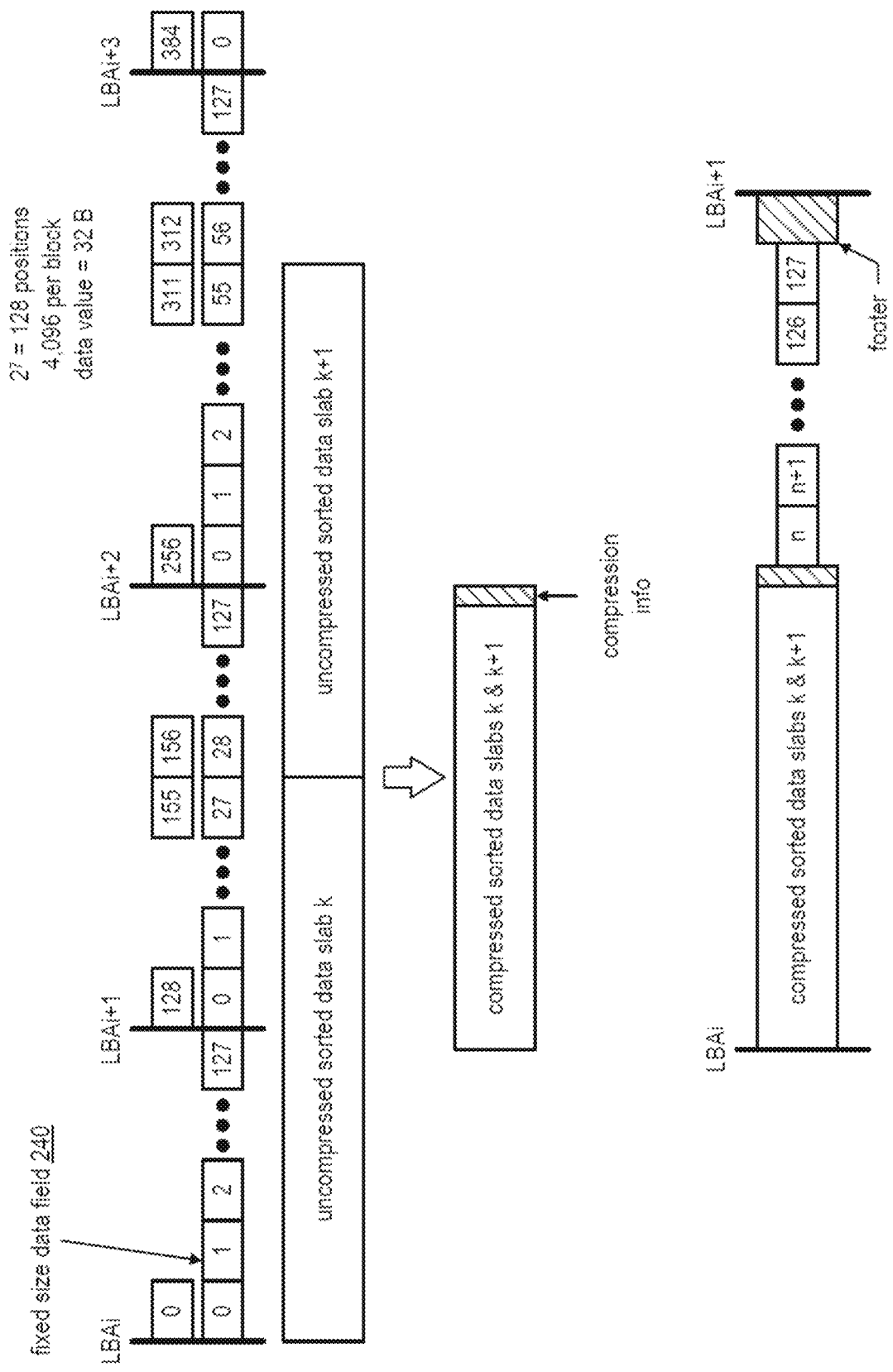
FIG. 27 is a schematic block diagram of an example of compressing data in accordance with the present invention.

FIG. 27 is a schematic block diagram of an example of compressing data where two (or more) uncompressed sorted data slabs are compressed into one compressed data "section". Each LBA includes a number of fixed size data fields 240 positioned within the LBA. In the example the compressed sorted data slabs k and k+1 occupy one data section with other compressed data in the remaining 128 positions of LBAi.

Figures 28, 29:
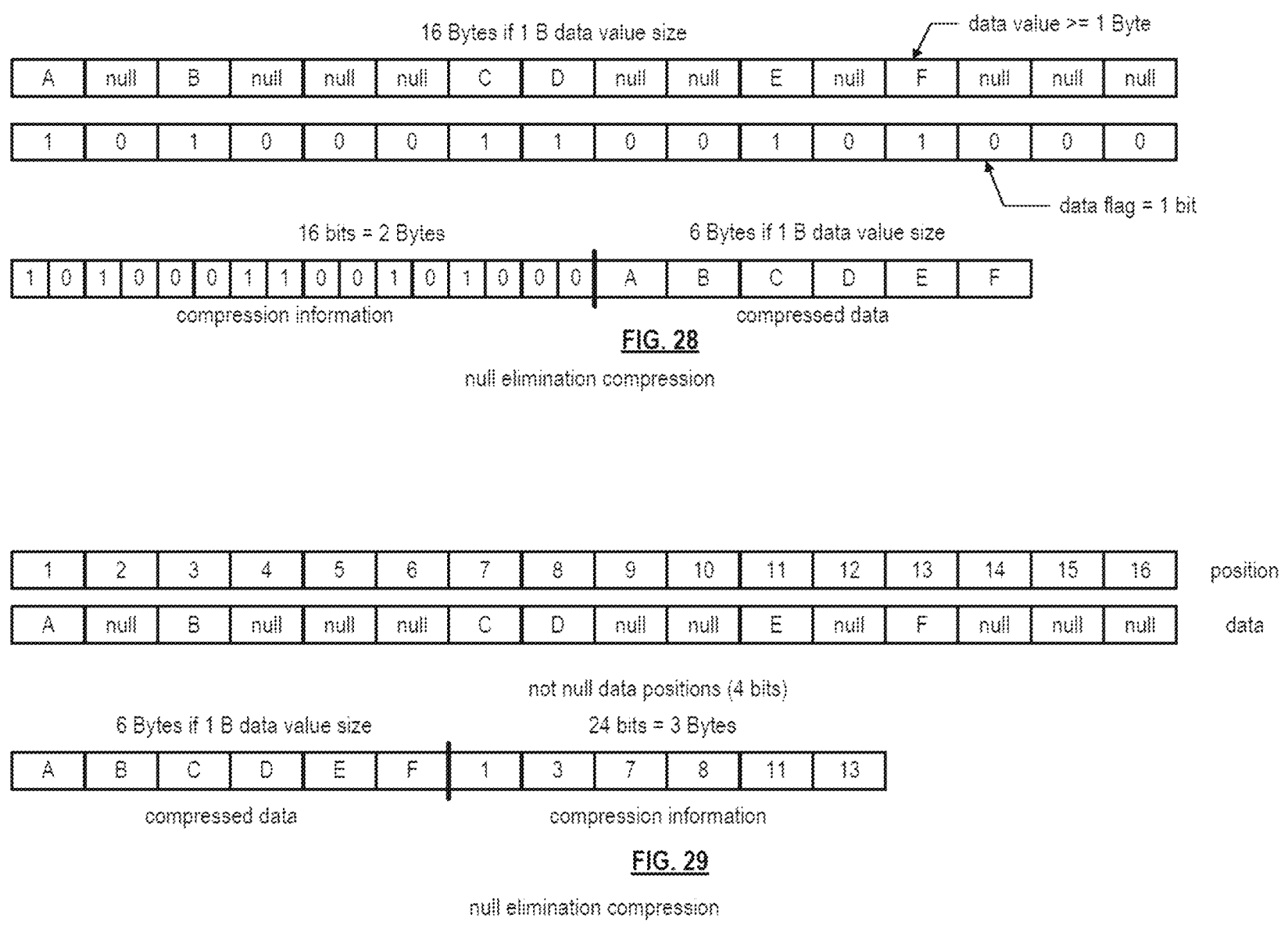

FIG. 28 is a schematic block diagram of an example of compressing data using null elimination. In the example a series of data values includes null values interspersed between not-null data values. In an example each data value is one (1) byte of a 16 byte section of data that includes data values A-F, along with 10 null values. In an example each not-null data value is assigned a data flag of "1" and each null value is assigned a "0" data flag. Compression information in this example is used to eliminate null values by including only not-null data values in the compressed data.

FIG. 29 is a schematic block diagram of another example of compressing data using null elimination. In an example data values in positions 1-16 are compressed to the data containing data values A-F, and the compression information is appended, where the compression indicates which positions of the 16-byte data sections include not-null data. Accordingly, decompression may be achieved by providing null values in each data value of the 16-byte data section with the indicated not-null data values in indicated positions (without including the "0" data flag of FIG. 29).

FIG. 30 is a schematic block diagram of an example of a compression information field for data compression using null elimination that includes a not-null position field of 8 bits. In an example a bit (in this case the most significant bit [MSB]) indicates whether a data value is to be repeated or not repeated, and the 7 least significant bits (LSBs) are used to indicate the position of the data containing not-null data values. The not-null position field can be more or less than 8 bits in practice.

FIG. 31 is a schematic block diagram of an example of compressing data using a combination of null elimination and run length encoding. In an example, a data section includes not-null data values A-E with not-null data values B and E being repeated. Compressed data includes only the non-repeat not-null data values as compressed data. A plurality of 8-bit data fields are appended to the compressed data to indicate where the not-null data values and repeated not-null data values are included in the 16-byte data section. For example, the first 8-bit not-null data field indicates data value "A" in data value position 1, whereas the second 8-bit data field indicates that data value "B" is located in data value position 3. The third 8-bit data field indicates that the data value is not-null and repeats the not-null data value from position 3 and so forth. In practice the not-null position field can be more or less than 8-bits as is practical.

Figure 32:
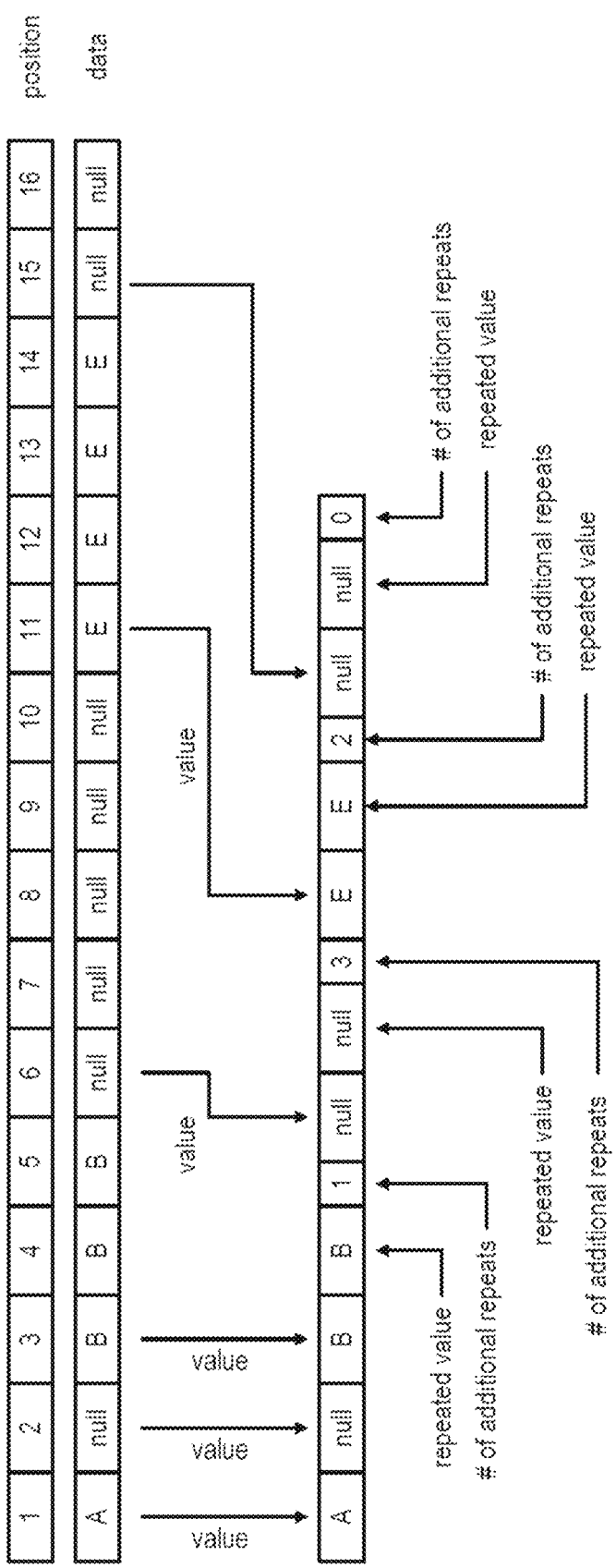
FIG. 32 is a schematic block diagram of an example of compressing data using run length encoding in accordance with the present invention.

FIG. 32 is a schematic block diagram of an example of compressing data using run length encoding. In an example, a 16-byte data section includes not-null data values A, B and E with not-null data values B and E being repeated two and three times, respectively in the 16-byte data section. In the example the 16-byte data section is converted to a 14-byte section by indicating any repeats of not-null data values beyond 2. For example, when not-null data value "B" is repeated 2 times the B data valued is repeated once and then instead of a third repeat the data value indicates only that the preceding data value is a repeated value. Likewise, when a null data value is repeated 4 times the null value and it its first repeat is included along with an indication of "2" indicating that there are two additional repeats of the null data value. When a data value (null or not-null) is repeated only once a "0" is indicated.

Figures 33, 34:
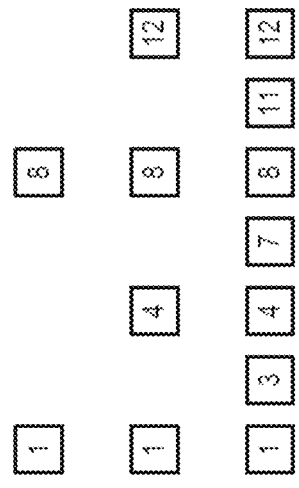
FIG. 33 is a schematic block diagram of another example of compressing data using a combination of null elimination and run length encoding in accordance with the present invention.
FIG. 34 is a schematic block diagram of an example of search list of the compression information of FIG. 33 in accordance with the present invention.

FIG. 33 is a schematic block diagram of another example of compressing data using a combination of null elimination and run length encoding. In an example, not-null data values A-E are located in a 16-byte data section, with not-null data values B and being repeated once each. The 5 distinct values A-E are compressed, along with compression information for each not-null field (including repeats). In the example the position field can indicate the a "0", indicating "no repeat" or "1", indicating repeat of the previous not-null data value in the MSB. In an example the 8-bit data position field (or any practical field size) specifies "0 000 0001" in the first data position field, indicating that the first field of compressed data is in position 1 of the 16-byte field and is "no repeat". The second data position field specifies "0 000 0011", indicating that indicating that the second field of compressed data is in position 3 of the 16-byte field and is likewise "no repeat". The third data position field specifies "1 000 0100" indicating with the "1" in the MSB that the data value is a repeat of the previous value.

FIG. 34 is a schematic block diagram of an example of using a search list of the compression information of FIG. 33 to retrieve a specific data value. In this example, each compressed sorted data slab of a plurality of compressed sorted data slabs includes "X" number of data values and the type of compression used (for example null, RLE, null and RLE, etc.) is known, along with the total number of compressed data values, and the size of each compressed data slab. Additionally, the compression information is in a sorted order and the number of [entries] is included in the compression information. Once the known compressed data slab size known along with the data value field size the number of fields used in compressed data slab is calculated. Compression information can then be searched to determine the compressed data position desired. Non-null fields include not-null data values 1, 3, 4, 7, 8, 11 and 12, arranged in the stacked "search list" shown in FIG. 105. The stacked search list may then be used to locate the specific location for the desired data value. If the data value is not in the list, it must be a null value. The stacked search list can be stored in the main memory for subsequent searches.

Figure 35:
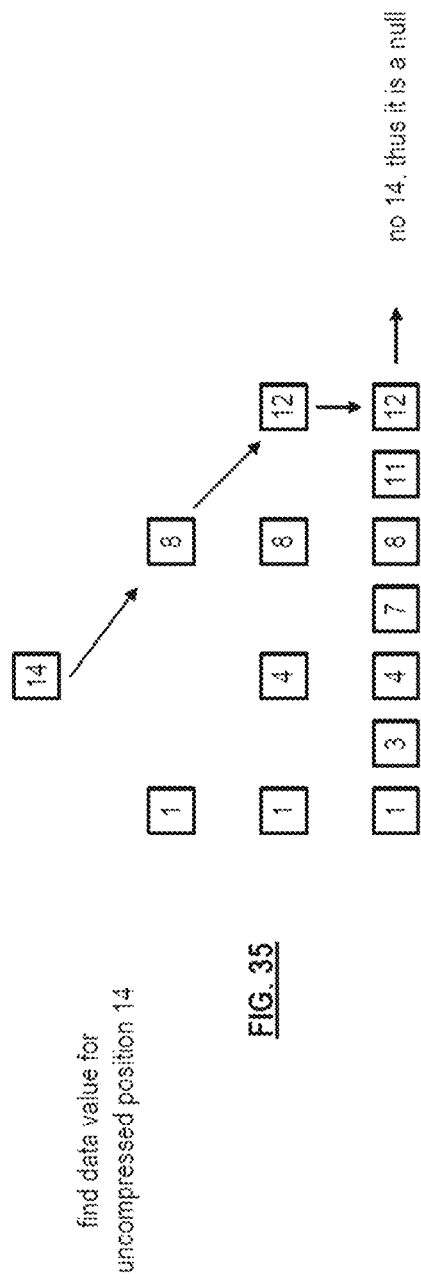
FIG. 35 is a schematic block diagram of an example of searching the search list of FIG. 34 to find a particular compressed data value in accordance with the present invention.

FIG. 35 is a schematic block diagram of an example of searching the search list of FIG. 34 to find a particular compressed data value. In the example the stacked search list is being used to locate the data value for uncompressed position 14. The stacked search list includes only data values 1 and 8 in the top level, which is less than data value 14; the next level of the stacked search list includes only the repeated 1 and 8 data values and additional repeat data values 4 and 12. Since position 14 is after position 12, the stacked search list need only be examined at the base level after position 12, and since there is not data value after position 12, the position 14 data value is a null data value.

Figure 36:
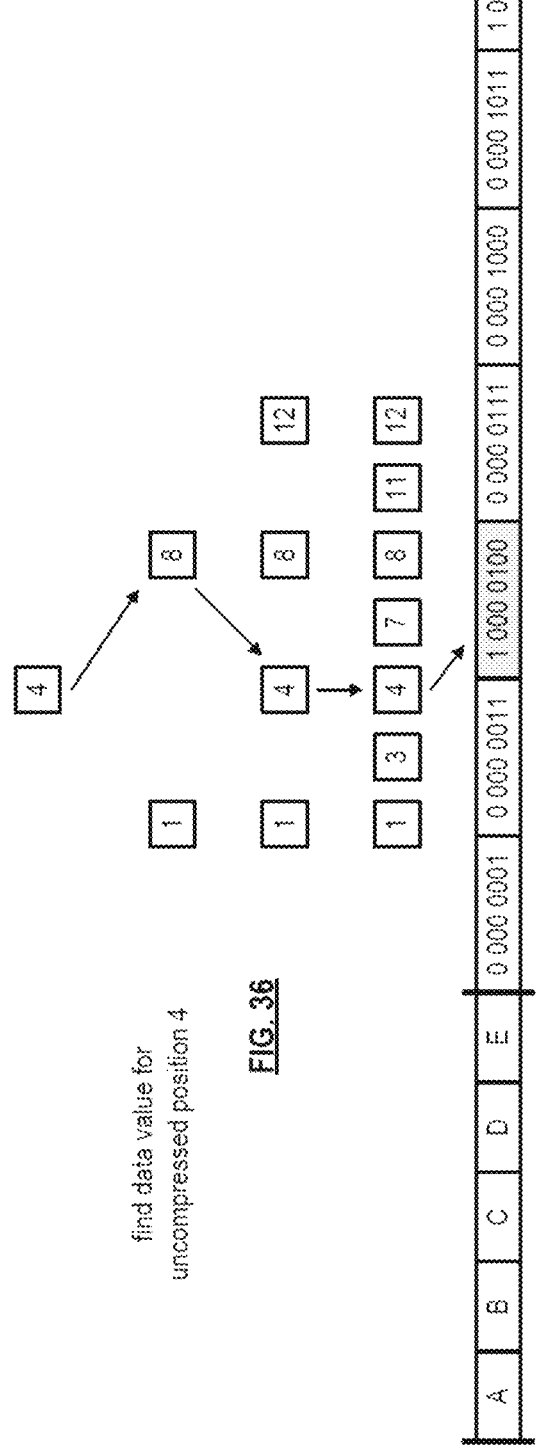
FIG. 36 is a schematic block diagram of another example of searching the search list of FIG. 34 to find a particular compressed data value in accordance with the present invention.

FIG. 36 is a schematic block diagram of another example of searching the search list of FIG. 34 to find a particular compressed data value. In the example the stacked search list is being used to locate the data value for uncompressed position 4. The stacked search list includes only data values 1 and 8 in the top level, accordingly only values between 1 and 8 need to be searched further. The next level of the stacked search list includes the repeated 1 and 8 data values along with the data value 4. Since data value 4 is included as a repeat of data value 4 in the stacked search list, evaluating the data position field for 4 indicates that the data value for position 4 is a repeat of the data value in position 3, which is the second field in the compressed data, thus the data value for uncompressed data value is the decompressed data value "B".

Figure 37:
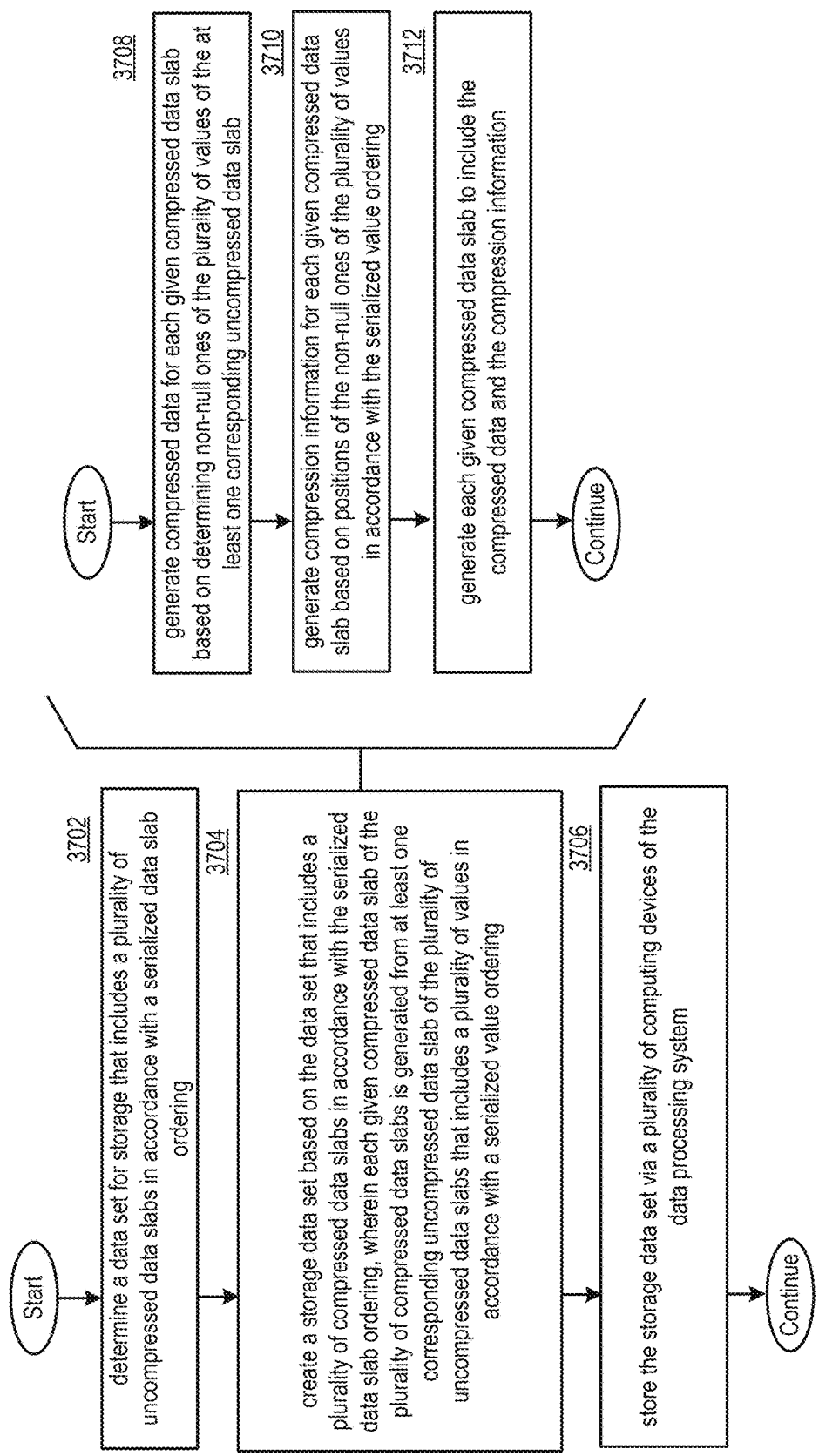
FIG. 37 is a logic diagram of an example method for execution in accordance with various embodiments.

FIG. 37 is a flow diagram illustrating a method for execution by a computing entity, such as at least one computing device 18, at least one node 37 within a computing device 18, and/or at least one processing core resource 48 of a node. In some cases, multiple processing core resources 48, multiple nodes 37, and/or multiple computing devices 18 can each execute some or all of the steps of FIG. 37 in conjunction with execution of their respective operations. The method of FIG. 37 can include performance of some or all steps illustrated in the examples of FIGS. 26-36 by one or more processing core resources, nodes, and/or computing devices. Some or all steps of FIG. 37 can be performed by any processing module and/or computing entity of the database system 10.

Step 3702 includes determining a data set for storage that includes a plurality of uncompressed data slabs in accordance with a serialized data slab ordering. For example, each of the plurality of uncompressed data slabs are implemented via some or all features and/or functionality of uncompressed sorted data slab k and/or uncompressed sorted data slab k+1 of FIGS. 26 and/or 27.

In various embodiments, determining the data set for storage based on receiving the data set for storage. For example, the data set is received for storage based on implementing the parallelized data input sub-system 11. In various embodiments, a plurality of processing core resources, nodes, and/or computing devices of the parallelized data input sub-system 11 receive the data set for storage in parallel, for example, independently and/or without coordination.

Step 3704 includes creating a storage data set based on the data set that includes a plurality of compressed data slabs in accordance with the serialized data slab ordering. Each compressed data slab of the plurality of compressed data slabs can generated from at least one corresponding uncompressed data slab of the plurality of uncompressed data slabs that includes a plurality of values in accordance with a serialized value ordering. For example, the storage data set includes the plurality of compressed data slabs in a same ordering as the corresponding uncompressed data slabs. In various embodiments, the method further includes determining each of the plurality of uncompressed data slabs based on performing a sorting of a column of a table of the data set utilizing a key, where the serialized value ordering is based on the sorting. Each of the plurality of compressed data slabs can be implemented via some or all features and/or functionality of compressed sorted data slab k and/or compressed sorted data slab k+1 of FIGS. 26 and/or 27.

Step 3704 can be performed to create the storage data set based on implementing the parallelized data store, retrieve, &/or process sub-system 12. In various embodiments, the storage data set is created in in parallel by a plurality of processing core resources of the computing entity, for example, where different processing core resources create different ones of the plurality of compressed data slabs independently and/or without coordination. For example, a plurality of processing core resources, nodes, and/or computing devices of the parallelized data store, retrieve, &/or process sub-system 12 create the storage data set in parallel.

In various embodiments, generating each given compressed data slab from at least one corresponding uncompressed data slab in performing step 3704 can include performing step 3708, 3710, and/or 3712 for each given compressed data slab. Step 3708 includes generating compressed data for each given compressed data slab based on determining non-null ones of the plurality of values of the at least one corresponding uncompressed data slab. For example, the compressed data is generated and/or structured based via some or all features and/or functionality of the example compressed data of FIG. 28, 29, 31, 32, or 33.

Step 3710 includes generating compression information for each given compressed data slab based on positions of the non-null ones of the plurality of values in accordance with the serialized value ordering. For example, the compression data is generated and/or structured based via some or all features and/or functionality of the example compression information of FIG. 28, 29, 31, 32, or 33.

Step 3712 includes generating each given compressed data slab to include the compressed data and the compression information. For example, each compressed data slab includes both the compressed data and the compression information as illustrated in FIGS. 26 and/or 27. In various embodiments, generating each given compressed data slab is in accordance with at least one of: a null elimination technique, or a run length encoding technique.

Step 3706 includes storing the storage data set via a plurality of computing devices of the data processing system. For example, some or all of the plurality of computing devices are distributed across different physical locations. Step 3706 can be performed to store the storage data set based on implementing the parallelized data store, retrieve, &/or process sub-system 12. In various embodiments, the plurality of computing devices are parallelized computing devices that store the storage data set in parallel, for example, independently and/or without coordination.

In various embodiments, the plurality of compressed data slabs of the storage data set includes a plurality of sets of compressed data slabs. In various embodiments, each set of compressed data slabs of the plurality of sets of compressed data slabs is assigned to a corresponding logical block address of a plurality of logical block addresses. In various embodiments, compressed data slabs of the each set of compressed data slabs are serially arranged in a plurality of serialized portions of the corresponding logical block address in accordance with the serialized data slab ordering.

For example, the serialized data slab ordering indicates uncompressed data slab k is directly before uncompressed data slab k+1, and the compressed data slab k is directly before compressed data slab k+1 in the corresponding logical block address, for example, by implementing some or all features and/or functionality of as illustrated in FIG. 26.

In various embodiments, creating the storage data set based on the data further includes generating footer data for the each set of compressed data slabs of the plurality of sets of compressed data slabs. In various embodiments, the corresponding logical block address includes the footer data for the each set of compressed data slabs. In various embodiments, the footer data indicates at least one of: raw uncompressed data; run length encoding information; null elimination information; identity of data included within a corresponding block; a count of compressed blocks; a size of a compressed data slab; a size of the compression information; a number of entries in the compression information; or other information. In various embodiments, the footer data is appended to the end of the each set of compressed data slabs in the logical block address.

In various embodiments, all logical block addresses of the plurality of logical block addresses include a same number of fixed sized data fields. For example, the fixed sized data fields are implemented as fixed sized data fields 240 of FIGS. 26 and/or 27. In some embodiments, the logical block addresses of the plurality of logical block addresses include 128 of the fixed sized data fields, or a different number of fixed size data fields. In some embodiments, each set of compressed data slabs each occupy exactly one of the fixed sized data fields of the corresponding logical block address.

In various embodiments, the at least one corresponding uncompressed data slab includes at least two data slabs. In various embodiments, generating each given compressed data slab includes concatenating the compressed data with the compression information. In various embodiments, the compression information of each given compressed data slab is based on positions of the non-null ones of the plurality of values for the at least two data slabs. For example, a single data slab included in one of the fixed sized data fields is generated based on two consecutive uncompressed data slabs, such as uncompressed data slabs k and k+1, where common compression information is generated for the compressed data of uncompressed data slabs k and k+1 and concatenated to the corresponding compressed data of uncompressed data slabs k and k+1, for example, by implementing some or all features and/or functionality of the compressed data slab of FIG. 27.

In various embodiments, generating each compressed data slab of the plurality of compressed data slabs is further based on identifying a set of repeated ones of the plurality of values based on having values that repeat a consecutively prior one of the plurality of values more than a threshold number of consecutive times. For example, the threshold number of consecutive times is one, two, or a different number. The compression data of each given compressed data slab can be generated to include a subset of the plurality of values based on removing the set of repeated ones of the plurality of values. In various embodiments, the compression information of each given compressed data slab is generated to indicate a number of additional repeats for a second subset of the subset of the plurality of values that are consecutively repeated more than the threshold number of consecutive times. each number of additional repeats is appended of the compression information is appended after corresponding values in the second subset. For example, the compression information and corresponding compressed data is implemented via some or all features and/or functionality of FIG. 32.

In various embodiments, the compressed data of each given compressed data slab is generated to contain only values for the non-null ones of the plurality of values in accordance with the serialized value ordering. In various embodiments, a number of non-null ones of the plurality of values included in compressed data of at least one of the plurality of compressed data slabs is strictly less than a total number of values of the plurality of values in the at least one corresponding uncompressed data slab of the at least one of the plurality of compressed data slabs based on the at least one corresponding uncompressed data slab including at least one null value, and/or based on this null value being removed from the set of values included in the compressed data for the each compressed data slab. For example, a null elimination technique is utilized to remove the null values. The compressed data can be generated, for example, based on some or all features and/or functionality of FIG. 28, 29, or 31.

In various embodiments, generating the compression information of each given compressed data slab includes generating a plurality of one bit data flags in accordance with the serialized value ordering, each indicating whether a corresponding one of the plurality of values is null or non-null. In various embodiments, the compression information includes one of: a concatenation of the plurality of one bit data flags in accordance with the serialized value ordering; or a run length encoding of the plurality of one bit data flags. For example, the compressed data and corresponding compression information is generated via some or all features and/or functionality of FIG. 28.

In various embodiments, generating the compression information of each given compressed data slab includes identifying a plurality of index values identifying positions of the non-null ones of the plurality of values in the at least one corresponding uncompressed data slab in accordance with the serialized value ordering, where the compression information indicates the plurality of index values. In various embodiments, the compression information includes a concatenation of the plurality of index values in accordance with the serialized value ordering. For example, the compressed data and corresponding compression information is generated via some or all features and/or functionality of FIG. 29.

In various embodiments, generating each compressed data slab of the plurality of compressed data slabs is further based on identifying a set of repeated ones of the non-null ones of the plurality of values based on having values that repeat a consecutively prior one of the non-null ones of the plurality of values in accordance with the serialized value ordering. In various embodiments, the compression data of each given compressed data slab is generated based on removing the set of repeated ones of the non-null ones of the plurality of values. For example, the compressed data is implemented via some or all features and/or functionality of FIG. 31.

In various embodiments, generating the compression information of each given compressed data slab includes generating a plurality of not-null data position fields each having a same fixed number of bits. In various embodiments, each of the plurality of not-null data position fields is generated for a corresponding one of the non-null ones of the plurality of values based on: setting one of the same fixed number of bits to indicate whether the corresponding one of the non-null ones of the plurality of values is one of the set of repeated ones of the non-null ones of the plurality of values; and/or setting remaining ones of the same number of fixed bits to indicate a corresponding one of the plurality of index values for the corresponding one of the non-null ones of the plurality of values. In various embodiments, the compression information includes a concatenation of the plurality of not-null data position fields in accordance with the serialized value ordering. For example, the not-null data position fields are implemented via some or all features and/or functionality of the not null data position fields of FIG. 30 and/or FIG. 31.

In various embodiments, one of the plurality of not-null data position fields having the one of the same fixed number of bits indicating corresponding one of the non-null ones of the plurality of values is one of the set of repeated ones of the non-null ones of the plurality of values has its remaining ones of the same number of fixed bits indicating the one of the plurality of index values that is non-consecutive with another one of the plurality of index values indicated in the remaining ones of the same number of fixed bits of another one of the plurality of not-null data position fields immediately prior to the one of the plurality of not-null data position fields based on a corresponding repeated value in the set of repeated ones of the non-null ones of the plurality of values being separated from a corresponding consecutively prior one of the non-null ones of the plurality of values by at least one null value in the corresponding uncompressed data slab.

In various embodiments, the method further includes retrieving a subset of the plurality of values from the plurality of compressed data slabs in accordance with execution of a query, where each value of the subset of the plurality of values is retrieved based on accessing a portion of the compressed data of a compressed data slab of the plurality of compressed data slabs using compression information of the compressed data slab. For example, the retrieval of the subset of the plurality of values from the plurality of compressed data slabs in accordance with execution of the query is performed based on implementing the parallelized data store, retrieve, and/or process subsystem 12, and/or the parallelized query and results sub-system 13. In various embodiments, the subset of the plurality of values of the plurality of compressed data slabs are retrieved in parallel by a plurality of computing devices, nodes, and/or processing core resources of the computing entity, for example, independently and/or without coordination.

In various embodiments, the method further includes generating a stacked search list for the compressed data slab based on the compression information of the compressed data slab. For example, the stacked search list can be implemented via some or all features and/or functionality of the stacked search list of FIG. 34, and/or can be constructed based on corresponding compression information as illustrated in FIG. 33.

In various embodiments, retrieving each value of the subset of the plurality of values is further based on: determining an uncompressed index value of the each value in accordance with the serialized value ordering, and determining whether the stacked search list includes the uncompressed index value by performing a search upon the stacked search list. Ehen the stacked search list includes the uncompressed index value, the method includes determining a compressed index value corresponding to the uncompressed index value based on a structure of stack search list, and using the compressed index value to access a corresponding non-null value for the each value in the compressed data. When the stacked search list does not include the uncompressed index value, the method includes retrieving the each value as a null value. For example, the retrieval of values is based on some or all features and/or functionality of FIG. 35 and/or FIG. 36.

In various embodiments, the stacked search list includes a plurality of hierarchically stacked lists each indicating an ordered list of index values in accordance with the serialized value ordering. Performing the search upon the stacked search list can include searching a first one of the hierarchically stacked lists by comparing the uncompressed index value to at least one of the ordered list of index values indicated in a first one of the hierarchically stacked lists of the plurality of hierarchically stacked lists. Performing the search upon the stacked search list can further include searching each subsequent hierarchically stacked list of the plurality of hierarchically stacked lists by comparing the uncompressed index value to only indexes of an identified portion of the ordered list of index values of the each subsequent hierarchically stacked list, where the identified portion is identified based searching a corresponding prior hierarchically stacked list of the plurality of hierarchically stacked lists. The each value can be retrieved as the null value when the uncompressed index value matches no index values in the identified portion for a final one of the plurality of hierarchically stacked lists. The compressed index value can be determined when the each value is retrieved as the null value when the uncompressed index value matches one index value in the identified portion for the final one of the plurality of hierarchically stacked lists. The compressed index value can be determined based on a number of hierarchically stacked lists of the plurality of hierarchically stacked lists that includes the uncompressed index value. For example, searching of the different hierarchically stacked list to determine portions of the next hierarchically stacked list to search in retrieving values can be based on some or all features and/or functionality of FIG. 35 and/or FIG. 36.

In various embodiments, a computing entity of a data storage system includes at least one processor, and a memory that stores operational instructions. The operational instructions, when executed by the at least one processor, can cause the computing entity to perform some or all steps of FIG. 37 and/or some or all functionality described above in conjunction with the method of FIG. 37. For example, the operational instructions, when executed by the at least one processor, can cause the computing entity to: determine a data set for storage that includes a plurality of uncompressed data slabs in accordance with a serialized data slab ordering; create in parallel, by a plurality of processing core resources of the computing entity, a storage data set based on the data set that includes a plurality of compressed data slabs in accordance with the serialized data slab ordering, and store the storage data set via a plurality of computing devices of the data processing system. Each compressed data slab of the plurality of compressed data slabs can be generated from at least one corresponding uncompressed data slab of the plurality of uncompressed data slabs that includes a plurality of values in accordance with a serialized value ordering based on: generating compressed data for the each compressed data slab based on determining non-null ones of the plurality of values of the at least one corresponding uncompressed data slab; generating compression information for the each compressed data slab based on positions of the non-null ones of the plurality of values in accordance with the serialized value ordering; and/or generating the each compressed data slab to include the compressed data and the compression information.

In various embodiments, a non-transitory computer readable storage medium includes at least one memory section that stores operational instructions. The operational instructions, when executed by a processing module that includes a processor and a memory, can cause the processing module to perform some or all steps of FIG. 37 and/or some or all functionality described above in conjunction with the method of FIG. 37. For example, operational instructions, when executed by the processing module, causes the processing module to: determine a data set for storage that includes a plurality of uncompressed data slabs in accordance with a serialized data slab ordering; create in parallel, by a plurality of processing core resources of the computing entity, a storage data set based on the data set that includes a plurality of compressed data slabs in accordance with the serialized data slab ordering, and store the storage data set via a plurality of computing devices of the data processing system. Each compressed data slab of the plurality of compressed data slabs can be generated from at least one corresponding uncompressed data slab of the plurality of uncompressed data slabs that includes a plurality of values in accordance with a serialized value ordering based on: generating compressed data for the each compressed data slab based on determining non-null ones of the plurality of values of the at least one corresponding uncompressed data slab; generating compression information for the each compressed data slab based on positions of the non-null ones of the plurality of values in accordance with the serialized value ordering; and/or generating the each compressed data slab to include the compressed data and the compression information.

FIG. 38 is a schematic block diagram of an example a portion of the database system 10 for implementing global dictionary compression (GDC). In a first example, the parallelized data input sub-system 11 receives a table 236, converts it into segment groups 241, and sends the segment groups 241 to the parallelized data, store, retrieve, and/or process sub-system 12 for storage and subsequent processing. As part of preparing the segments of the segment groups, the parallelized data input sub-system 11 compresses the data using global dictionary compression. Alternatively, or in addition to the parallelized data input sub-system 11 compresses the data, and the parallelized data, store, retrieve, and/or process sub-system 12 compresses the data prior to storage.

The administrative sub-system 15 creates global dictionary compression (GDC) 246 tables based on requests 242 from the parallelized data input sub-system 11 and/or based on requests 244 from the parallelized data, store, retrieve, and/or process sub-system 12. For example, a request includes a request for the administrative sub-system 15 to create or update a city dictionary. As another example, a request includes a request for the administrative sub-system 15 to create or update a state dictionary.

In a second example of implementing the global dictionary compression, the parallelized data input sub-system 11 receives a data set (e.g., one or more tables 236) that includes a plurality of data records. Each data record of the plurality of data records includes a plurality of data fields. A data record of the plurality of data records includes a first data field of the plurality of data fields containing a first fixed length data value of a plurality of fixed length data values (e.g., record numbers, SSN, employee number, etc.) and a second data field of the plurality of data fields containing a first variable length data value of a plurality of variable length data values (e.g., names, city, state, etc.).

The data set has a first organizational structure. The first organizational structure of the data set includes one of a first table format where rows of a first table are the data records and columns of the first table are the data fields, a second table format where the columns of a second table are the data records and the rows of the second table are the data fields, and a tree structure where the data records are linked in a hierarchical order. The first variable length data value includes one or more of a binary string that represents one of: text data, audio data, video data, image data, graphics data, and numerical data, and an alpha-numeric string that represents one of: text data, audio data, video data, image data, graphics data, and numerical data.

Having received the data set, the parallelized data input sub-system 11 accesses (e.g., utilizing the request 242 to the administrative sub-system 15 and receiving the dictionary 246 in response) a compression dictionary for the second data field. The compression dictionary includes a plurality of entries, where each entry of the plurality of entries includes a key field and a value field. A first entry of the plurality of entries includes the key field storing a first fixed length index value and the value field storing the first variable length data value of the plurality of variable length data values. The key field has a smaller data size than the value field.

The accessing the compression dictionary includes determining, by the parallelized data input sub-system 11, whether the compression dictionary for the second data field exists. When the compression dictionary for the second data field does not exist, the parallelized data input sub-system 11 initiates creation of the compression dictionary for the second data field (e.g., generates the dictionary and/or sends the request 242 to the administrative sub-system 15 and receives the dictionary 246 in response). When the compression dictionary does exist, the parallelized data input sub-system 11 accesses the compression dictionary (e.g., in a local memory). When creating the compression dictionary and/or updating the compression dictionary, the parallelized data input sub-system 11 updates the compression dictionary with a new entry for a new variable length data value being added to the plurality of variable length data values.

Having accessed the compression dictionary, the parallelized data input sub-system 11 creates a storage data set based on the data set and the compression dictionary, where the first variable length data value of the second data field of the data record is replaced with the first fixed length index value. The storage data set has a plurality of fixed length fields. The creating the storage data set further includes one or more of replacing a second variable length data value of the second data field of a second data record of the plurality of data records of the data set with a corresponding second fixed length index value of a second entry of the plurality of entries of the compression dictionary (e.g., a different record with different variable length value), and replacing the first variable length data value of the second data field of a third data record of the plurality of data records of the data set with the first fixed length index value (e.g., a different record with same variable length value).

When a third data field is required, the parallelized data input sub-system 11 may access a second compression dictionary for the third data field of the plurality of data fields, where the second compression dictionary includes a second plurality of entries, where each entry of the second plurality of entries includes a second key field and a second value field. A first entry of the second plurality of entries includes the second key field storing a second fixed length index value and the second value field storing a second variable length data value of a second plurality of variable length data values, where the second key field has a smaller data size than the second value field.

Having accessed the second compression dictionary for the third data field, the parallelized data input sub-system 11 creates the storage data set based on the data set, the compression dictionary, and the second compression dictionary, where the second variable length data value of the third data field of the data record is replaced with the second fixed length index value. The creating the storage data set further includes selecting the first data field of the data set, selecting the value field from the compression dictionary, selecting the second value field from the second compression dictionary, joining the data set to the compression dictionary based on the first data field of the data set and the value field of the compression dictionary, joining the data set to the second compression dictionary based on the first data field of the data set and the second value field of the second compression dictionary, and creating a view name for the storage data set that corresponds to a name of the data set.

When the storage data set has been created, the parallelized data input sub-system 11 sends the storage data set to a data storage-process sub-system for storage. For example, the parallelized data input sub-system 11 sends the storage data set as segments for storage 241 to the parallelized data store, retrieve, &/or process sub-system 12 for storage.

FIG. 39A is a schematic block diagram of an example of a global dictionary compression (GDC) for cities per the request(s) of FIG. 38. In this example, each city is given a code (e.g., typically a numerical binary value of 8 bits to 8 K bytes or more). As a specific example, the city of Albany is given code 1, the city of Baltimore is given code 2, and so on. When data includes a city name, the code is stored instead of the actual name; thereby compressing the amount of data being stored.

FIG. 39B is a schematic block diagram of an example of a global dictionary compression (GDC) for states per the request(s) of FIG. 38. In this example, each state is given a code (e.g., typically a numerical binary value of 8 bits to 8 K bytes or more). As a specific example, the state of Alabama is given code 1, the state of Alaska is given code 2, and so on. When data includes a state name, the code is stored instead of the actual name; thereby compressing the amount of data being stored.

FIG. 40 is a schematic block diagram of an example of creating tables to form a view of a user's table. In this example, the user's table includes three columns ($C_0$, $C_1$, and $C_2$). Column $C_0$ includes data of a fixed length and may further be of a known data set (e.g., integers). Both columns $C_1$ and $C_2$ include strings of data, which are of undeterminable length.

To mimic the user's table, but taking advantage of global dictionary compression, the administration sub-system creates a new table (SYSDDC.USER.TABLE), which is designated as table 1. Table 1 includes three columns ($C_0$, $C_1$, and $C_2$), but each are integer columns. Column C1 includes integers that are keys into a second table (e.g., SYSLOOKUP.USER.TABLE_C1). The second table includes two columns. The first is an integer column that includes the keys or codes for the string values of the user's table in column 1 (e.g., cities).

Column C2 of the new table includes integers that are keys into a third table (e.g., SYSLOOKUP.USER.TABLE_C2). The third table includes two columns. The first is an integer column that includes the keys or codes for the string values of the user's table in column 2 (e.g., states).

FIG. 41 is a schematic block diagram of an example of forming a view of a user's table from the tables created in FIG. 40. At step 251, a computing device, or node thereof, or processing core resource thereof (hereinafter referred to as a processing node for this figure) selects column 0 from the newly create table 1; value C1 from table 2, and value C2 from table 3. The method continues at step 253 where the processing node joins tables 1 and 2 and joins tables 1 and 3. The method continues at step 255 where the processing node creates a view name for the view of the user's table.

Figure 42:
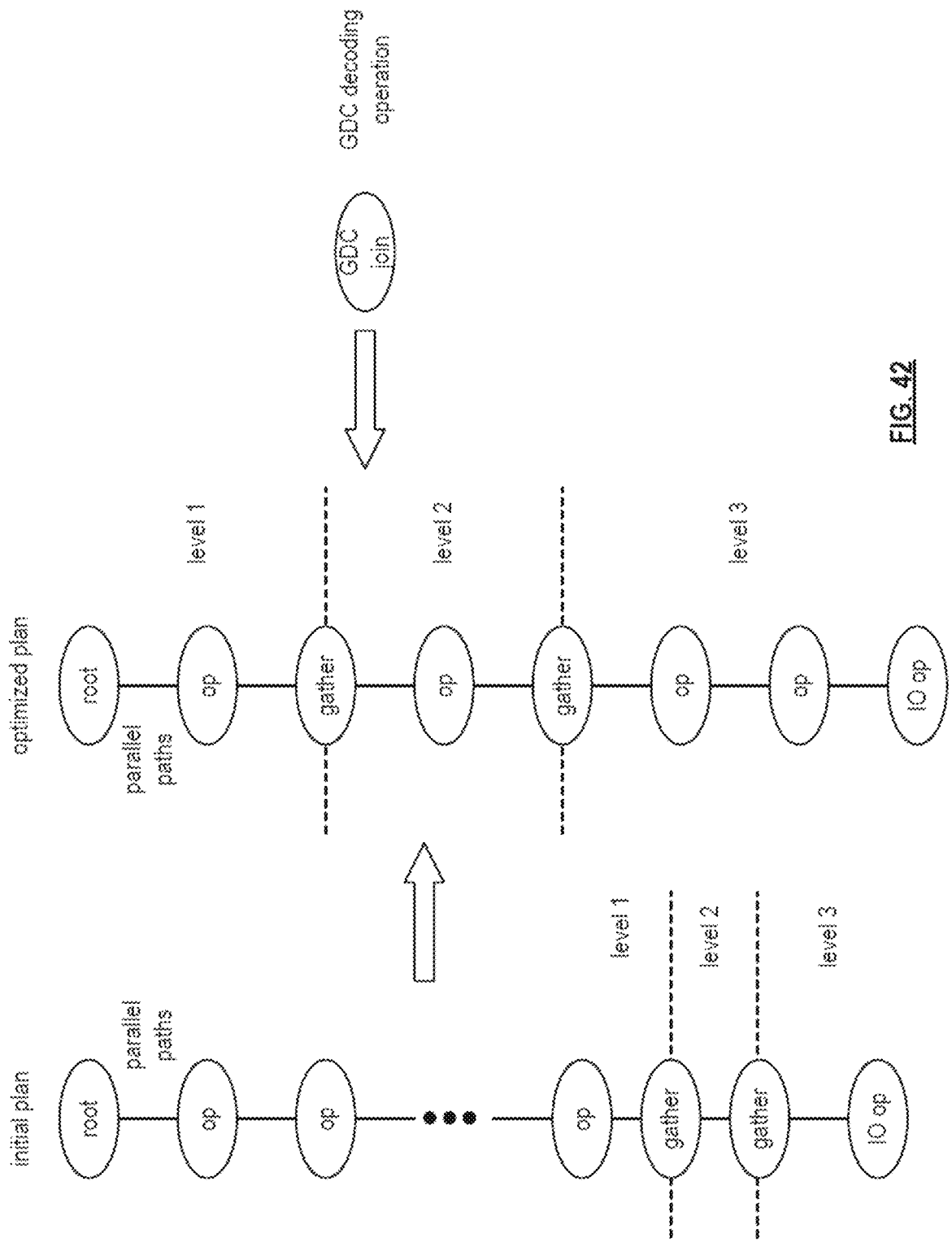
FIG. 42 is a schematic block diagram of an example of optimizing an initial query plan to include one or more global dictionary compression (GDC) decoding operations in accordance with the present invention.

FIG. 42 is a schematic block diagram of an example of optimizing an initial query plan to include one or more global dictionary compression (GDC) decoding operations. During the optimization of the initial plan, the parallelized query and response sub-system determines when and where to insert global dictionary compression (GDC) decoding steps. The further upstream the decoding, the more efficient the movement and processing of data since there is physically less data being moved. In some instances, a sequence of operations can be fully processed without GDC decoding (e.g., count states, etc.)

Figure 43:
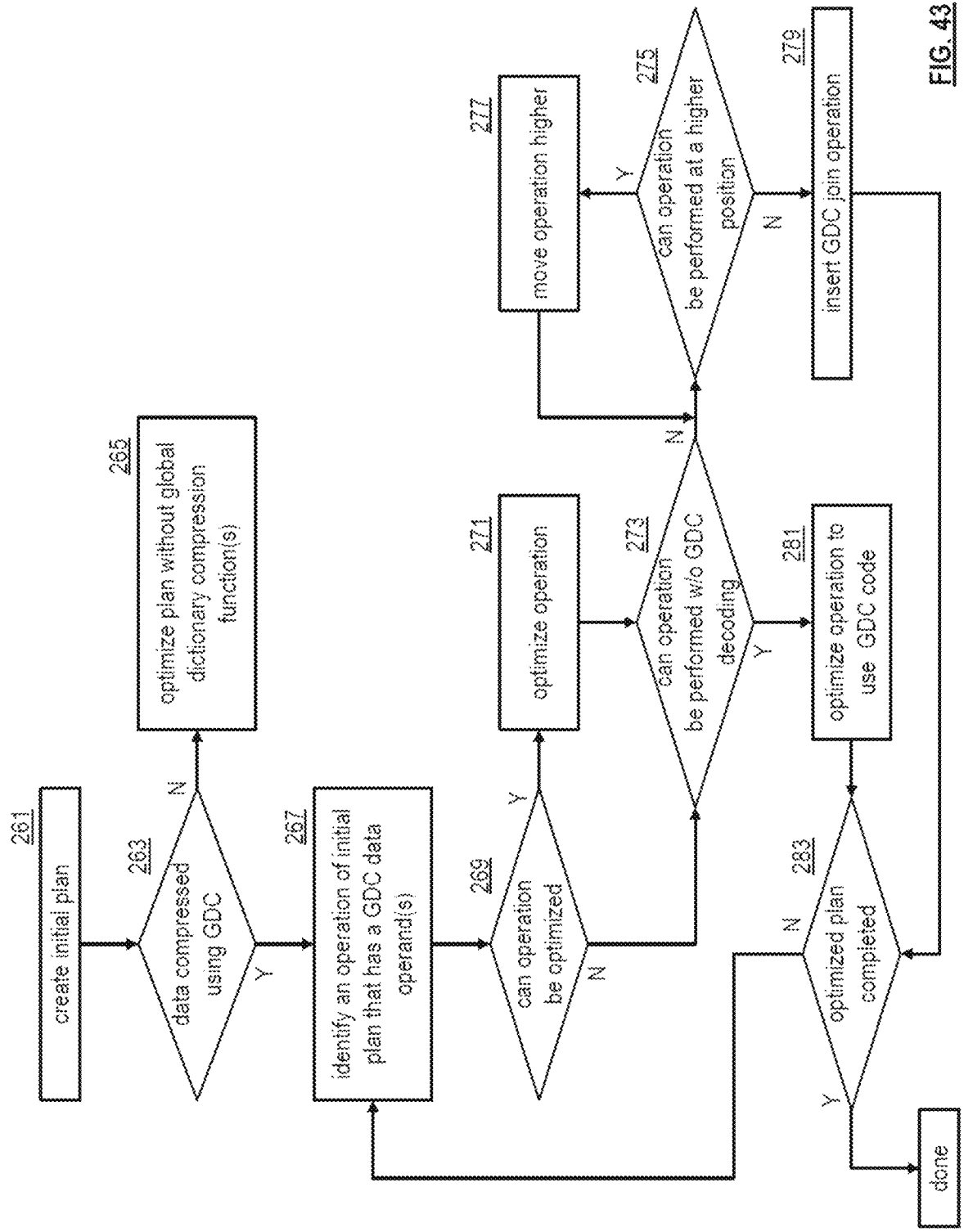
FIG. 43 is a schematic block diagram of an example of a method of optimizing an initial query plan to include one or more global dictionary compression (GDC) decoding operations in accordance with the present invention.

FIG. 43 is a schematic block diagram of an example of a method of optimizing an initial query plan to include one or more global dictionary compression (GDC) decoding operations. The method begins at step 261 where a computing device, or node thereof, or processing core resource thereof of a computing device of the parallelized query and response sub-system (hereinafter referred to as a processing node for this figure) creates an initial plan. The method continues at step 263 where the processing node determines when the table being addressed by the query has used global dictionary compression (GDC) compression for storing data. If not, the method continues at step 265 where the processing node optimizes the initial plan without using GDC decoding operations.

If the data was stored using GDC, then the method continues at step 267 where the processing node identifies an operation, or operations, of the initial plan that has a GDC data operand(s) (e.g., is access data that was compressed using GDC). The method continues at step 269 where the processing node determines whether the operation itself, or a sequence of operations, can be optimized (e.g., reworked to more efficiently access data and/or more efficiently process data). If yes, the method continues at step 271 where the processing node optimizes the operation and/or the sequence of operations.

Whether the operation or sequence of operations are optimized or not, the method continues at step 273 where the processing node determines whether the operation, or sequence of operations can be performed without GDC decoding. For example, if the operation or sequence of operations is to count the records by state, the name of the state is not needed for this operation. As such, decoding is not needed. If yes, the method continues at step 281 where the processing node optimizes the operation to use the GDC code without GDC decoding.

If, however, the operation cannot be performed without GDC decoding (e.g., adding floating point values of a list of floating point values), the method continues at step 275 where the processing node determines whether the operation needs to done at the current level or can the operation be pushed upstream. If the operation can be pushed upstream, the method continues at step 277 where the processing node moves the operation upstream.

When the operation cannot be pushed upstream, or pushed upstream any further, the method continues at step 279 where the processing node inserts a GDC join operation to executed the GDC decoding, which replaces the key code with the actual value. The method continues at step 283 where the processing node determines whether the plan optimization is complete. If so, the method ends. If not, the method repeats at step 267 for another operation, or sequence of operations, that access data that has been compressed using GDC.

Figure 44:
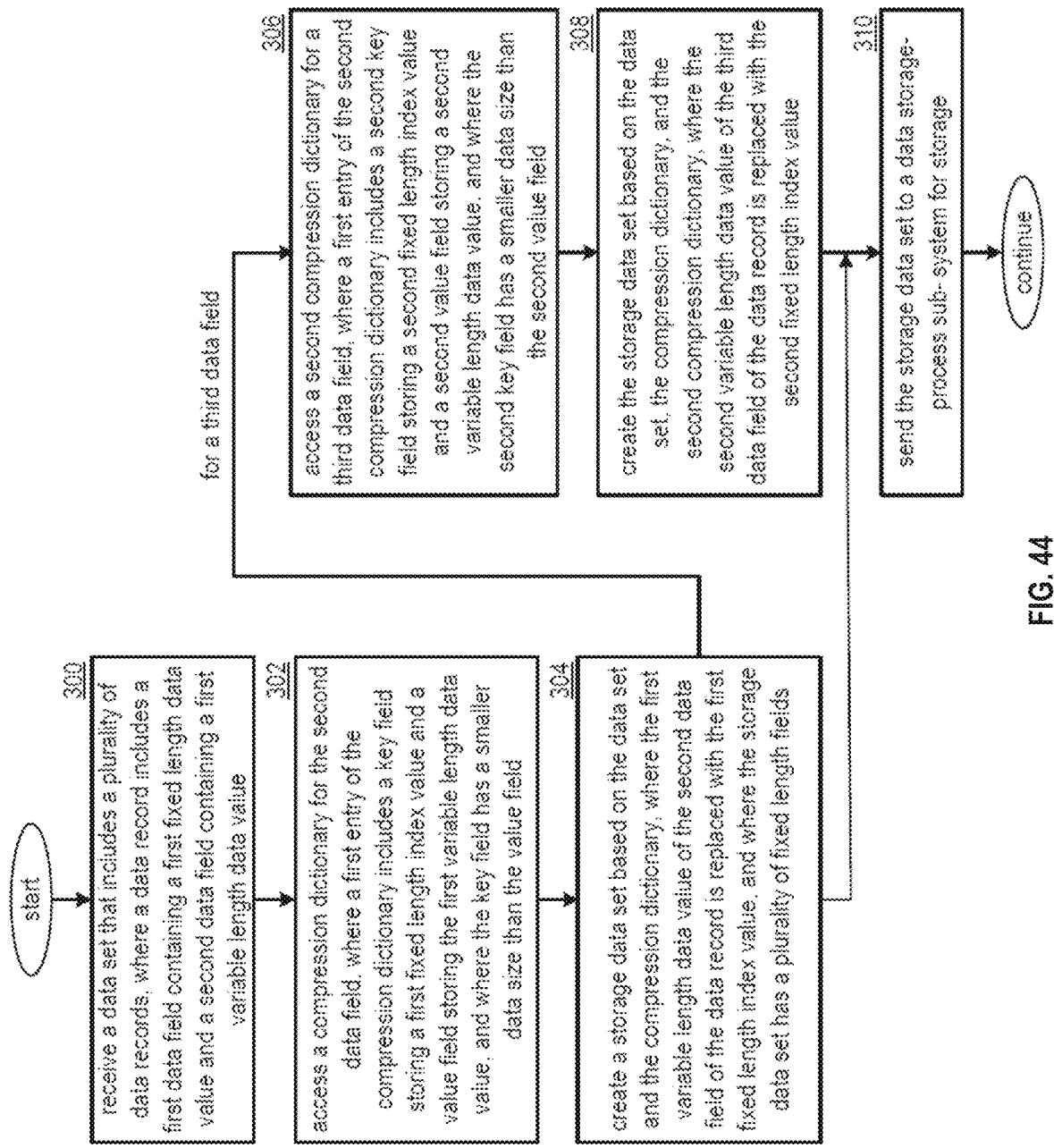
FIG. 44 is a logic diagram of an embodiment of a method for compressing a data set within a data processing system.

FIG. 44 is a logic diagram of an embodiment of a method for compressing a data set within a data processing system (e.g., the database system 10 of FIG. 1). In particular, a method is presented for use in conjunction with one or more functions and features described in conjunction with FIGS. 1-14, and also FIGS. 37-43. The method includes step 300 where a processing module of one or more processing modules of one or more computing entities that may include one or more computing devices within one or more subsystems of the data processing system receives a data set that includes a plurality of data records. Each data record of the plurality of data records includes a plurality of data fields. A data record of the plurality of data records includes a first data field of the plurality of data fields containing a first fixed length data value of a plurality of fixed length data values (e.g., record numbers, SSN, employee number, etc.) and a second data field of the plurality of data fields containing a first variable length data value of a plurality of variable length data values (e.g., names, city, state, etc.). The data set has a first organizational structure.

The method continues at step 302 where the processing module accesses a compression dictionary for the second data field, where the compression dictionary includes a plurality of entries, and where each entry of the plurality of entries includes a key field and a value field. A first entry of the plurality of entries includes the key field storing a first fixed length index value and the value field storing the first variable length data value of the plurality of variable length data values. The key field has a smaller data size than the value field. The accessing the compression dictionary includes determining whether the compression dictionary for the second data field exists and when the compression dictionary for the second data field does not exist, initiating creation of the compression dictionary for the second data field (e.g., creating the dictionary or obtaining the compression dictionary from another computing entity of the data processing system). When the compression dictionary does exist, the processing module accesses the compression dictionary. When a new entry is to be processed, the processing module updates the compression dictionary with the new entry for a new variable length data value being added to the plurality of variable length data values.

The method continues at step 304 where the processing module creates a storage data set based on the data set and the compression dictionary, where the first variable length data value of the second data field of the data record is replaced with the first fixed length index value, and where the storage data set has a plurality of fixed length fields. The creating the storage data set further includes one or more of replacing a second variable length data value of the second data field of a second data record of the plurality of data records of the data set with a corresponding second fixed length index value of a second entry of the plurality of entries of the compression dictionary (e.g., a different record with different variable length value), and replacing the first variable length data value of the second data field of a third data record of the plurality of data records of the data set with the first fixed length index value (e.g., a different record with a same variable length value).

The method continues at step 306 when operating on the third data field, otherwise the method continues to step 310. When operating on the third data field, the processing module accesses a second compression dictionary for a third data field of the plurality of data fields, where the second compression dictionary includes a second plurality of entries. Each entry of the second plurality of entries includes a second key field and a second value field. A first entry of the second plurality of entries includes the second key field storing a second fixed length index value and the second value field storing a second variable length data value of a second plurality of variable length data values, where the second key field has a smaller data size than the second value field.

The method continues at step 308 where the processing module creates the storage data set based on the data set, the compression dictionary, and the second compression dictionary, where the second variable length data value of the third data field of the data record is replaced with the second fixed length index value. The creating the storage data set further includes selecting the first data field of the data set, selecting the value field from the compression dictionary, selecting the second value field from the second compression dictionary, joining the data set to the compression dictionary based on the first data field of the data set and the value field of the compression dictionary, joining the data set to the second compression dictionary based on the first data field of the data set and the second value field of the second compression dictionary, and creating a view name for the storage data set that corresponds to a name of the data set.

When the storage data set has been created, the method continues at step 310 where the processing module sends the storage data set to a data storage-process sub-system of the data processing system for storage. For example, the processing module sends the storage data set to the data storage-process sub-system for direct storage. In another example, the processing module sends the storage data set to the data storage-process sub-system for further compression optimization and storage, where the further compression optimization includes utilizing one or more of the compression dictionary, the second compression dictionary, and another compression dictionary.

The method described above in conjunction with the processing module can alternatively be performed by other modules of the database system 10 of FIG. 1 or by other devices. In addition, at least one memory section (e.g., a computer readable memory, a non-transitory computer readable storage medium, a non-transitory computer readable memory organized into a first memory element, a second memory element, a third memory element, a fourth element section, a fifth memory element etc.) that stores operational instructions can, when executed by one or more processing modules of the one or more computing entities of the database system 10, cause the one or more computing devices to perform any or all of the method steps described above.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method comprising:
    determining a data set for storage that includes a plurality of uncompressed data slabs;
    creating, based on the data set, a storage data set that includes a plurality of compressed data slabs, wherein each compressed data slab of the plurality of compressed data slabs is generated from at least one corresponding uncompressed data slab of the plurality of uncompressed data slabs based on:
        generating compressed data for the each compressed data slab based on determining non-null ones of a plurality of values of the at least one corresponding uncompressed data slab;
        generating compression information for the each compressed data slab based on positions of the non-null ones of the plurality of values in accordance with a serialized value ordering of the plurality of values; and
        generating the each compressed data slab to include the compressed data and the compression information; and
    storing the storage data set via a plurality of computing devices.

2. The method of claim 1, wherein the plurality of compressed data slabs of the storage data set includes a plurality of sets of compressed data slabs, wherein each set of compressed data slabs of the plurality of sets of compressed data slabs is assigned to a corresponding logical block address of a plurality of logical block addresses, and wherein compressed data slabs of the each set of compressed data slabs are serially arranged in a plurality of serialized portions of the corresponding logical block address in accordance with a serialized data slab ordering of the plurality of uncompressed data slabs.

3. The method of claim 2, wherein creating the storage data set based on the data further includes:
    generating footer data for the each set of compressed data slabs of the plurality of sets of compressed data slabs, wherein the corresponding logical block address includes the footer data for the each set of compressed data slabs, and wherein the footer data indicates at least one of: raw uncompressed data; run length encoding information; null elimination information; identity of data included within a corresponding block; a count of compressed blocks; a size of a compressed data slab; a size of the compression information; or a number of entries in the compression information.

4. The method of claim 2, wherein all logical block addresses of the plurality of logical block addresses include a same number of fixed sized data fields, and wherein the each set of compressed data slabs each occupy exactly one of the fixed sized data fields of the corresponding logical block address.

5. The method of claim 4, wherein the at least one corresponding uncompressed data slab includes at least two data slabs, wherein generating the each compressed data slab includes concatenating the compressed data with the compression information, wherein the compression information of the each compressed data slab is based on positions of the non-null ones of the plurality of values for the at least two data slabs.

6. The method of claim 1, wherein the compressed data of the each compressed data slab is generated to contain only values for the non-null ones of the plurality of values in accordance with the serialized value ordering, wherein a number of non-null ones of the plurality of values included in compressed data of at least one of the plurality of compressed data slabs is strictly less than a total number of values of the plurality of values in the at least one corresponding uncompressed data slab of the at least one of the plurality of compressed data slabs based on the at least one corresponding uncompressed data slab including at least one null value.

7. The method of claim 6,
    wherein generating the compression information of the each compressed data slab includes generating a plurality of one bit data flags in accordance with the serialized value ordering, each indicating whether a corresponding one of the plurality of values is one of: null or non-null; and
    wherein the compression information includes one of: a concatenation of the plurality of one bit data flags in accordance with the serialized value ordering; or a run length encoding of the plurality of one bit data flags.

8. The method of claim 6, wherein generating the compression information of the each compressed data slab includes identifying a plurality of index values identifying positions of the non-null ones of the plurality of values in the at least one corresponding uncompressed data slab in accordance with the serialized value ordering, wherein the compression information indicates the plurality of index values.

9. The method of claim 8, wherein the compression information includes a concatenation of the plurality of index values in accordance with the serialized value ordering.

10. The method of claim 8, wherein generating each compressed data slab of the plurality of compressed data slabs is further based on:
   identifying a set of repeated ones of the non-null ones of the plurality of values based on having values that repeat a consecutively prior one of the non-null ones of the plurality of values in accordance with the serialized value ordering, wherein the compression data of the each compressed data slab is generated based on removing the set of repeated ones of the non-null ones of the plurality of values;
   wherein generating the compression information of the each compressed data slab includes generating a plurality of not-null data position fields each having a same fixed number of bits, and wherein each of the plurality of not-null data position fields is generated for a corresponding one of the non-null ones of the plurality of values based on:
      setting one of the same fixed number of bits to indicate whether the corresponding one of the non-null ones of the plurality of values is one of the set of repeated ones of the non-null ones of the plurality of values; and
      setting remaining ones of the same number of fixed bits to indicate a corresponding one of the plurality of index values for the corresponding one of the non-null ones of the plurality of values;
   wherein the compression information includes a concatenation of the plurality of not-null data position fields in accordance with the serialized value ordering.

11. The method of claim 10, wherein one of the plurality of not-null data position fields having the one of the same fixed number of bits indicating corresponding one of the non-null ones of the plurality of values is one of the set of repeated ones of the non-null ones of the plurality of values has its remaining ones of the same number of fixed bits indicating the one of the plurality of index values that is non-consecutive with another one of the plurality of index values indicated in the remaining ones of the same number of fixed bits of another one of the plurality of not-null data position fields immediately prior to the one of the plurality of not-null data position fields based on a corresponding repeated value in the set of repeated ones of the non-null ones of the plurality of values being separated from a corresponding consecutively prior one of the non-null ones of the plurality of values by at least one null value in the corresponding uncompressed data slab.

12. The method of claim 1, wherein generating each compressed data slab of the plurality of compressed data slabs is further based on:
   identifying a set of repeated ones of the plurality of values based on having values that repeat a consecutively prior one of the plurality of values more than a threshold number of consecutive times;
   wherein the compression data of the each compressed data slab is generated to include a subset of the plurality of values based on removing the set of repeated ones of the plurality of values, wherein the compression information of the each compressed data slab is generated to indicate a number of additional repeats for a second subset of the subset of the plurality of values that are consecutively repeated more than the threshold number of consecutive times, and wherein each number of additional repeats of the compression information is appended after corresponding values in the second subset.

13. The method of claim 1, wherein generating the each compressed data slab is in accordance with at least one of: a null elimination technique, or a run length encoding technique.

14. The method of claim 1, further comprising:
   determining each of the plurality of uncompressed data slabs based on performing a sorting of a column of a table of the data set utilizing a key, wherein the serialized value ordering is based on the sorting.

15. The method of claim 1, further comprising:
   retrieving a subset of the plurality of values from the plurality of compressed data slabs in accordance with execution of a query, wherein each value of the subset of the plurality of values is retrieved based on accessing a portion of the compressed data of a compressed data slab of the plurality of compressed data slabs using compression information of the compressed data slab.

16. The method of claim 15, further comprising:
   generating a stacked search list for the compressed data slab based on the compression information of the compressed data slab;
   wherein retrieving the each value of the subset of the plurality of values is further based on:
   determining an uncompressed index value of the each value in accordance with the serialized value ordering;
   determining whether the stacked search list includes the uncompressed index value by performing a search upon the stacked search list;
   when the stacked search list includes the uncompressed index value:
      determining a compressed index value corresponding to the uncompressed index value based on a structure of stack search list; and
      using the compressed index value to access a corresponding non-null value for the each value in the compressed data; and
   when the stacked search list does not include the uncompressed index value;
      retrieving the each value as a null value.

17. The method of claim 16, wherein the stacked search list includes a plurality of hierarchically stacked lists each indicating an ordered list of index values in accordance with the serialized value ordering, and wherein performing the search upon the stacked search list includes:
   searching a first one of the hierarchically stacked lists by comparing the uncompressed index value to at least one of the ordered list of index values indicated in the first one of the hierarchically stacked lists of the plurality of hierarchically stacked lists; and
   searching each subsequent hierarchically stacked list of the plurality of hierarchically stacked lists by comparing the uncompressed index value to only indexes of an identified portion of the ordered list of index values of the each subsequent hierarchically stacked list, wherein the identified portion is identified based searching a corresponding prior hierarchically stacked list of the plurality of hierarchically stacked lists;
   wherein the each value is retrieved as the null value when the uncompressed index value matches no index values in the identified portion for a final one of the plurality of hierarchically stacked lists;

wherein the compressed index value is determined when the each value is retrieved as the null value when the uncompressed index value matches one index value in the identified portion for the final one of the plurality of hierarchically stacked lists, and wherein the compressed index value is determined based on a number of hierarchically stacked lists of the plurality of hierarchically stacked lists that includes the uncompressed index value.

18. The method of claim 1, wherein the plurality of compressed data slabs are created in parallel by a plurality of processing core resources.

19. A computing entity of a data storage system includes:
   at least one processor; and
   a memory that stores operational instructions that, when executed by the at least one processor, cause the computing entity to:
      determine a data set for storage that includes a plurality of uncompressed data slabs;
      create, based on the data set, a storage data set that includes a plurality of compressed data slabs, wherein each compressed data slab of the plurality of compressed data slabs is generated from at least one corresponding uncompressed data slab of the plurality of uncompressed data slabs based on:
         generating compressed data for the each compressed data slab based on determining non-null ones of a plurality of values of the at least one corresponding uncompressed data slab;
         generating compression information for the each compressed data slab based on positions of the non-null ones of the plurality of values in accordance with a serialized value ordering of the plurality of values; and
         generating the each compressed data slab to include the compressed data and the compression information; and
      storing the storage data set via a plurality of computing devices.

20. A non-transitory computer readable storage medium comprises:
   at least one memory section that stores operational instructions that, when executed by a processing module that includes a processor and a memory, causes the processing module to:
      determine a data set for storage that includes a plurality of uncompressed data slabs;
      create, based on the data set, a storage data set that includes a plurality of compressed data slabs, wherein each compressed data slab of the plurality of compressed data slabs is generated from at least one corresponding uncompressed data slab of the plurality of uncompressed data slabs based on:
         generate compressed data for the each compressed data slab based on determining non-null ones of a plurality of values of the at least one corresponding uncompressed data slab;
         generate compression information for the each compressed data slab based on positions of the non-null ones of the plurality of values in accordance with a serialized value ordering of the plurality of values; and
         generate the each compressed data slab to include the compressed data and the compression information; and
      store the storage data set via a plurality of computing devices.

* * * * *